(12) United States Patent
Kori et al.

(10) Patent No.: US 10,615,045 B2
(45) Date of Patent: Apr. 7, 2020

(54) COMPOSITION FOR FORMING ORGANIC FILM, PATTERNING PROCESS, AND RESIN FOR FORMING ORGANIC FILM

(71) Applicant: SHIN-ETSU CHEMICAL CO., LTD., Tokyo (JP)

(72) Inventors: Daisuke Kori, Joetsu (JP); Tsutomu Ogihara, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/017,370

(22) Filed: Jun. 25, 2018

(65) Prior Publication Data

US 2019/0027369 A1 Jan. 24, 2019

(30) Foreign Application Priority Data

Jul. 21, 2017 (JP) .................... 2017-142216

(51) Int. Cl.
*H01L 21/308* (2006.01)
*C09D 165/00* (2006.01)
(Continued)

(52) U.S. Cl.
CPC .......... *H01L 21/3088* (2013.01); *C08G 61/02* (2013.01); *C08G 61/125* (2013.01);
(Continued)

(58) Field of Classification Search
CPC .......... G03F 7/0002; G03F 7/094; G03F 7/11; G03F 7/16; G03F 7/168; G03F 7/2006;
(Continued)

(56) References Cited

U.S. PATENT DOCUMENTS 7,094,708 B2 8/2006 Kato et al.
8,652,757 B2 2/2014 Hatakeyama et al.
(Continued)

FOREIGN PATENT DOCUMENTS

JP H06-118651 A 4/1994
JP 2002-334869 A 11/2002
(Continued)

*Primary Examiner* — Shahed Ahmed
(74) *Attorney, Agent, or Firm* — Oliff PLC

(57) ABSTRACT

The invention provides: a resin as a material of a composition for forming an organic film having high filling and planarizing properties and etching resistance; the composition; and a patterning process using the composition. Provided is a composition for forming an organic film, including:
(I) a resin having a structure shown by a general formula (1) in which a ring structure AR containing an aromatic ring and a spiro structure SP bonded to four of the ARs are alternately repeated in at least a portion of a repeating unit; and
(II) an organic solvent.

(Continued)

H01L 21/3086 (2013.01); H01L 21/32139 (2013.01); C08G 2261/11 (2013.01); C08G 2261/124 (2013.01); C08G 2261/1422 (2013.01); C08G 2261/1428 (2013.01); C08G 2261/228 (2013.01); C08G 2261/314 (2013.01); C08G 2261/3142 (2013.01); C08G 2261/3424 (2013.01); C08G 2261/724 (2013.01)

(58) Field of Classification Search
CPC .......... G03F 7/2041; G03F 7/322; G03F 7/38; H01L 21/3081; H01L 21/3086; H01L 21/32139; C08G 2261/11; C08G 2261/124; C08G 2261/1422; C08G 2261/1428; C08G 2261/228; C08G 2261/314

See application file for complete search history.

(56) References Cited

U.S. PATENT DOCUMENTS

| | | | |
|---|---|---|---|
| 8,759,220 B1* | 6/2014 | Ogihara | G03F 7/0752 |
| | | | 257/E21.159 |
| 2002/0106909 A1 | 8/2002 | Kato et al. | |
| 2006/0019195 A1 | 1/2006 | Hatakeyama et al. | |
| 2006/0204891 A1 | 9/2006 | Hatakeyama | |
| 2008/0118860 A1 | 5/2008 | Harada et al. | |
| 2012/0214100 A1* | 8/2012 | Kobayashi | G03F 7/0045 |
| | | | 430/285.1 |
| 2013/0049149 A1* | 2/2013 | Kato | G03F 7/0045 |
| | | | 257/431 |
| 2013/0337649 A1* | 12/2013 | Tachibana | G03F 7/094 |
| | | | 438/694 |
| 2015/0093508 A1* | 4/2015 | Nagai | B82Y 40/00 |
| | | | 427/271 |
| 2016/0336189 A1* | 11/2016 | Kori | C07C 69/33 |
| 2018/0181003 A1* | 6/2018 | Nihashi | G03F 7/11 |

FOREIGN PATENT DOCUMENTS

| | | |
|---|---|---|
| JP | 2004-205685 A | 7/2004 |
| JP | 2005-128509 A | 5/2005 |
| JP | 2005-250434 A | 9/2005 |
| JP | 2006-227391 A | 8/2006 |
| JP | 2006-285095 A | 10/2006 |
| JP | 2006-293298 A | 10/2006 |
| JP | 2007-199653 A | 8/2007 |
| JP | 2008-111103 A | 5/2008 |
| JP | 2008-158002 A | 7/2008 |
| JP | 4355943 B2 | 11/2009 |
| JP | 2010-122656 A | 6/2010 |
| WO | 2004/066377 A1 | 8/2004 |

\* cited by examiner

19 Claims, 1 Drawing Sheet

(51) Int. Cl.

| | |
|---|---|
| C08G 61/02 | (2006.01) |
| G03F 7/00 | (2006.01) |
| G03F 7/09 | (2006.01) |
| G03F 7/16 | (2006.01) |
| G03F 7/20 | (2006.01) |
| G03F 7/38 | (2006.01) |
| G03F 7/32 | (2006.01) |
| H01L 21/3213 | (2006.01) |
| G03F 7/11 | (2006.01) |
| G03F 7/075 | (2006.01) |
| C08G 61/12 | (2006.01) |
| H01L 21/027 | (2006.01) |

(52) U.S. Cl.
CPC .......... C09D 165/00 (2013.01); G03F 7/0002 (2013.01); G03F 7/0752 (2013.01); G03F 7/091 (2013.01); G03F 7/094 (2013.01); G03F 7/11 (2013.01); G03F 7/16 (2013.01); G03F 7/168 (2013.01); G03F 7/2006 (2013.01); G03F 7/2041 (2013.01); G03F 7/322 (2013.01); G03F 7/38 (2013.01); H01L 21/0273 (2013.01); H01L 21/3081 (2013.01);

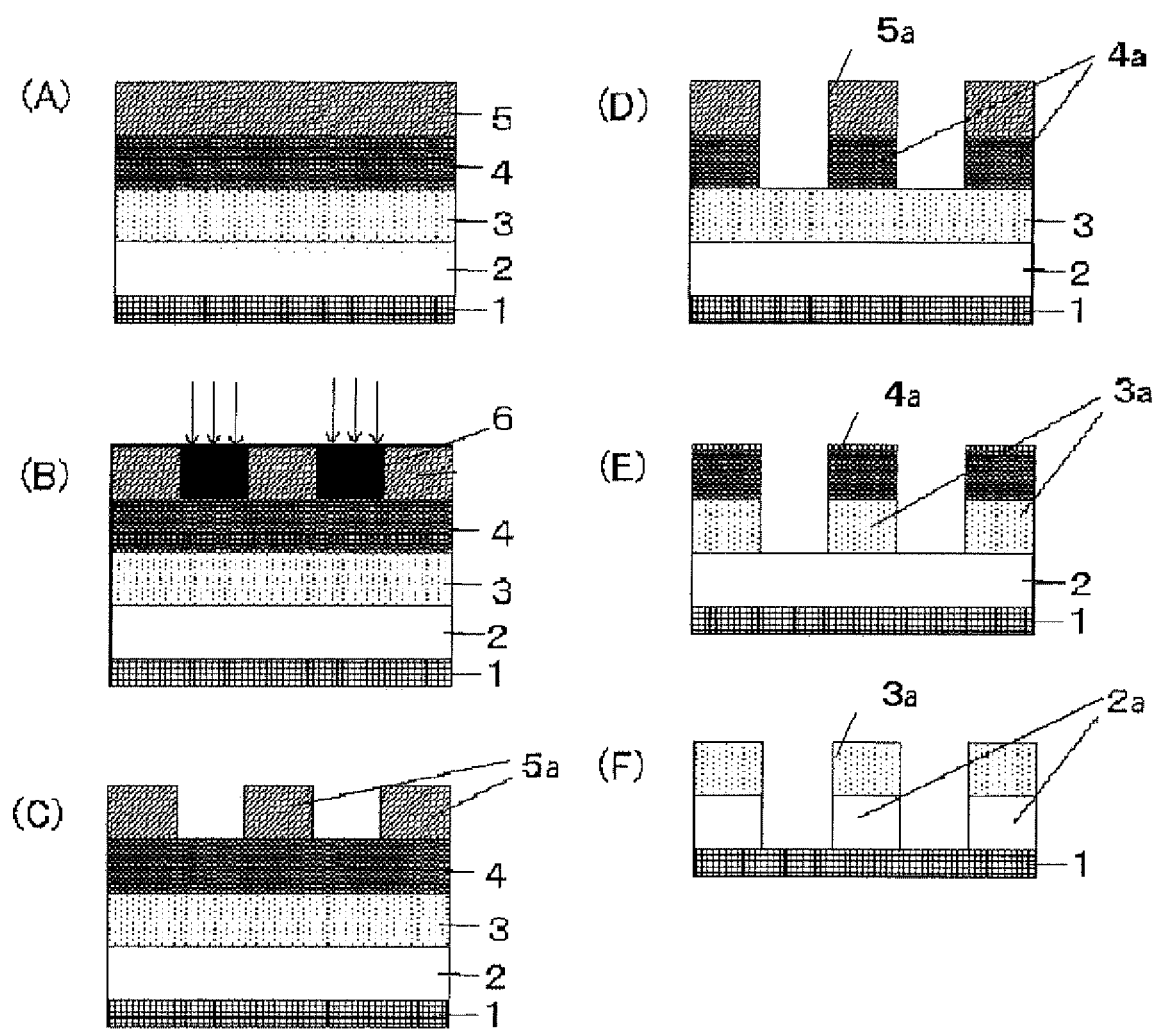

COMPOSITION FOR FORMING ORGANIC FILM, PATTERNING PROCESS, AND RESIN FOR FORMING ORGANIC FILM

TECHNICAL FIELD

The present invention relates to a composition for forming an organic film, a patterning process, and a resin for forming an organic film.

BACKGROUND ART

Recently, along with advancements toward higher integration and higher speed of semiconductor elements, a finer pattern rule has been required. In this situation, various techniques have been developed in regard to how patterning process can be performed more finely and precisely on light sources used in lithography with light exposure, which is a commonly-employed technique at present.

As the light source for lithography employed in resist pattern formation, light exposure using a g-beam (436 nm) or an i-beam (365 nm) of a mercury lamp is widely used for portions where the degree of integration is low. Meanwhile, for portions where the degree of integration is high and finer patterning is required, lithography using a KrF excimer laser (248 nm) or an ArF excimer laser (193 nm) with shorter wavelengths has also been actually used. Moreover, for the most advanced generation requiring further finer patterning, lithography with extreme ultraviolet ray (EUV, 13.5 nm) is about to be put into practical use.

As the thinning of resist patterns progresses as described above, a monolayer resist method, which is employed as a typical resist patterning process, becomes well known to increase the ratio of a pattern height to a pattern line width (aspect ratio), so that pattern collapse occurs due to the surface tension of a developer during development. Against this background, a multilayer resist method in which a pattern is formed by laminating films having different dry etching properties has been known to be excellent in forming a pattern with a high aspect ratio on a stepped substrate. There have been developed: a 2-layer resist method in which a photoresist layer made of a silicon-containing photosensitive polymer is combined with an underlayer made of an organic polymer containing carbon, hydrogen, and oxygen as main constituent elements, for example, a novolak polymer (Patent Document 1); and a 3-layer resist method in which a photoresist layer made of an organic photosensitive polymer used in a monolayer resist method is combined with a middle layer made of a silicon-based polymer or a silicon-based CVD film, and an underlayer made of an organic polymer (Patent Document 2).

In this 3-layer resist method, first, a fluorocarbon-based dry etching gas is used to transfer the pattern of the photoresist layer to the silicon-containing middle layer. Then, using the pattern as a mask, dry etching with an oxygen-containing gas is performed to transfer the pattern to the organic underlayer film containing carbon and hydrogen as main constituent elements. The resultant is used as a mask to form the pattern on a substrate to be processed by dry etching. However, in semiconductor element manufacturing processes after the 20-nm generation, when such an organic underlayer film pattern is used as a hard mask to transfer the pattern to a substrate to be processed by dry etching, phenomena are observed in which the underlayer film pattern is twisted and/or curved.

The carbon hard mask formed immediately above the substrate to be processed is generally an amorphous carbon (hereinafter CVD-C) film prepared by a CVD method from a methane gas, an ethane gas, an acetylene gas, and the like as raw materials. The amount of a hydrogen atom in the CVD-C film can be reduced quite small, and this film is known to be very effective against the twisting and curving of the pattern as described above. Nevertheless, it is also known that when the substrate to be processed used as a base has a step, it is difficult to fill such a step into a flat state due to the characteristics of the CVD process. As a result, when a substrate to be processed having a step is coated with a CVD-C film and then patterned with a photoresist, the step of the substrate to be processed causes the applied surface of the photoresist to have a step. This makes the photoresist film thickness non-uniform, and consequently the focus margin and the pattern profile during lithography deteriorate.

On the other hand, it is known that when the underlayer film serving as the carbon hard mask formed immediately above the substrate to be processed is formed by a spin coating method, there is an advantage that a step(s) of the stepped substrate can be filled into a flat state. Planarizing the substrate using the underlayer film composition reduces fluctuation in film thickness of a silicon-containing middle layer and a photoresist coated thereon, can increase the focus margin in lithography and can form a correct pattern.

Hence, there are demands for: an underlayer film composition which allows formation of an organic underlayer film by a spin coating method, the organic underlayer film enabling formation of a film having high etching resistance in dry etching a substrate to be processed and high planarizing property on the substrate to be processed; and a method for forming such an underlayer film.

CITATION LIST

Patent Literature

Patent Document 1: Japanese Unexamined Patent publication (Kokai) No. H06-118651
Patent Document 2: Japanese Patent No. 4355943

SUMMARY OF THE INVENTION

Technical Problem

The present invention has been made in view of the above circumstances. An object of the present invention is to provide: a resin for forming an organic film that can provide a composition for forming an organic film having high filling and planarizing properties and etching resistance; a composition for forming an organic film containing the resin; and a patterning process using this composition.

Solution to Problem

To accomplish the above object, the present invention provides a composition for forming an organic film, comprising:

(I) a resin having a structure shown by the following general formula (1) in which a ring structure AR containing an aromatic ring and a spiro structure SP bonded to four of the ARs are alternately repeated in at least a portion of a repeating unit; and (II) an organic solvent,

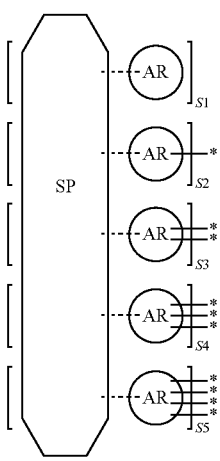
(1)

wherein SP represents a spiro structure shown by the following formula (1-1); AR represents a ring structure containing an aromatic ring as shown by the following formula (1-2), (1-3), (1-4), (1-5), (1-6), or (1-7); S1 represents an integer of 0 to 3, and S2, S3, S4, and S5 each independently represent an integer of 0 to 4, given that S1+S2+S3+S4+S5=4; a dotted line represents that a ring structure of the SP bonds to, while sharing one side with, the aromatic ring of the AR; and * represents that the aromatic ring of the AR bonds to, while sharing one side with, a ring structure of a spiro structure in an adjacent repeating unit,

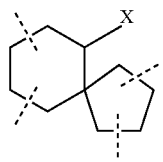
(1-1)

wherein X represents a hydroxyl group, an aryl sulfoxy group, or an alkoxy group, an acyloxy group, or an alkylsulfoxy group having 1 to 10 carbon atoms; a hydrogen atom of each of these groups is optionally substituted with a fluorine atom, a chlorine atom, a bromine atom, an iodine atom, an alkoxy group, an acyl group, or an acyloxy group; a dotted line represents that a ring structure in the formula (1-1) bonds to, while sharing one side with, the aromatic ring of the AR in the general formula (1); and the AR bonds only to a side whose adjacent sides in the spiro structure are not shared with an aromatic ring of another AR, the side having neither X nor a spiro bond,

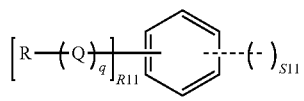
(1-2)

wherein all Rs may be identical to or different from each other, each representing a saturated or unsaturated monovalent hydrocarbon group having 1 to 20 carbon atoms; Q represents —O—, —CO—, —(CO)—O—, or —O—(CO)—; q represents 0 or 1; R11 represents an integer of 0 to 4, and S11 represents an integer of 1 to 3, given that 2≤R11+2×S11≤6; a dotted line represents that the aromatic ring in the formula (1-2) bonds to, while sharing one side with, the ring structure of the spiro structure; and the spiro structure bonds only to a side whose adjacent sides in the aromatic ring in the formula (1-2) are not shared with a ring structure of another spiro structure,

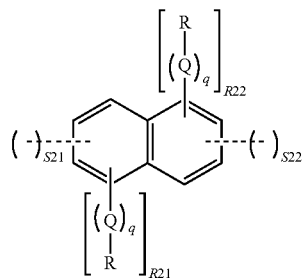
(1-3)

wherein R, Q, and q are as defined above; R21 represents an integer of 0 to 4, R22 represents an integer of 0 to 4, S21 represents an integer of 0 to 2, and S22 represents an integer of 0 to 2, given that 1≤S21+S22≤4 and 2≤R21+R22+2×(S21+S22)≤8; a dotted line represents that the aromatic ring in the formula (1-3) bonds to, while sharing one side with, the ring structure of the spiro structure; and the spiro structure bonds only to a side whose adjacent sides in the aromatic ring in the formula (1-3) are not shared with a ring structure of another spiro structure,

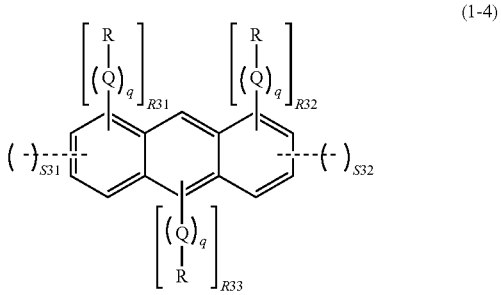
(1-4)

wherein R, Q, and q are as defined above; R31 represents an integer of 0 to 4, R32 represents an integer of 0 to 4, R33 represents an integer of 0 to 2, S31 represents an integer of 0 to 2, and S32 represents an integer of 0 to 2, given that 1≤S31+S32≤4 and 2≤R31+R32+R33+2×(S31+S32)≤10; a dotted line represents that the aromatic ring in the formula (1-4) bonds to, while sharing one side with, the ring structure of the spiro structure; and the spiro structure bonds only to a side whose adjacent sides in the aromatic ring in the formula (1-4) are not shared with a ring structure of another spiro structure,

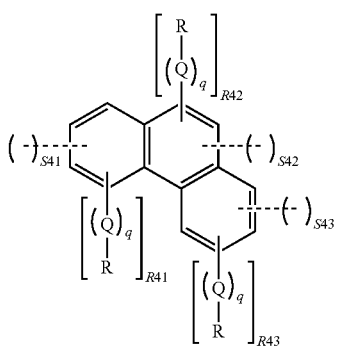

(1-5)

wherein R, Q, and q are as defined above; R41 represents an integer of 0 to 4, R42 represents an integer of 0 to 2, R43 represents an integer of 0 to 4, S41 represents an integer of 0 to 2, S42 represents an integer of 0 or 1, and S43 represents an integer of 0 to 2, given that $1 \leq S41+S42+S43 \leq 5$ and $2 \leq R41+R42+R43+2\times(S41+S42+S43) \leq 10$; a dotted line represents that the aromatic ring in the formula (1-5) bonds to, while sharing one side with, the ring structure of the spiro structure; and the spiro structure bonds only to a side whose adjacent sides in the aromatic ring in the formula (1-5) are not shared with a ring structure of another spiro structure,

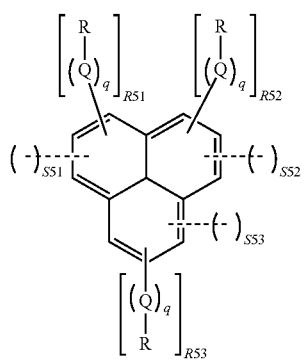

(1-6)

wherein R, Q, and q are as defined above; R51 represents an integer of 0 to 3, R52 represents an integer of 0 to 3, R53 represents an integer of 0 to 3, S51 represents an integer of 0 or 1, S52 represents an integer of 0 or 1, and S53 represents an integer of 0 or 1, given that $1 \leq S51+S52+S53 \leq 3$ and $2 \leq R51+R52+R53+2\times(S51+S52+S53) \leq 9$; a dotted line represents that the aromatic ring in the formula (1-6) bonds to, while sharing one side with, the ring structure of the spiro structure; and the spiro structure bonds only to a side whose adjacent sides in the aromatic ring in the formula (1-6) are not shared with a ring structure of another spiro structure,

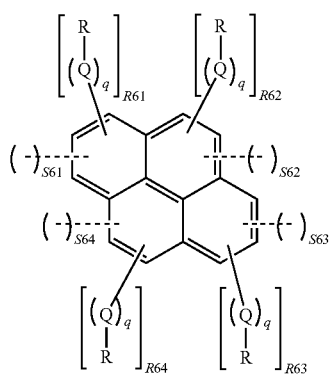

(1-7)

wherein R, Q, and q are as defined above; R61 represents an integer of 0 to 3, R62 represents an integer of 0 or 1, R63 represents an integer of 0 to 3, R64 represents an integer of 0 to 2, S61 represents an integer of 0 or 1, S62 represents an integer of 0 or 1, S63 represents an integer of 0 or 1, and S64 represents an integer of 0 or 1, given that $1 \leq S61+S62+S63+S64 \leq 4$ and $2 \leq R61+R62+R63+R64+2\times(S61+S62+S63+S64) \leq 10$; a dotted line represents that the aromatic ring in the formula (1-7) bonds to, while sharing one side with, the ring structure of the spiro structure; and the spiro structure bonds only to a side whose adjacent sides in the aromatic ring in the formula (1-7) are not shared with a ring structure of another spiro structure.

This composition is a composition for forming an organic film that can provide an organic film having high filling and planarizing properties, curving resistance, and etching resistance.

The composition for forming an organic film preferably further comprises an acid generator.

This composition generates an acid in a heating step after the application step. The acid then accelerates aromatic ring formation of a spiro alcohol, so that the aromatic ring formation of the entire organic coating film can be promoted. Thus, the composition for forming an organic film enables more quick and reliable formation of an organic film having high filling and planarizing properties, curving resistance, and etching resistance.

Moreover, the present invention provides a patterning process comprising:

forming an organic film on a body to be processed from the inventive composition for forming an organic film;

forming a silicon-containing resist underlayer film on the organic film from a silicon-containing resist underlayer film composition;

forming a resist upper layer film on the silicon-containing resist underlayer film from a photoresist composition;

forming a circuit pattern in the resist upper layer film;

transferring the pattern to the silicon-containing resist underlayer film by etching using the resist upper layer film having the formed circuit pattern as a mask;

transferring the pattern to the organic film by etching using the silicon-containing resist underlayer film having the transferred pattern as a mask; and further transferring the pattern to the body to be processed by etching using the organic film having the transferred pattern as a mask.

Further, the present invention provides a patterning process comprising:

forming an organic film on a body to be processed from the inventive composition for forming an organic film;

forming a silicon-containing resist underlayer film on the organic film from a silicon-containing resist underlayer film composition;

forming an organic antireflective film on the silicon-containing resist underlayer film;

forming a resist upper layer film on the organic antireflective film from a photoresist composition, so that a 4-layered film structure is constructed;

forming a circuit pattern in the resist upper layer film;

transferring the pattern to the organic antireflective film and the silicon-containing resist underlayer film by etching using the resist upper layer film having the formed circuit pattern as a mask;

transferring the pattern to the organic film by etching using the silicon-containing resist underlayer film having the transferred pattern as a mask; and further transferring the pattern to the body to be processed by etching using the organic film having the transferred pattern as a mask.

Furthermore, the present invention provides a patterning process comprising:

forming an organic film on a body to be processed from the inventive composition for forming an organic film;

forming an inorganic hard mask middle layer film selected from a silicon oxide film, a silicon nitride film, and a silicon oxynitride film on the organic film;

forming a resist upper layer film on the inorganic hard mask middle layer film from a photoresist composition;

forming a circuit pattern in the resist upper layer film;

transferring the pattern to the inorganic hard mask middle layer film by etching using the resist upper layer film having the formed circuit pattern as a mask;

transferring the pattern to the organic film by etching using the inorganic hard mask middle layer film having the formed pattern as a mask; and further transferring the pattern to the body to be processed by etching using the organic film having the formed pattern as a mask.

Furthermore, the present invention provides a patterning process comprising:

forming an organic film on a body to be processed from the inventive composition for forming an organic film;

forming an inorganic hard mask middle layer film selected from a silicon oxide film, a silicon nitride film, and a silicon oxynitride film on the organic film;

forming an organic antireflective film on the inorganic hard mask middle layer film;

forming a resist upper layer film on the organic antireflective film from a photoresist composition, so that a 4-layered film structure is constructed;

forming a circuit pattern in the resist upper layer film;

transferring the pattern to the organic antireflective film and the inorganic hard mask middle layer film by etching using the resist upper layer film having the formed circuit pattern as a mask;

transferring the pattern to the organic film by etching using the inorganic hard mask middle layer film having the formed pattern as a mask; and further transferring the pattern to the body to be processed by etching using the organic film having the formed pattern as a mask.

In this manner, the inventive composition for forming an organic film can be suitably used in various patterning processes such as a 3-layer resist process using the resist underlayer film or inorganic hard mask containing silicon atoms, and a 4-layer resist process using the organic antireflective film in addition to the resist underlayer film or inorganic hard mask. These inventive patterning processes make it possible to precisely transfer the circuit pattern in the resist upper layer film to the body to be processed, thereby forming the circuit pattern in the body to be processed.

Additionally, the inorganic hard mask middle layer film is preferably formed by a CVD method or an ALD method.

In the inventive patterning processes, for example, such methods can be used to form the inorganic hard mask middle layer film.

The circuit pattern is formed in the resist upper layer film preferably by a photolithography using light with a wavelength ranging from 10 nm to 300 nm, a direct drawing by electron beam, a nanoimprinting, or a combination thereof.

In addition, when the circuit pattern is formed in the resist upper layer film, the circuit pattern is preferably developed by alkaline development or development with an organic solvent.

In the inventive patterning processes, such circuit pattern-formation means and -development means can be suitably used.

Additionally, the body to be processed is preferably a semiconductor apparatus substrate or the semiconductor apparatus substrate coated with any of a metal film, a metal carbide film, a metal oxide film, a metal nitride film, a metal oxycarbide film, and a metal oxynitride film.

Further, the metal of the body to be processed is preferably silicon, titanium, tungsten, hafnium, zirconium, chromium, germanium, copper, silver, gold, aluminum, indium, gallium, arsenic, palladium, iron, tantalum, iridium, molybdenum, or an alloy thereof.

In the inventive patterning processes, such a body to be processed as described above can be processed to form a pattern.

Moreover, the present invention provides a resin for forming an organic film, comprising a structure shown by the following general formula (1) in which a ring structure AR containing an aromatic ring and a spiro structure SP bonded to four of the ARs are alternately repeated in at least a portion of a repeating unit,

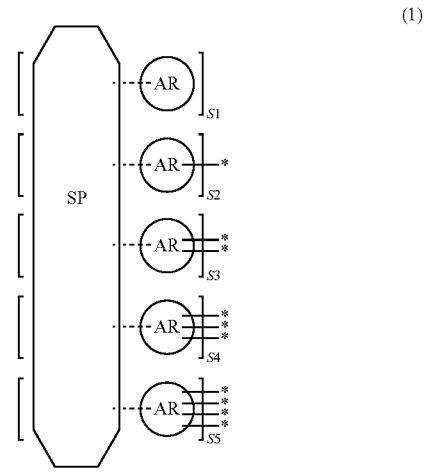

wherein SP represents a spiro structure shown by the following formula (1-1); AR represents a ring structure containing an aromatic ring as shown by the following formula (1-2), (1-3), (1-4), (1-5), (1-6), or (1-7); S1 represents an integer of 0 to 3, and S2, S3, S4, and S5 each independently represent an integer of 0 to 4, given that S1+S2+S3+S4+S5=4; a dotted line represents that a ring structure of the SP bonds to, while sharing one side with, the aromatic ring of the AR; and * represents that the aromatic ring of the AR bonds to, while sharing one side with, a ring structure of a spiro structure in an adjacent repeating unit,

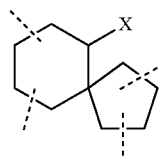
(1-1)

wherein X represents a hydroxyl group, an aryl su foxy group, or an alkoxy group, an acyloxy group, or an alkylsulfoxy group having 1 to 10 carbon atoms; a hydrogen atom of each of these groups is optionally substituted with a fluorine atom, a chlorine atom, a bromine atom, an iodine atom, an alkoxy group, an acyl group, or an acyloxy group; a dotted line represents that a ring structure in the formula (1-1) bonds to, while sharing one side with, the aromatic ring of the AR in the general formula (I); and the AR bonds only to a side whose adjacent sides in the spiro structure are not shared with an aromatic ring of another AR, the side having neither X nor a spiro bond,

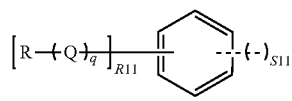
(1-2)

wherein all Rs may be identical to or different from each other, each representing a saturated or unsaturated monovalent hydrocarbon group having 1 to 20 carbon atoms; Q represents —O—, —CO—, —(CO)—O—, or —O—(CO)—; q represents 0 or 1; R11 represents an integer of 0 to 4, and S11 represents an integer of 1 to 3, given that 2≤R11+2×S11≤6; a dotted line represents that the aromatic ring in the formula (1-2) bonds to, while sharing one side with, the ring structure of the spiro structure; and the spiro structure bonds only to a side whose adjacent sides in the aromatic ring in the formula (1-2) are not shared with a ring structure of another spiro structure,

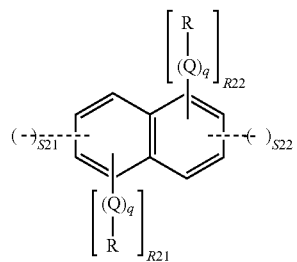
(1-3)

wherein R, Q, and q are as defined above; R21 represents an integer of 0 to 4, R22 represents an integer of 0 to 4, S21 represents an integer of 0 to 2, and S22 represents an integer of 0 to 2, given that 1≤S21+S22≤4 and 2≤R21+R22+2× (S21+S22)≤8; a dotted line represents that the aromatic ring in the formula (1-3) bonds to, while sharing one side with, the ring structure of the spiro structure; and the spiro structure bonds only to a side whose adjacent sides in the aromatic ring in the formula (1-3) are not shared with a ring structure of another spiro structure,

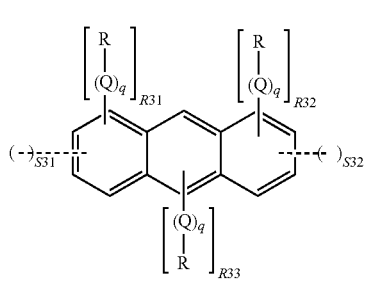
(1-4)

wherein R, Q, and q are as defined above; R31 represents an integer of 0 to 4, R32 represents an integer of 0 to 4, R33 represents an integer of 0 to 2, S31 represents an integer of 0 to 2, and 832 represents an integer of 0 to 2, given that 1≤S31+S32≤4 and 2≤R31+R32+R33+2×(S31+S32)≤10; a dotted line represents that the aromatic ring in the formula (1-4) bonds to, while sharing one side with, the ring structure of the spiro structure; and the spiro structure bonds only to a side whose adjacent sides in the aromatic ring in the formula (1-4) are not shared with a ring structure of another spiro structure,

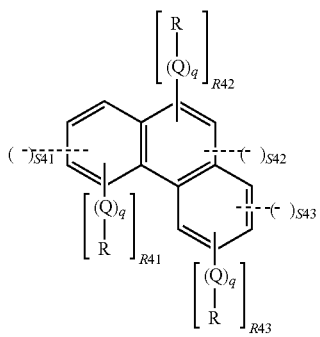
(1-5)

wherein R, Q, and q are as defined above; R41 represents an integer of 0 to 4, R42 represents an integer of 0 to 2, R43 represents an integer of 0 to 4, S41 represents an integer of 0 to 2, S42 represents an integer of 0 or 1, and S43 represents an integer of 0 to 2, given that 1≤S41+S42+S43≤5 and 2≤R41+R42+R43+2×(S41+S42+S43)≤10; a dotted line represents that the aromatic ring in the formula (1-5) bonds to, while sharing one side with, the ring structure of the spiro structure; and the spiro structure bonds only to a side whose adjacent sides in the aromatic ring in the formula (1-5) are not shared with a ring structure of another spiro structure,

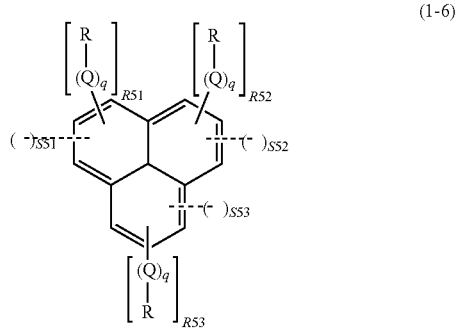

(1-6)

wherein R, Q, and q are as defined above; R51 represents an integer of 0 to 3, R52 represents an integer of 0 to 3, R53 represents an integer of 0 to 3, S51 represents an integer of 0 or 1, S52 represents an integer of 0 or 1, and S53 represents an integer of 0 or 1, given that 1≤S51+S52+S53≤3 and 2≤R51+R52+R53+2×(S51+S52+S53)≤9; a dotted line represents that the aromatic ring in the formula (1-6) bonds to, while sharing one side with, the ring structure of the spiro structure; and the spiro structure bonds only to a side whose adjacent sides in the aromatic ring in the formula (1-6) are not shared with a ring structure of another spiro structure,

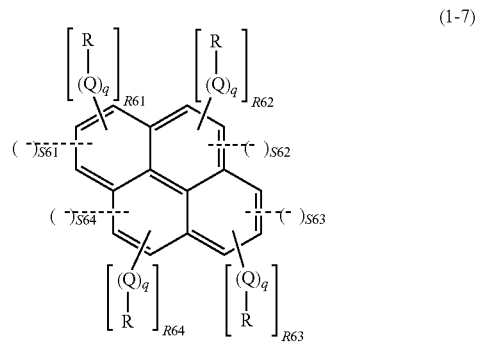

(1-7)

wherein R, Q, and q are as defined above; R61 represents an integer of 0 to 3, R62 represents an integer of 0 or 1, R63 represents an integer of 0 to 3, R64 represents an integer of 0 to 2, S61 represents an integer of 0 or 1, S62 represents an integer of 0 or 1, S63 represents an integer of 0 or 1, and S64 represents an integer of 0 or 1, given that 1≤S61+S62+S63+S64≤4 and 2≤R61+R62+R63+R64+2×(S61+S62+S63+S64)≤10; a dotted line represents that the aromatic ring in the formula (1-7) bonds to, while sharing one side with, the ring structure of the spiro structure; and the spiro structure bonds only to a side whose adjacent sides in the aromatic ring in the formula (1-7) are not shared with a ring structure of another spiro structure.

This resin can be suitably used as a material of a composition for forming an organic film that can provide an organic film having high filling and planarizing properties, curving resistance, and etching resistance.

Advantageous Effects of Invention

As has been described above, the present invention can provide: a resin useful as a component of an organic film composition for forming an organic film having all of high etching resistance, twisting resistance during etching, and planarizing property; and a composition for forming an organic film containing this resin. Moreover, because of excellent etching resistance and planarizing property, this composition for forming an organic film is quite useful as a resist underlayer film composition in multilayer resist processes, for example, a 2-layer resist process, a 3-layer resist process using a silicon-containing resist underlayer film, or a 4-layer resist process using a silicon-containing resist underlayer film and an organic antireflective film. Further, in the inventive patterning processes, it is possible to suitably use exposure light such as deep ultraviolet ray, KrF excimer laser beam (248 nm), ArF excimer laser beam (193 nm), $F_2$ laser beam (157 nm), $Kr_2$ laser beam (146 nm), $Ar_2$ laser beam (126 nm), extreme ultraviolet ray (EUV, 13.5 nm), electron beam (EB), and X-ray. Thus, in the multilayer resist processes, a fine pattern can be precisely formed in a substrate to be processed.

BRIEF DESCRIPTION OF DRAWINGS

FIG. 1 is an explanatory view of an example of an inventive patterning process according to a 3-layer resist process.

DESCRIPTION OF EMBODIMENTS

As described above, there have been demands for developments of a composition for forming an organic film having high filling and planarizing properties and etching resistance; and a resin for forming an organic film useful for the composition for forming an organic film.

In order to achieve the above-described object, the present inventors earnestly studied and consequently found that if a composition for forming an organic film contains a resin having a repeated structure in which a ring structure containing an aromatic ring bonds to, while sharing one side with, a spiro structure, heating the composition detaches HX from the spiro ring structure, forming a naphthalene structure owing to the change in carbon-carbon bond. Hence, the entire organic film has such a structure that aromatic ring structures having high etching resistance are condensed, thereby forming a structure having high filling and planarizing properties attributable to spin coating or the like. Further, in the structure, the aromatic rings are condensed and the number of hydrogen atoms is small. This results in a composition for forming an organic film that can provide an organic film having high curving and twisting resistances and etching resistance. This finding has led to the completion of the present invention.

Specifically, the present invention is a composition for forming an organic film, containing:

(I) a resin having a structure shown by the following general formula (1) in which a ring structure AR containing an aromatic ring and a spiro structure SP bonded to four of the ARs are alternately repeated in at least a portion of a repeating unit; and (II) an organic solvent,

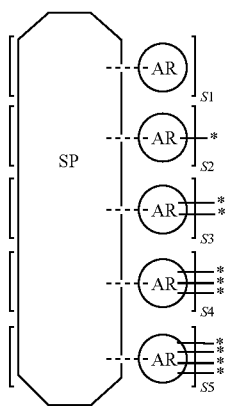
(1)

wherein SP represents a spiro structure shown by the following formula (1-1); AR represents a ring structure containing an aromatic ring as shown by the following formula (1-2), (1-3), (1-4), (1-5), (1-6), or (1-7); S1 represents an integer of 0 to 3, and S2, S3, S4, and S5 each independently represent an integer of 0 to 4, given that S1+S2+S3+S4+S5=4; a dotted line represents that a ring structure of the SP bonds to, while sharing one side with, the aromatic ring of the AR; and * represents that the aromatic ring of the AR bonds to, while sharing one side with, a ring structure of a spiro structure in an adjacent repeating unit,

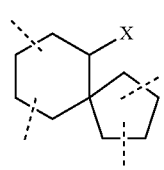
(1-1)

wherein X represents a hydroxyl group, an aryl sulfoxy group, or an alkoxy group, an acyloxy group, or an alkylsulfoxy group having 1 to 10 carbon atoms; a hydrogen atom of each of these groups is optionally substituted with a fluorine atom, a chlorine atom, a bromine atom, an iodine atom, an alkoxy group, an acyl group, or an acyloxy group; a dotted line represents that a ring structure in the formula (1-1) bonds to, while sharing one side with, the aromatic ring of the AR in the general formula (1); and the AR bonds only to a side whose adjacent sides in the spiro structure are not shared with an aromatic ring of another AR, the side having neither X nor a spiro bond,

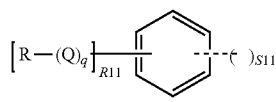
(1-2)

wherein all Rs may be identical to or different from each other, each representing a saturated or unsaturated monovalent hydrocarbon group having 1 to 20 carbon atoms; Q represents —O—, —CO—, —(CO)—O—, or —O—(CO)—; q represents 0 or 1; R11 represents an integer of 0 to 4, and S11 represents an integer of 1 to 3, given that 2≤R11+2×S11≤6; a dotted line represents that the aromatic ring in the formula (1-2) bonds to, while sharing one side with, the ring structure of the spiro structure; and the spiro structure bonds only to a side whose adjacent sides in the aromatic ring in the formula (1-2) are not shared with a ring structure of another spiro structure,

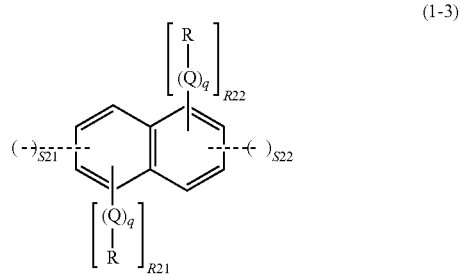
(1-3)

wherein R, Q, and q are as defined above; R21 represents an integer of 0 to 4, R22 represents an integer of 0 to 4, S21 represents an integer of 0 to 2, and S22 represents an integer of 0 to 2, given that 1≤S21+S22≤4 and 2≤R21+R22+2×(S21+S22)≤8; a dotted line represents that the aromatic ring in the formula (1-3) bonds to, while sharing one side with, the ring structure of the spiro structure; and the spiro structure bonds only to a side whose adjacent sides in the aromatic ring in the formula (1-3) are not shared with a ring structure of another spiro structure,

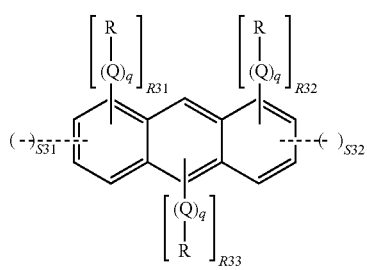
(1-4)

wherein R, Q, and q are as defined above; R31 represents an integer of 0 to 4, R32 represents an integer of 0 to 4, R33 represents an integer of 0 to 2, S31 represents an integer of 0 to 2, and S32 represents an integer of 0 to 2, given that 1≤S31+S32≤4 and 2≤R31+R32+R33+2×(S31+S32)≤10; a dotted line represents that the aromatic ring in the formula (1-4) bonds to, while sharing one side with, the ring structure of the spiro structure; and the spiro structure bonds only to a side whose adjacent sides in the aromatic ring in the formula (1-4) are not shared with a ring structure of another spiro structure,

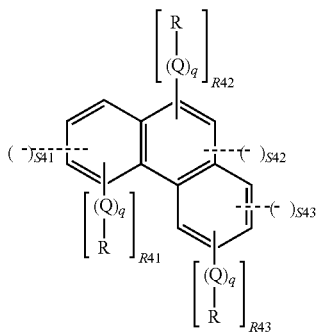

(1-5)

wherein R, Q, and q are as defined above; R41 represents an integer of 0 to 4, R42 represents an integer of 0 to 2, R43 represents an integer of 0 to 4, S41 represents an integer of 0 to 2, S42 represents an integer of 0 or 1, and S43 represents an integer of 0 to 2, given that $1 \leq S41+S42+S43 \leq 5$ and $2 \leq R41+R42+R43+2\times(S41+S42+S43) \leq 10$; a dotted line represents that the aromatic ring in the formula (1-5) bonds to, while sharing one side with, the ring structure of the spiro structure; and the spiro structure bonds only to a side whose adjacent sides in the aromatic ring in the formula (1-5) are not shared with a ring structure of another spiro structure,

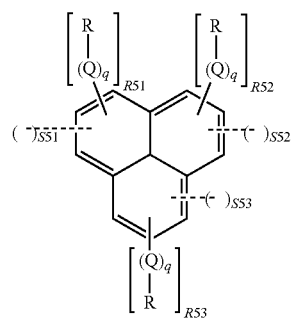

(1-6)

wherein R, Q, and q are as defined above; R51 represents an integer of 0 to 3, R52 represents an integer of 0 to 3, R53 represents an integer of 0 to 3, S51 represents an integer of 0 or 1, S52 represents an integer of 0 or 1, and S53 represents an integer of 0 or 1, given that $1 \leq S51+S52+S53 \leq 3$ and $2 \leq R51+R52+R53+2\times(S51+S52+S53) \leq 9$; a dotted line represents that the aromatic ring in the formula (1-6) bonds to, while sharing one side with, the ring structure of the spiro structure; and the spiro structure bonds only to a side whose adjacent sides in the aromatic ring in the formula (1-6) are not shared with a ring structure of another spiro structure,

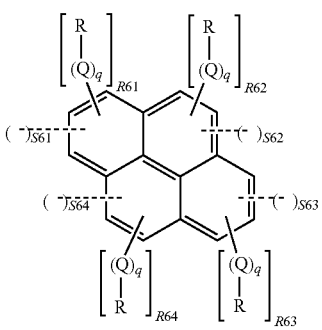

(1-7)

wherein R, Q, and q are as defined above; R61 represents an integer of 0 to 3, R62 represents an integer of 0 or 1, R63 represents an integer of 0 to 3, R64 represents an integer of 0 to 2, S61 represents an integer of 0 or 1, S62 represents an integer of 0 or 1, S63 represents an integer of 0 or 1, and S64 represents an integer of 0 or 1, given that $1 \leq S61+S62+S63+S64 \leq 4$ and $2 \leq R61+R62+R63+R64+2\times(S61+S62+S63+S64) \leq 10$; a dotted line represents that the aromatic ring in the formula (1-7) bonds to, while sharing one side with, the ring structure of the spiro structure; and the spiro structure bonds only to a side whose adjacent sides in the aromatic ring in the formula (1-7) are not shared with a ring structure of another spiro structure.

Hereinafter, embodiments of the present invention will be described, but the present invention is not limited thereto.

<Resin for Forming Organic Film>

The inventive resin for forming an organic film contains a structure shown by the general formula (1) in which a ring structure AR containing an aromatic ring and a spiro structure SP bonded to four of the ARs are alternately repeated in at least a portion of a repeating unit.

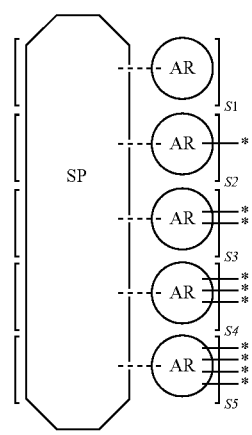

(1)

In the general formula (1), S1 represents an integer of 0 to 3, and S2, S3, S4, and S5 each independently represent an integer of 0 to 4, given that $S1+S2+S3+S4+S5=4$. Here, a dotted line represents that a ring structure of SP bonds to, while sharing one side with, an aromatic ring of AR. * represents that an aromatic ring of AR bonds to, while sharing one side with, a ring structure of a spiro structure in an adjacent repeating unit.

In the general formula (1), SP represents a spiro structure shown by the following formula (1-1), and AR represents a ring structure containing an aromatic ring as shown by the following formula (1-2), (1-3), (1-4), (1-5), (1-6), or (1-7). SP and AR bond to each other while sharing one side of a five-membered ring or a six-membered ring of the SP and one side of an aromatic ring of the AR with each other. Since this bond between SP and AR is repeated, the inventive resin for forming an organic film has such a structure that the main chain is formed only of ring structures in at least a portion of a repeating unit.

[Spiro Structure (SP)]

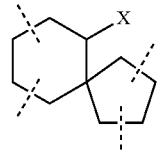
(1-1)

The inventive resin for forming an organic film contains a spiro structure (SP) which is the spiro structure shown by the formula (1-1). In the formula (1-1), X represents a hydroxyl group, an aryl sulfoxy group, or an alkoxy group, an acyloxy group, or an alkylsulfoxy group having 1 to 10 carbon atoms. A hydrogen atom of each of these groups may be substituted with a fluorine atom, a chlorine atom, a bromine atom, an iodine atom, an alkoxy group, an acyl group, or an acyloxy group.

In the formula (1-1), a dotted line represents that a ring structure of SP bonds to, while sharing one side with, an aromatic ring of AR in the general formula (1). Note that AR bonded to SP bonds only to a side whose adjacent sides in the SP are not shared with an aromatic ring of another AR, the side having neither X nor a spiro bond that is a point where a five-membered ring and a six-membered ring are bonded. In other words, in the formula (1-1), four sides intersecting with dotted lines are respectively shared with, and bond to, one sides of aromatic rings of four ARs.

[Ring Structure (AR) Containing Aromatic Ring]

The inventive resin for forming an organic film contains a ring structure (AR) containing an aromatic ring. The ring structure (AR) is a structure shown by any of the following structural formulas (1-2) to (1-7).

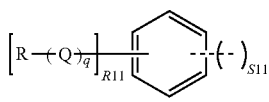
(1-2)

In the formula (1-2), all Rs may be identical to or different from each other, each representing a saturated or unsaturated monovalent hydrocarbon group having 1 to 20 carbon atoms. Q represents —O—, —CO—, —(CO)—O—, or —O—(CO)—. q represents 0 or 1. R11 represents an integer of 0 to 4, and S11 represents an integer of 1 to 3, given that $2 \leq R11+2 \times S11 \leq 6$.

In the formula (1-2), a dotted line represents that the aromatic ring in the formula (1-2) bonds to, while sharing one side with, a ring structure of the spiro structure. Note that the spiro structure bonds only to a side whose adjacent sides in the aromatic ring in the formula (1-2) are not shared with a ring structure of another spiro structure. In other words, the AR shown by the formula (1-2) can bond to at most three spiro structures.

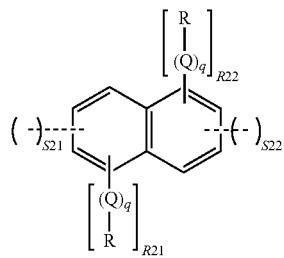
(1-3)

In the formula (1-3), R, Q, and q are as described above. R21 represents an integer of 0 to 4, R22 represents an integer of 0 to 4, S21 represents an integer of 0 to 2, and S22 represents an integer of 0 to 2, given that $1 \leq S21+S22 \leq 4$ and $2 \leq R21+R22+2 \times (S21+S22) \leq 8$.

In the formula (1-3), a dotted line represents that an aromatic ring in the formula (1-3) bonds to, while sharing one side with, a ring structure of the spiro structure. Note that the spiro structure bonds only to a side whose adjacent sides in the aromatic ring in the formula (1-3) are not shared with a ring structure of another spiro structure. Additionally, the spiro structure cannot bond to sides which are adjacent to a side where two aromatic rings in the formula (1-3) bond to, while sharing one side with, each other. In other words, the AR shown by the formula (1-3) can bond to at most four spiro structures because each of the two aromatic rings can bond to two spiro structures.

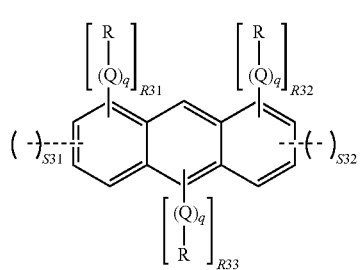
(1-4)

In the formula (1-4), R, Q, and q are as described above. R31 represents an integer of 0 to 4, R32 represents an integer of 0 to 4, R33 represents an integer of 0 to 2, S31 represents an integer of 0 to 2, and S32 represents an integer of 0 to 2, given that $1 \leq S31+S32 \leq 4$ and $2 \leq R31+R32+R33+2 \times (S31+S32) \leq 10$.

In the formula (1-4), a dotted line represents that an aromatic ring in the formula (1-4) bonds to, while sharing one side with, a ring structure of the spiro structure. Note that the spiro structure bonds only to a side whose adjacent sides in the aromatic ring in the formula (1-4) are not shared with a ring structure of another spiro structure. Additionally, the spiro structure cannot bond to sides which are adjacent to sides where two aromatic rings in the formula (1-4) bond to, while sharing one side with, each other. In other words, the AR shown by the formula (1-4) can bond to at most four spiro structures because the central aromatic ring in the formula (1-4) cannot bond to any spiro structure whereas each of two aromatic rings at both ends can bond to two spiro structures.

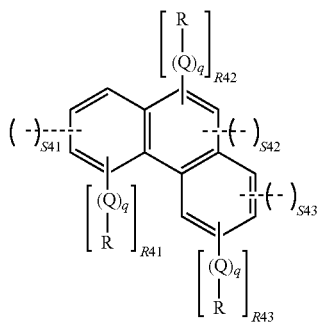

(1-5)

In the formula (1-5), R, Q, and q are as described above. R41 represents an integer of 0 to 4, R42 represents an integer of 0 to 2, R43 represents an integer of 0 to 4, S41 represents an integer of 0 to 2, S42 represents an integer of 0 or 1, and S43 represents an integer of 0 to 2, given that $1 \leq S41+S42+S43 \leq 5$ and $2 \leq R41+R42+R43+2\times(S41+S42+S43) \leq 10$.

In the formula (1-5), a dotted line represents that an aromatic ring in the formula (1-5) bonds to, while sharing one side with, a ring structure of the spiro structure. Note that the spiro structure bonds only to a side whose adjacent sides in the aromatic ring in the formula (1-5) are not shared with a ring structure of another spiro structure. Additionally, the spiro structure cannot bond to sides which are adjacent to sides where two aromatic rings in the formula (1-5) bond to, while sharing one side with, each other. In other words, the AR shown by the formula (1-5) can bond to at most five spire structures because the central aromatic ring in the formula (1-5) can bond to one spiro structure and each of two aromatic rings at both ends can bond to two spiro structures.

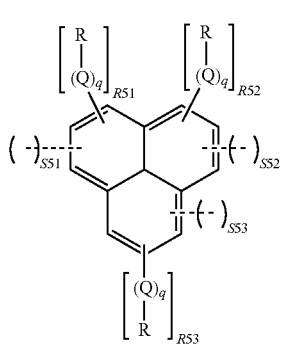

(1-6)

In the formula (1-6), R, Q, and q are as described above. R51 represents an integer of 0 to 3, R52 represents an integer of 0 to 3, R53 represents an integer of 0 to 3, S51 represents an integer of 0 or 1, S52 represents an integer of 0 or 1, and S53 represents an integer of 0 or 1, given that $1 \leq S51+S52+S53 \leq 3$ and $2 \leq R51+R52+R53+2\times(S51+S52+S53) \leq 9$.

In the formula (1-6), a dotted line represents that an aromatic ring in the formula (1-6) bonds to, while sharing one side with, a ring structure of the spiro structure. Note that the spiro structure bonds only to a side whose adjacent sides in the aromatic ring in the formula (1-6) are not shared with a ring structure of another spiro structure. Additionally, the spiro structure cannot bond to sides which are adjacent to sides where two aromatic rings in the formula (1-6) bond to, while sharing one side with, each other. In other words, the AR shown by the formula (1-6) can bond to at most three spiro structures because each of the three aromatic rings can bond to one spiro structure.

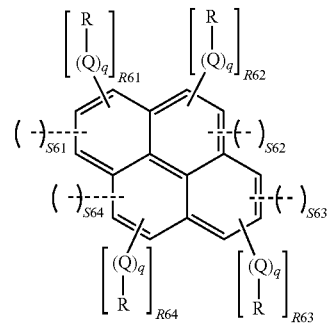

(1-7)

In the formula (1-7), R, Q, and q are as described above. R61 represents an integer of 0 to 3, R62 represents an integer of 0 or 1, R63 represents an integer of 0 to 3, R64 represents an integer of 0 to 2, S61 represents an integer of 0 or 1, S62 represents an integer of 0 or 1, S63 represents an integer of 0 or 1, and S64 represents an integer of 0 or 1, given that $1 \leq S61+S62+S63+S64 \leq 4$ and $2 \leq R61+R62+R63+R64+2\times(S61+S62+S63+S64) \leq 10$.

In the formula (1-7), a dotted line represents that an aromatic ring in the formula (1-7) bonds to, while sharing one side with, a ring structure of the spiro structure. Note that the spiro structure bonds only to a side whose adjacent sides in the aromatic ring in the formula (1-7) are not shared with a ring structure of another spiro structure. Additionally, the spiro structure cannot bond to sides which are adjacent to sides where two aromatic rings in the formula (1-7) bond to, while sharing one side with, each other. In other words, the AR shown by the formula (1-7) can bond to at most four spiro structures because each of the four aromatic rings can bond to one spiro structure.

[Method for Producing Resin for Forming Organic Film]

Here, an example of a method for producing the inventive resin for forming an organic film includes a production method including the following steps, but is not limited thereto.

(Step α: Production of Polyol Compound (0-3))

Using a starting material (0-1) of a compound containing at least two five-membered ring ketones each condensed with two aromatic rings in one molecule as a raw material, a polyol compound (0-3) is produced by a pinacol coupling reaction via one-electron reduction reaction (0-2) with an alkaline metal or an alkali earth metal.

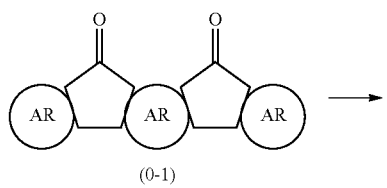

(0-1)

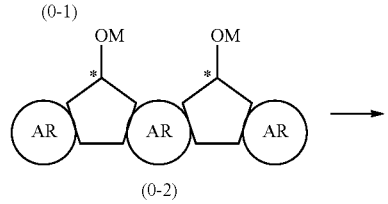

(0-2)

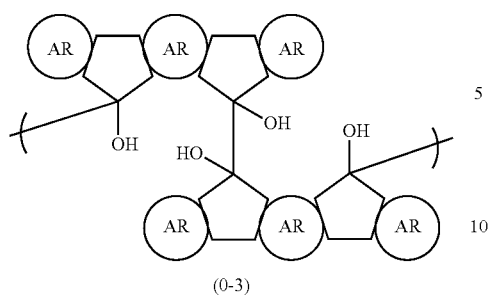
(0-3)
(AR represents the ring structure containing an aromatic ring shown by any of the formulas (1-2) to (1-7), and M represents an alkaline metal or an alkali earth metal.)
The polyol compound (0-3) can be produced from the starting material (0-1) exemplified by, for example, the following general formulas without limitation to the following.
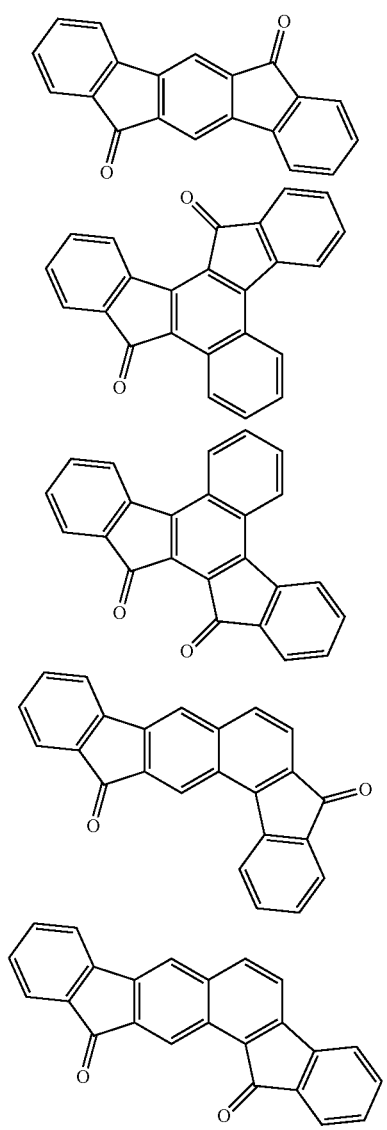
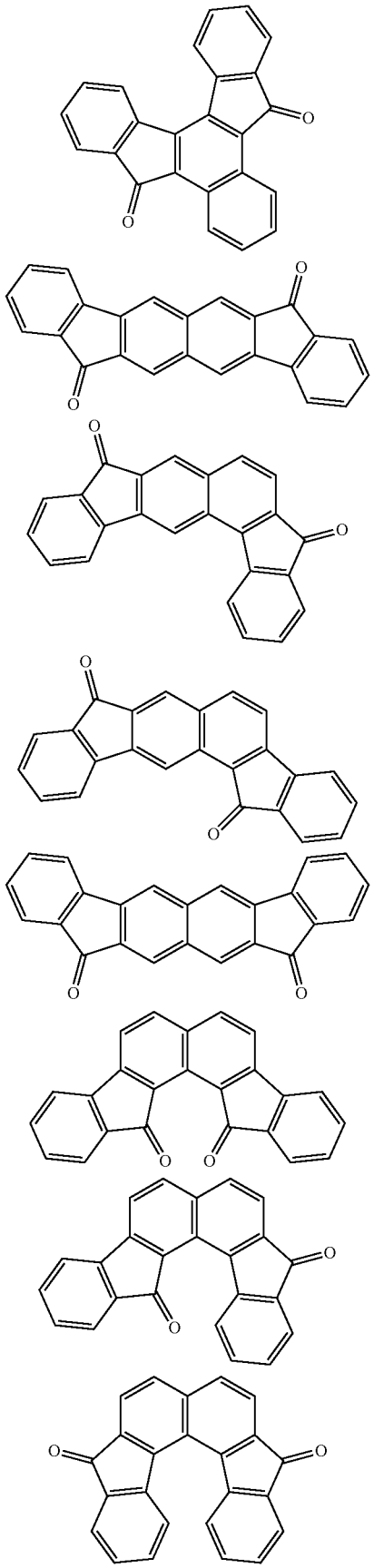

-continued
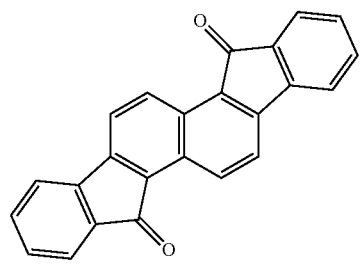
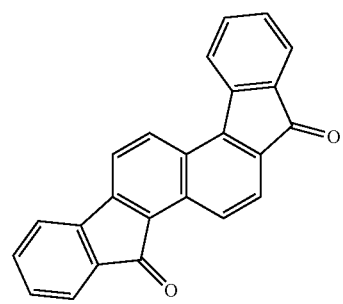
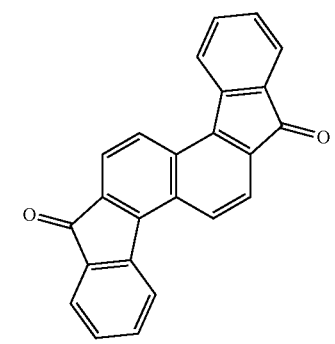
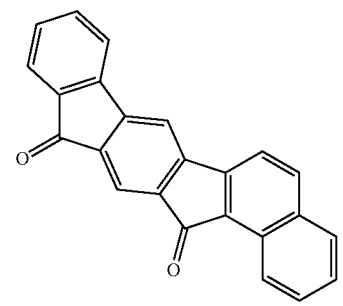
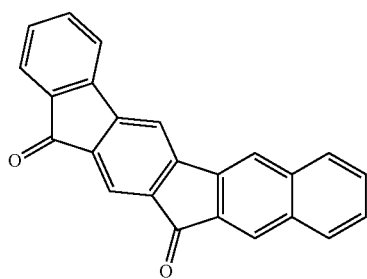
-continued
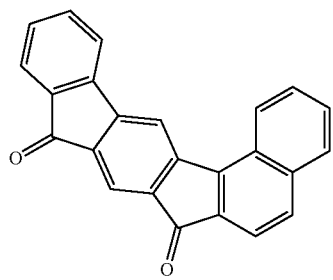
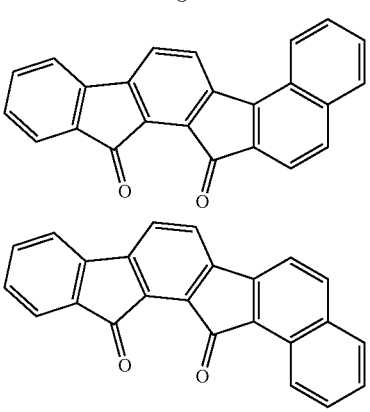
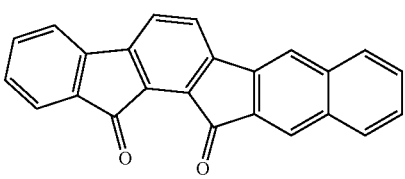
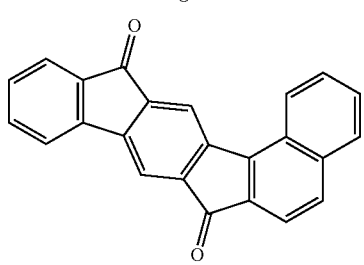
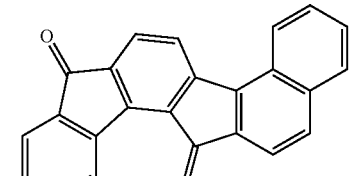
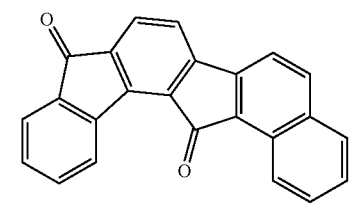
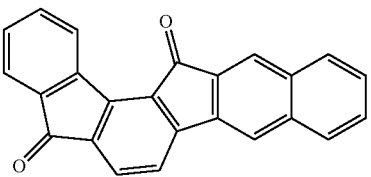

-continued
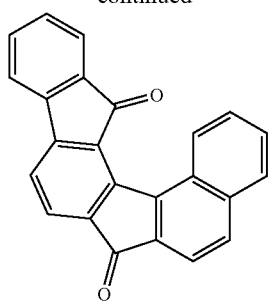
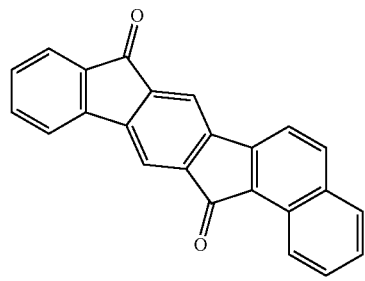
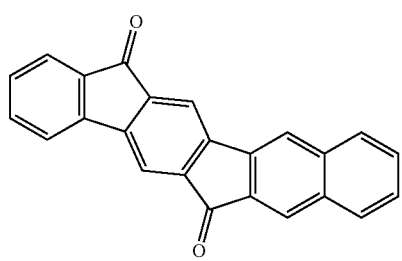
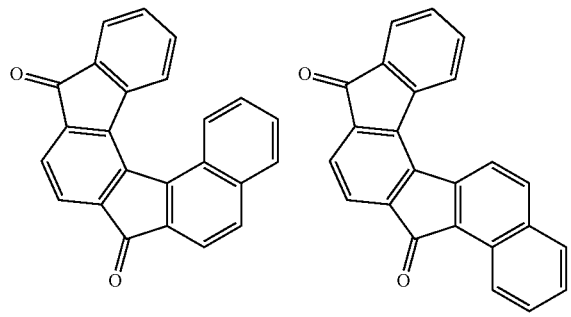
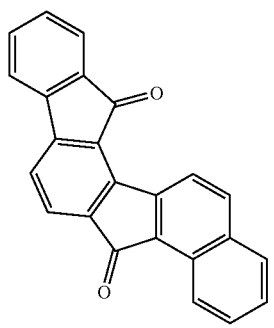
-continued
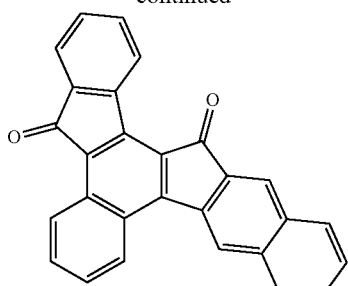
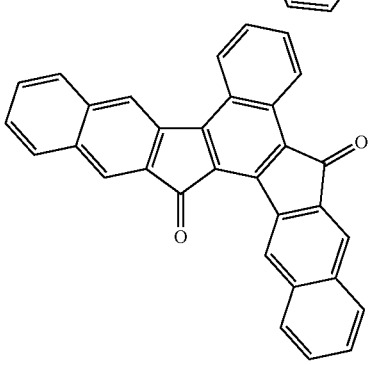
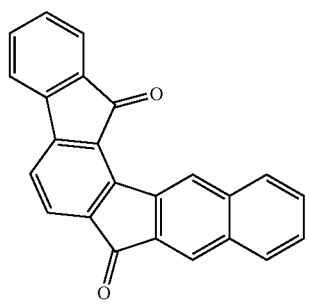
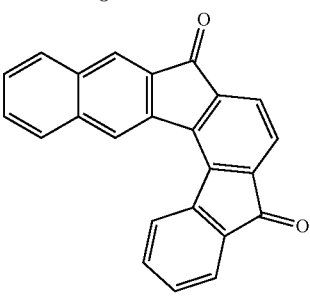
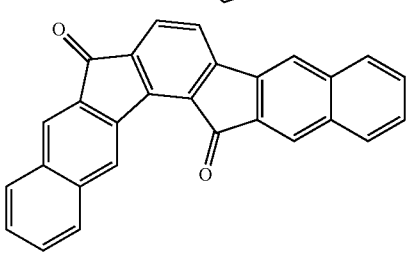
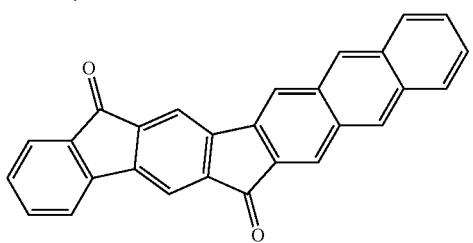

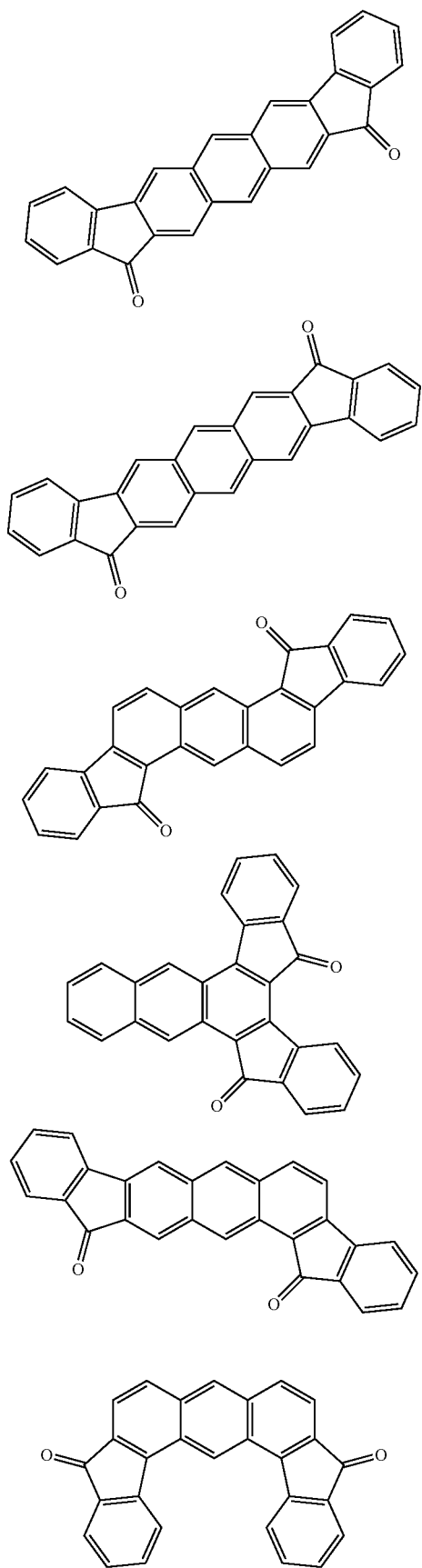
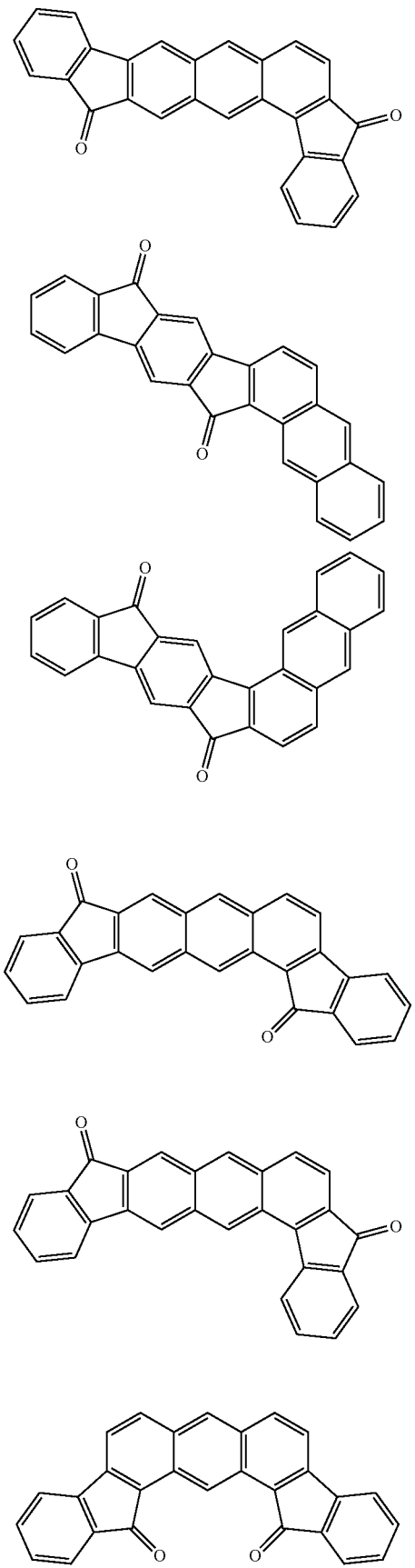

-continued
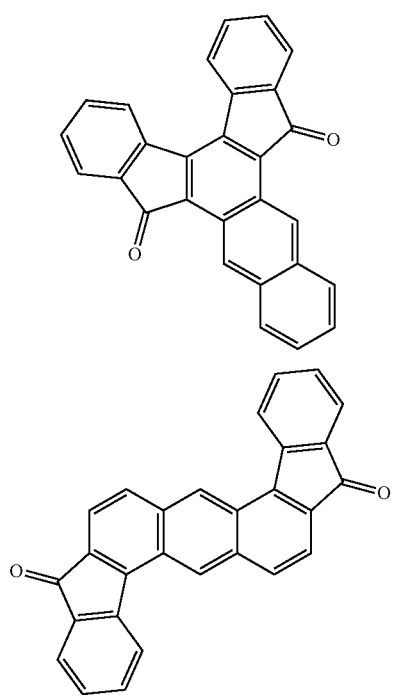
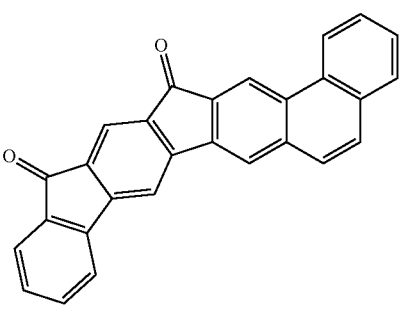
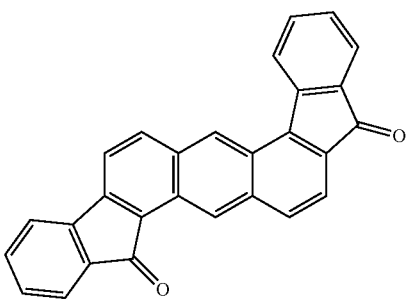
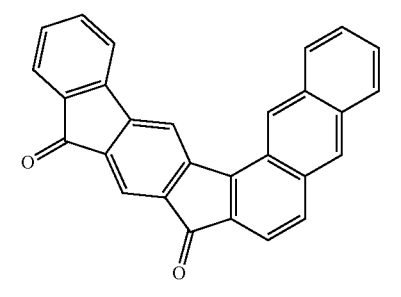
-continued
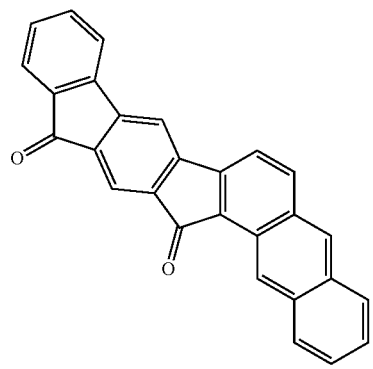
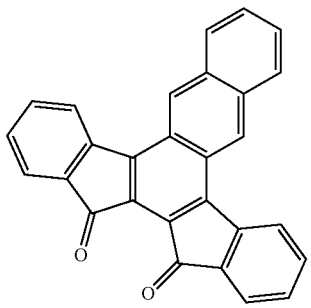
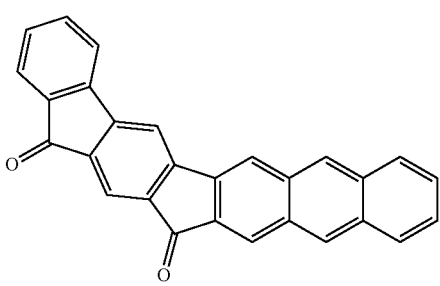
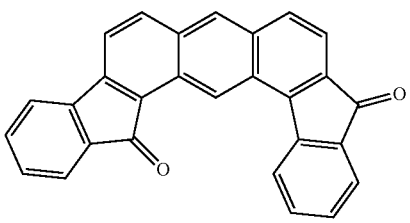
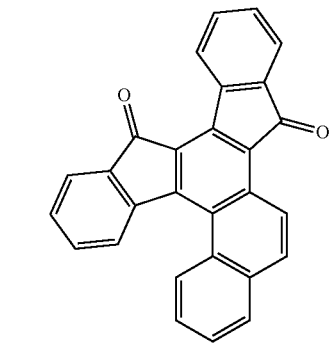

-continued
31
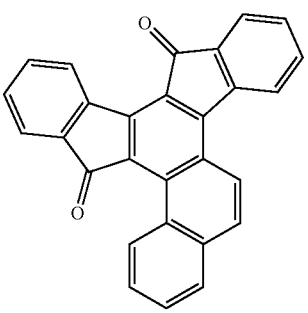
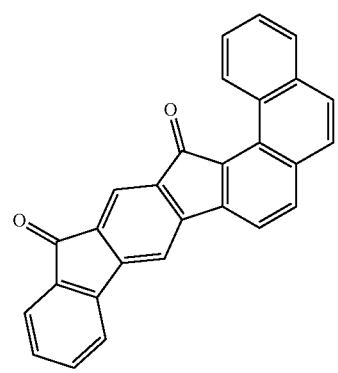
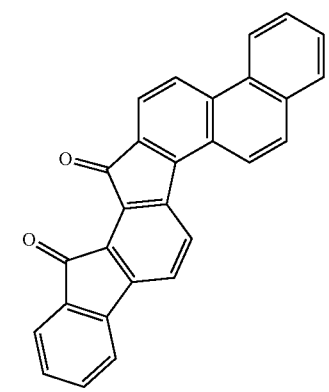
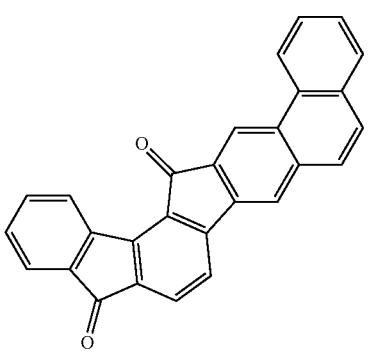
-continued
32
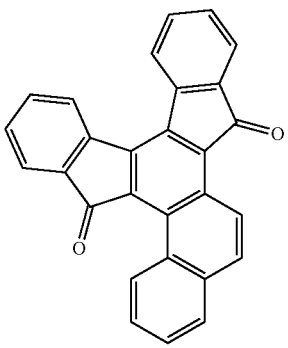
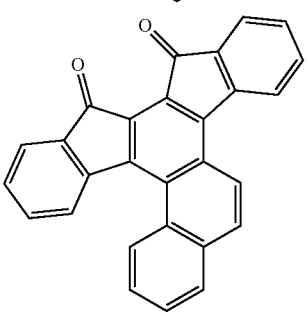
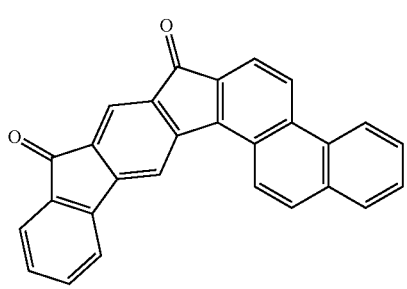
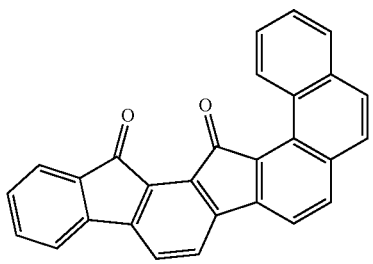
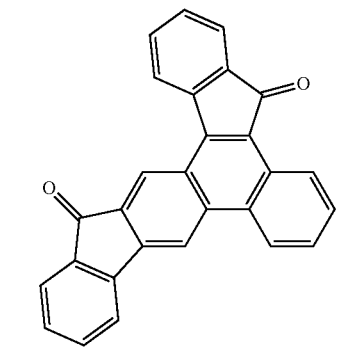

33
-continued
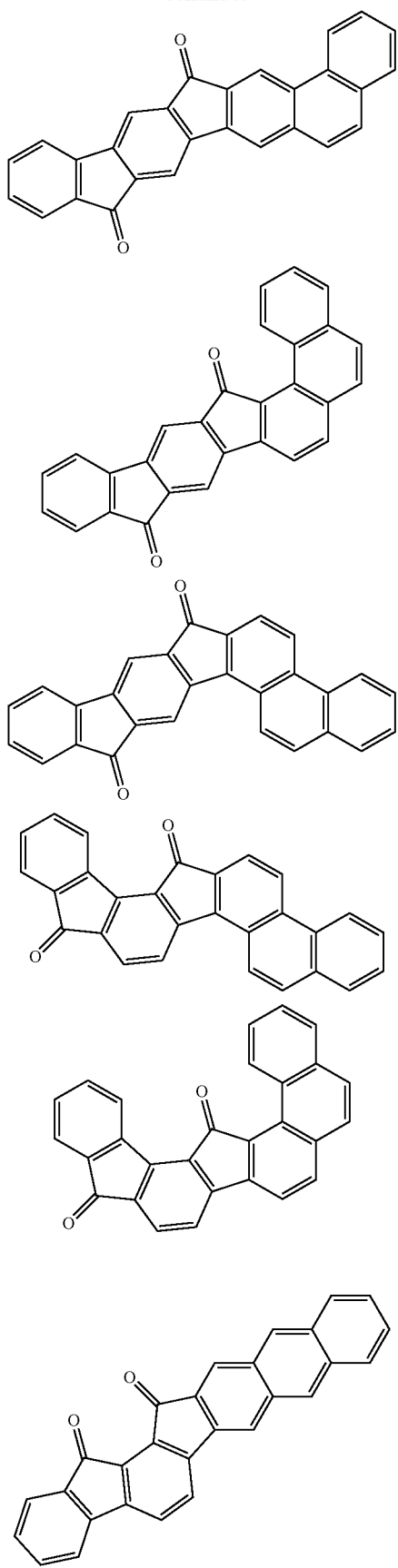
34
-continued
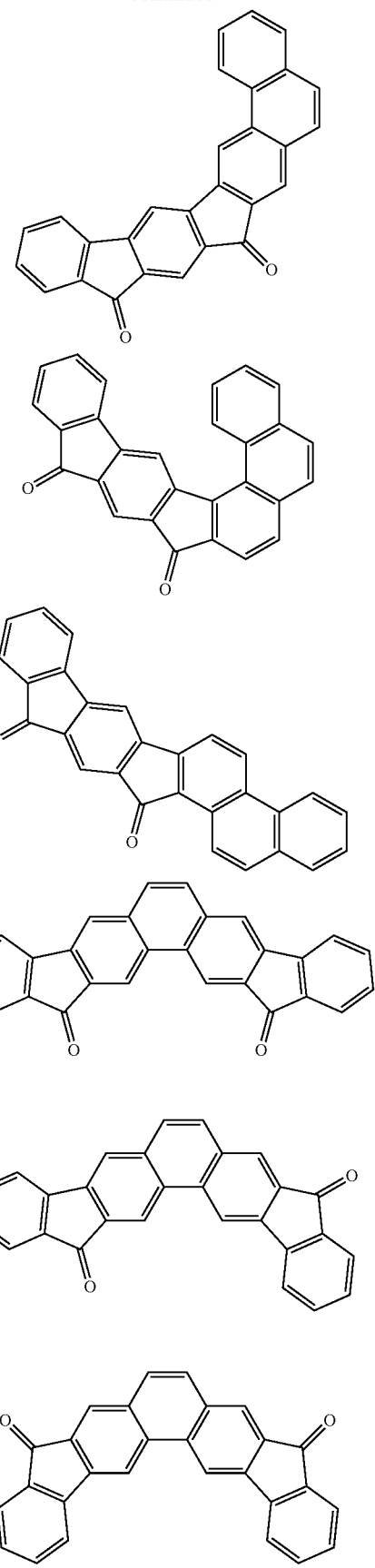

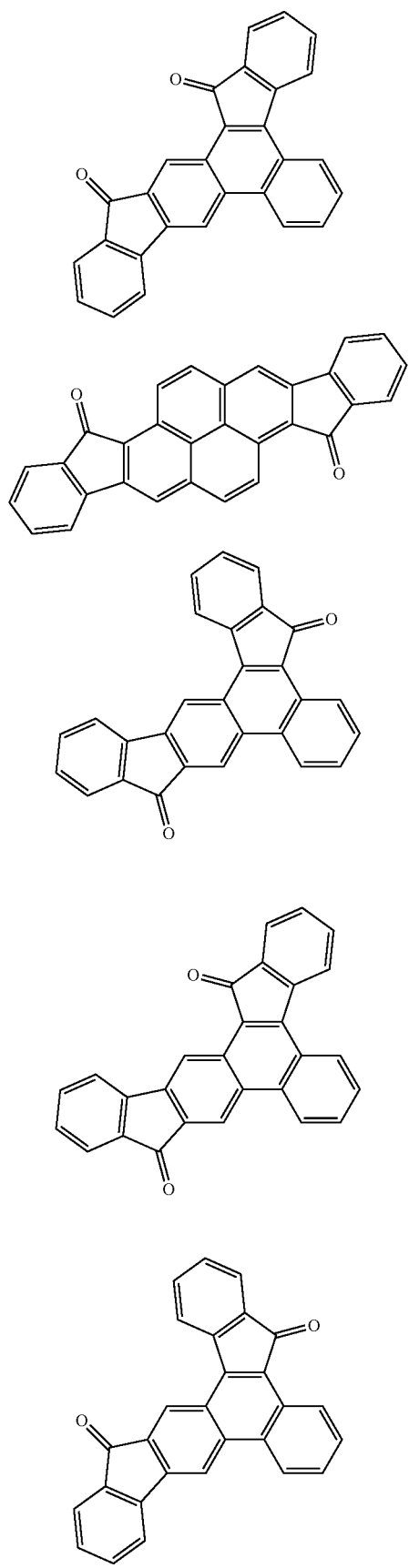
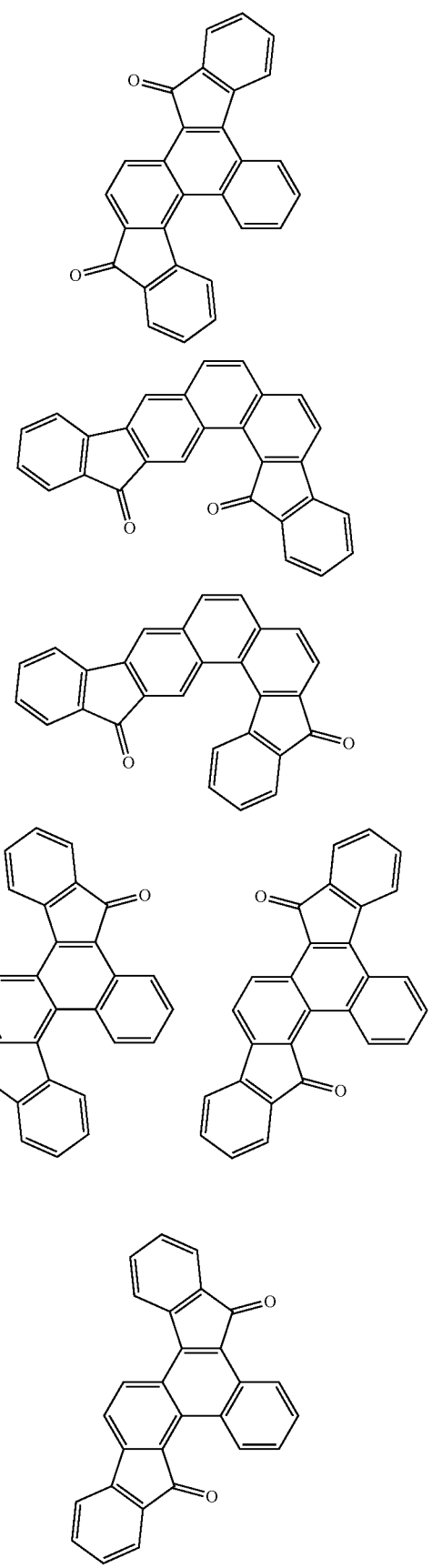

-continued
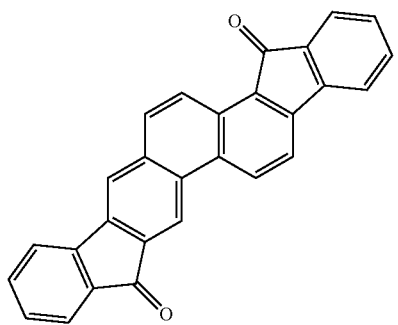
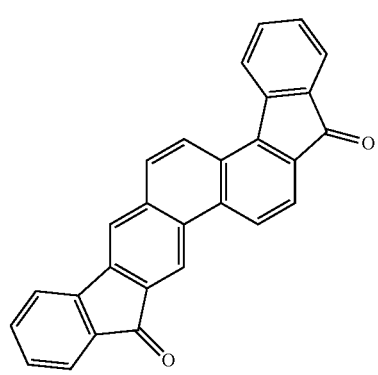
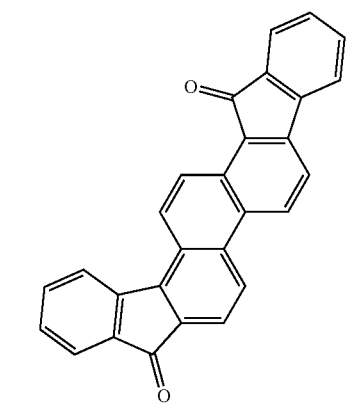
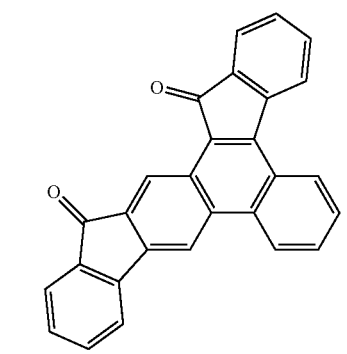
-continued
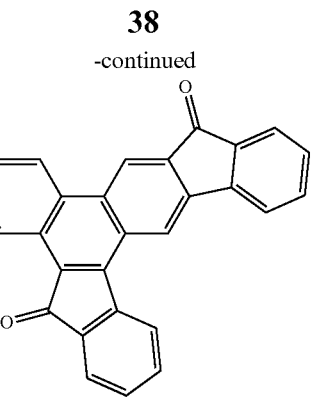
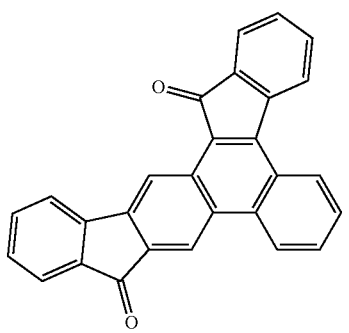
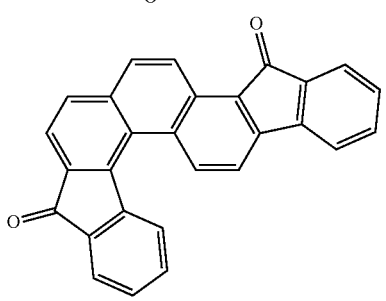
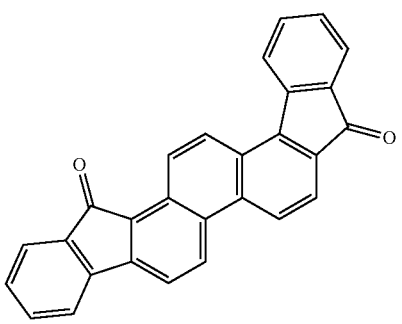
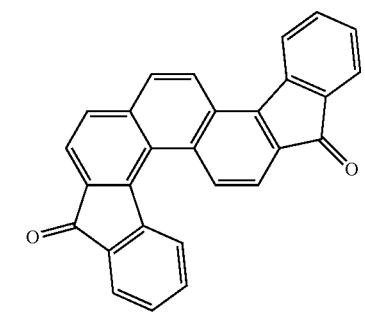

-continued
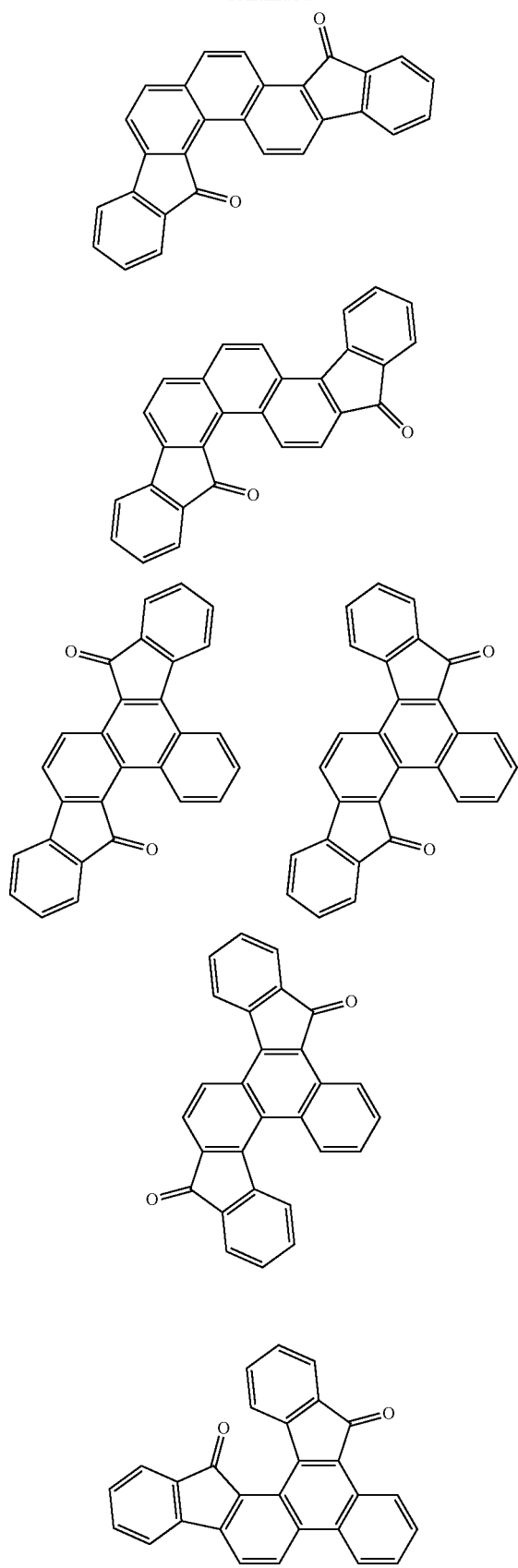
-continued
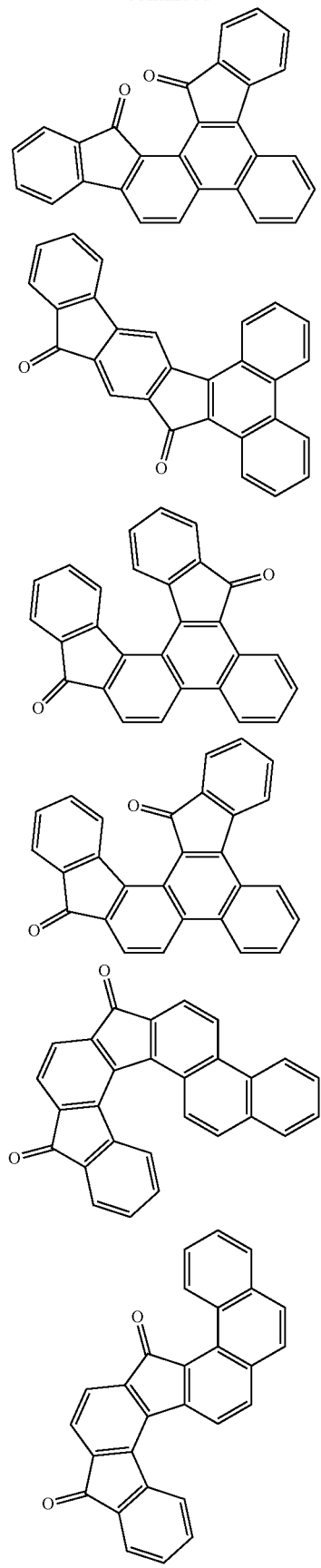

-continued
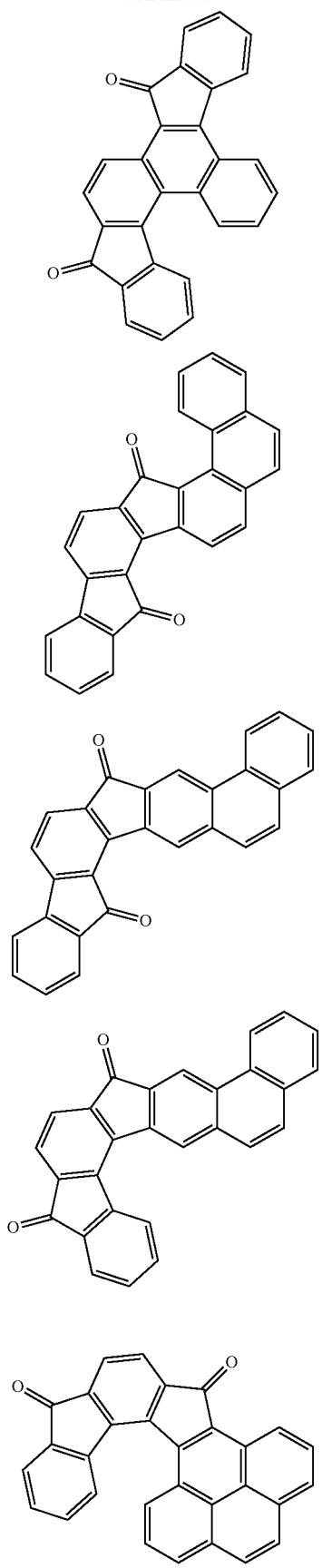
-continued
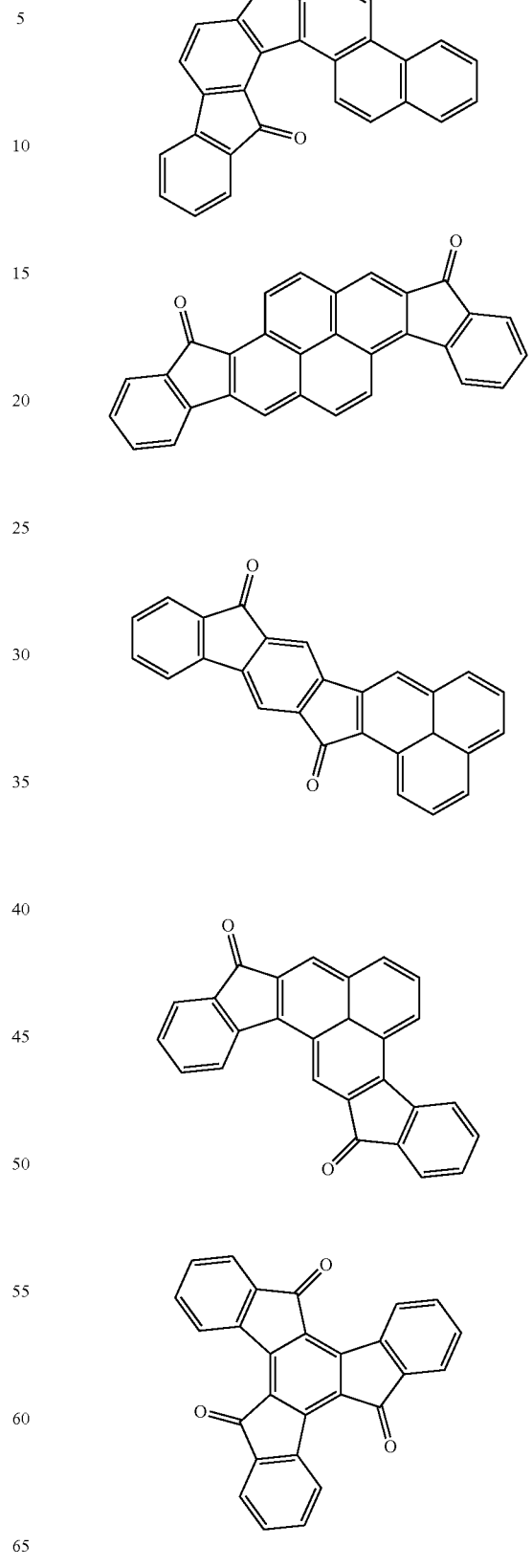

-continued

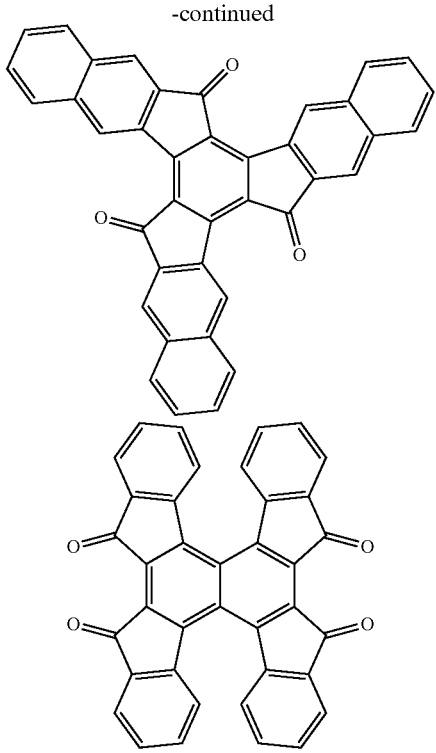

Hydrogen atoms of the starting materials shown by the above structural formulas may be substituted. Preferable substituents thereof include a methyl group, an ethyl group, a propyl group, a vinyl group, an allyl group, a propargyl group, a methoxy group, an ethoxy group, a propoxy group, a vinyloxy group, an allyloxy group, a propargyloxy group, a phenyl group, a tolyl group, a naphthyl group, an anthranyl group, a phenanthrenyl group, a pyrenyl group, a hydroxyphenyl group, and a hydroxynaphthyl group.

According to a required performance of the resin for forming an organic film to be prepared, starting materials having appropriate structures can be used in combination. When starting materials containing a side chain structure for improving planarizing property and a rigid aromatic ring structure for improving etching resistance and heat resistance are combined at a certain ratio to prepare and use the resin for forming an organic film, the inventive composition for forming an organic film can achieve both higher filling and planarizing properties as well as higher etching resistance.

Moreover, in producing the polyol compound (0-3) by the pinacol coupling reaction, the aforementioned starting materials (0-1) can be used in combination with the following in order to improve the filling property, solvent solubility, or the like of the composition for forming an organic film: ketones such as acetone, methyl ethyl ketone, cyclohexanone, benzophenone, fluorenone, and benzofluorenone; aromatic aldehydes such as benzaldehyde, naphthaldehyde, and anthracenealdehyde; and diketones such as acenaphthaquinone, cyclopenta[f,g]tetracene-1,2-dione, 1,2-indandione.

The polyol compound (0-3) can be obtained generally by subjecting the starting material (0-1) to one-electron reduction reaction in an organic solvent in the presence of an alkaline metal such as Li, K, or Na or an alkali earth metal such as Ca or Mg at room temperature or under cooling or heating as necessary.

The organic solvent used in the reaction in step α is not particularly limited. Examples of the organic solvent include ethers such as diethyl ether, dibutyl ether, tetrahydrofuran, 1,4-dioxane, and cyclopentylmethyl ether; hydrocarbons such as benzene, toluene, xylene, mesitylene, hexane, heptane, octane, and isooctane; and the like. These can be used alone or in mixture of two or more thereof.

The reaction method includes: a method in which the starting material (0-1) and an alkaline metal or alkali earth metal as the catalyst are charged at once; a method in which the starting material (0-1) is dispersed or dissolved, and then the catalyst is introduced at once; and a method in which after the catalyst is dispersed, the starting material (0-1) is added at once or divided and added thereto, or the starting material (0-1) diluted with a solvent is added dropwise to the catalyst. After completion of the reaction, the resultant may be diluted with an organic solvent, then subjected to liquid separation and washing to remove the catalyst used in the reaction, and thus the target polyol compound (0-3) can be collected.

The organic solvent used to remove the catalyst in step α is not particularly limited, as long as the organic solvent is capable of dissolving the target polyol compound (0-3) and being separated into two layers when mixed with water. Examples of the organic solvent include hydrocarbons such as hexane, heptane, benzene, toluene, and xylene; esters such as ethyl acetate, n-butyl acetate, and propylene glycol methyl ether acetate; ketones such as methyl ethyl ketone, methyl amyl ketone, cyclohexanone, and methyl isobutyl ketone; ethers such as diethyl ether, diisopropyl ether, methyl-t-butyl ether, and ethylcyclopentylmethyl ether; chlorinated solvents such as methylene chloride, chloroform, dichloroethane, and trichloroethylene; mixtures thereof; and the like.

As water used for washing in step α, generally, what is called deionized water or ultrapure water may be used. The washing may be performed once or more, preferably approximately once to five times because washing ten times or more does not always produce the full washing effects thereof.

In the liquid separation and washing, the washing may be performed with an acidic aqueous solution to remove the catalyst in the system. The acid is not particularly limited. Examples thereof include inorganic acids such as hydrochloric acid, hydrobromic acid, sulfuric acid, nitric acid, phosphoric acid, and heteropoly acid; organic acids such as oxalic acid, trifluoroacetic acid, methanesulfonic acid, benzenesulfonic acid, p-toluenesulfonic acid, and trifluoromethanesulfonic acid; and the like.

After the liquid separation and washing with the acidic aqueous solution, washing with neutral water may be successively performed. As the neutral water, deionized water, ultrapure water, or the like as mentioned above may be used. The washing may be performed once or more, but the number of washing may not be sufficient and the acidic components cannot be removed in some cases. Meanwhile, since washing ten times or more does not always produce the full washing effects thereof, the washing is performed preferably approximately once to five times, more preferably twice to five times.

Further, the reaction product after the liquid separation operation can also be collected as a powder by concentrating and drying the solvent or crystallizing the reaction product under reduced pressure or normal pressure. Alternatively, the reaction product can be retained in the state of solution with an appropriate concentration to improve the workability in the subsequent step.

(Step β: Production of Spiro Ketone Compound (0-4))

The polyol compound (0-3) is treated with an acid to rearrange the aromatic rings, so that a spiro ketone compound (0-4) is produced.

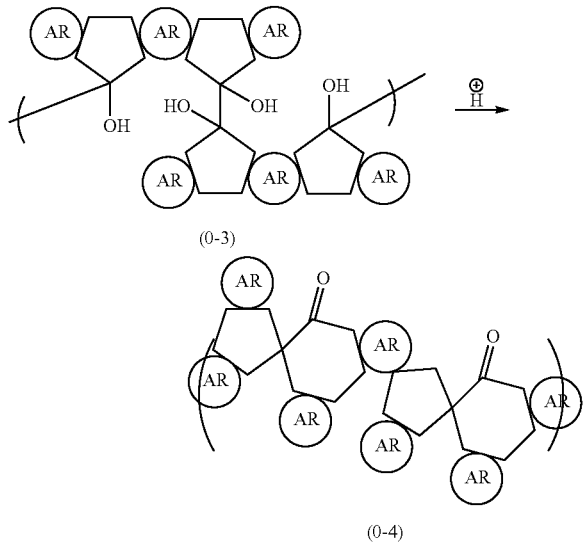

The spiro ketone compound (0-4) can be produced from the polyol compound (0-3) produced in step α.

The spiro ketone compound (0-4) can be obtained generally in an organic solvent in the presence of an acid catalyst at room temperature or under cooling or heating as necessary. The acid catalyst used in step β is not particularly limited. Examples thereof include inorganic acids such as hydrochloric acid, hydrobromic acid, sulfuric acid, nitric acid, phosphoric acid, and heteropoly acid; organic acids such as oxalic acid, trifluoroacetic acid, methanesulfonic acid, benzenesulfonic acid, p-toluenesulfonic acid, and trifluoromethanesulfonic acid; Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium(IV) methoxide, titanium (IV) ethoxide, titanium(IV) isopropoxide, and titanium(IV) oxide; and the like.

The organic solvent used in the reaction in step β is not particularly limited. Examples of the organic solvent include alcohols such as methanol, ethanol, isopropyl alcohol, butanol, ethylene glycol, propylene glycol, diethylene glycol, glycerol, ethylene glycol monomethyl ether, and propylene glycol monomethyl ether; ethers such as diethyl ether, dibutyl ether, diethylene glycoldiethyl ether, diethylene glycol dimethyl ether, tetrahydrofuran, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; and non-protic polar solvents such as dimethylsulfoxide, N,N-dimethylformamide, and hexamethylphosphoric triamide. These can be used alone or in mixture of two or more thereof.

The reaction method includes: a method in which the polyol compound (0-3) and the acid catalyst are charged at once; a method in which the polyol compound (0-3) is dispersed or dissolved, and then the acid catalyst is added at once or divided and added thereto; a method in which the polyol compound (0-3) is diluted with an solvent and added dropwise to the acid catalyst; a method in which after the acid catalyst is dispersed or dissolved, the polyol compound (0-3) is added at once or divided and added thereto; and a method in which the polyol compound (0-3) diluted with an organic solvent is added dropwise to the acid catalyst. After completion of the reaction, the resultant may be diluted with an organic solvent, then subjected to liquid separation and washing to remove the acid catalyst used in the reaction, and thus the target spiro ketone compound (0-4) can be collected.

The organic solvent used to remove the catalyst in step β is not particularly limited, as long as the organic solvent is capable of dissolving the target spiro ketone compound (0-4) and being separated into two layers when mixed with water. It is possible to use organic solvents exemplified as the organic solvents used to remove the catalyst in step α.

As water used for washing in step β, generally, what is called deionized water or ultrapure water may be used. The washing may be performed once or more, preferably approximately once to five times because washing ten times or more does not always produce the full washing effects thereof.

Further, the reaction product after the liquid separation operation can also be collected as a powder by concentrating and drying the solvent or crystallizing the reaction product under reduced pressure or normal pressure. Alternatively, the reaction product can be retained in the state of solution with an appropriate concentration to improve the workability in the subsequent step.

(Step β': Another Method for Producing Spiro Ketone Compound (0-4))

As another method for producing the spiro ketone compound (0-4), the starting material (0-1) of a compound containing at least two five-membered ring ketones each condensed with two aromatic rings in one molecule is reacted with a phosphorous acid compound as follows, so that the spiro ketone compound (0-4) can also be produced directly.

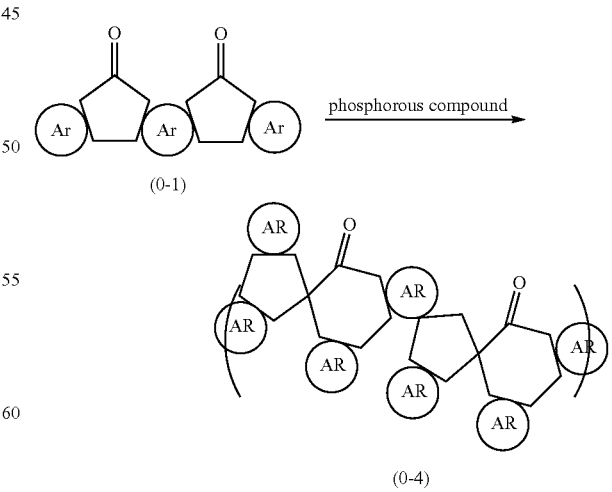

As shown above, the spiro ketone compound (0-4) can also be produced from the starting material (0-1) in a single step.

In this case, the spiro ketone compound (0-4) can be obtained by heating for the reaction in the presence of the phosphorous acid compound. The phosphorous acid compound used in this event is not particularly limited. Examples thereof include such compounds as triphenyl phosphite, triethyl phosphite, tris(2-ethylhexyl)phosphite, tridecyl phosphite, trilauryl phosphite, tris(tridecyl)phosphite, trioleyl phosphite diphenyl mono(2-ethylhexyl)phosphite, diphenyl monodecyl phosphite, and diphenyl mono (tridecyl)phosphite. These can be used alone or in combination.

As the reaction method, employed is a method in which the starting material (0-1) and the phosphorous acid compound are mixed and heated. As in the case of the spiro alcohol compound (0-3), after completion of the reaction, the resultant is subjected to liquid separation and washing to collect the target spiro ketone compound (0-4), too. Alternatively, the reaction solution may be subjected to crystallization in a poor solvent to collect the target spiro ketone compound (0-4).

(Step γ: Production of Spiro Alcohol Compound (1-0))

The spiro ketone compound (0-4) is reduced to produce a spire alcohol compound (1-0).

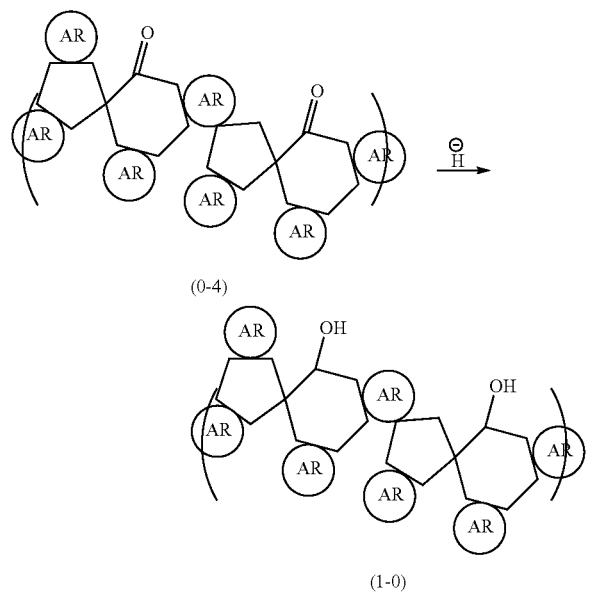

The spiro alcohol compound (1-0) can be produced from the spiro ketone compound (0-4) produced in step β or step β'.

The spiro alcohol compound (1-0) can be obtained generally in an organic solvent in the presence of a reducing agent at room temperature or under cooling or heating as necessary.

The reducing agent used in step γ is not particularly limited. It is possible to use, for example, metal hydrides such as lithium aluminum hydride and sodium borohydride.

The organic solvent used in the reaction in step γ is not particularly limited. Examples of the organic solvent include alcohols such as methanol, ethanol, isopropyl alcohol, and butanol; ethers such as diethyl ether, dibutyl ether, tetrahydrofuran, 1,4-dioxane, and cyclopentylmethyl ether; and hydrocarbons such as benzene, toluene, xylene, mesitylene, hexane, heptane, octane, and isooctane. These can be used alone or in mixture of two or more thereof.

The reaction method includes: a method in which the spiro ketone compound (0-4) and the reducing agent are charged at once; a method in which the spiro ketone compound (0-4) is dispersed or dissolved, and then the reducing agent is added at once or divided and added thereto; a method in which the spiro ketone compound (0-4) is diluted with an organic solvent and added dropwise to the reducing agent; a method in which after the reducing agent is dispersed or dissolved, the spiro ketone compound (0-4) is added at once or divided and added thereto; and a method in which the spiro ketone compound (0-4) diluted with an organic solvent is added dropwise to the reducing agent. After completion of the reaction, the resultant may be diluted with an organic solvent, then subjected to liquid separation and washing to remove the reducing agent used in the reaction, and thus the target spiro alcohol compound (1-0) can be collected.

The organic solvent used to remove the reducing agent in step γ is not particularly limited, as long as the organic solvent is capable of dissolving the target spiro alcohol compound (1-0) and being separated into two layers when mixed with water. It is possible to use solvents exemplified as the organic solvents used to remove the catalyst in step α.

As water used for washing in step γ, generally, what is called deionized water or ultrapure water may be used. The washing may be performed once or more, preferably approximately once to five times because washing ten times or more does not always produce the full washing effects thereof.

Moreover, in the liquid separation and washing, the washing may be performed with a basic aqueous solution to remove acidic components in the system. The base contained in the basic aqueous solution used in this event is not particularly limited. Examples of the base include hydroxides of alkaline metals, carbonates of alkaline metals, hydroxides of alkali earth metals, carbonates of alkali earth metals, ammonia, organic ammonium, and the like.

Further, in the liquid separation and washing, the washing may be performed with an acidic aqueous solution to remove metal impurities or basic components in the system. The acid contained in the acidic aqueous solution used in this event is not particularly limited. Examples of the acid include inorganic acids such as hydrochloric acid, hydrobromic acid, sulfuric acid, nitric acid, phosphoric acid, and heteropoly acid; organic acids such as oxalic acid, trifluoroacetic acid, methanesulfonic acid, benzenesulfonic acid, p-toluenesulfonic acid, and trifluoromethanesulfonic acid; and the like.

In step γ, the liquid separation and washing may be performed with one or a combination of the basic aqueous solution and the acidic aqueous solution. When the liquid separation and washing is performed with the combination, the basic aqueous solution and the acidic aqueous solution are preferably used in this order from the viewpoint of removing the metal impurities.

After the liquid separation and washing with the basic aqueous solution and the acidic aqueous solution in step γ, washing with neutral water may be successively performed. As the neutral water, deionized water, ultrapure water, or the like as mentioned above may be used. The washing may be performed once or more, preferably approximately once to five times in order to reliably remove the basic components and the acidic components and because washing ten times or more does not always produce the full washing effects thereof.

Further, the reaction product after the liquid separation operation can also be collected as a powder by concentrating and drying the solvent or crystallizing the reaction product under reduced pressure or normal pressure. Alternatively, the reaction product can be retained in the state of solution with an appropriate concentration to improve the workability in preparing an organic film composition. The concentration in this event is preferably 0.1 to 50 mass %, more preferably 0.5 to 30 mass %. When the concentration is within this range, the viscosity is hardly increased, making it possible to prevent deterioration of the workability; in addition, since the amount of the solvent is not excessive, the solution can be prepared economically.

The solvent used for the crystallization in step γ is not particularly limited, as long as the solvent is capable of dissolving the spiro alcohol compound (1-0). Examples of the solvent include ketones such as cyclohexanone and methyl-2-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxy propionate, tert-butyl acetate, tert-butyl propionate, and propylene glycol mono-tert-butyl ether acetate. These can be used alone or in mixture of two or more thereof.

The spiro alcohol compound (1-0) obtained in step γ may be adopted as the inventive resin for forming an organic film (in the formula (1-1), X=a hydroxyl group), or this hydroxyl group may be substituted with another substituent. The inventive resin for forming an organic film is capable of forming a naphthalene ring-containing compound to which aromatic rings of four ARs are condensed and bonded by any of heating, an acid, or actions of the two. Specifically, in the inventive resin for forming an organic film, a structure shown by (1') becomes a naphthalene ring-containing structure (2) by heating a substrate to be processed coated with the inventive resin. Since the main chain of a repeating unit of the naphthalene ring-containing structure (2) is formed only of aromatic rings, a coating film having high etching resistance can be formed on the substrate.

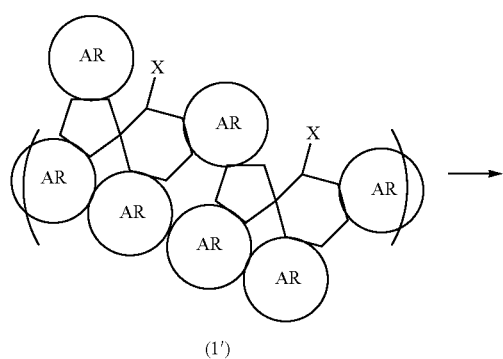

(1')

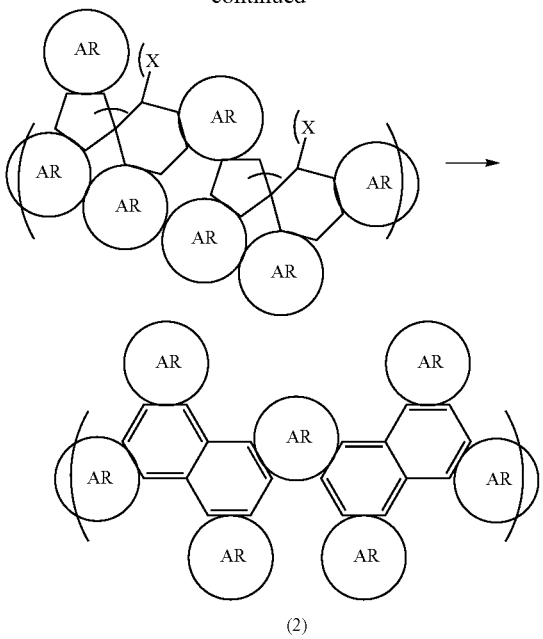

(2)

Note that the above structure shown by (1') merely shows an example for the description and is not to limit the inventive structure. The present invention may further include another repeating unit, besides (1').

<Composition for Forming Organic Film>

The inventive composition for forming an organic film contains:

(I) the above-described resin having a structure shown by the general formula (1) in which the ring structure AR containing an aromatic ring and the spiro structure SP bonded to four of the ARs are alternately repeated in at least a portion of a repeating unit; and (II) an organic solvent.

The inventive composition for forming an organic film can be further blended with another compound or polymer, too. The blend compound or blend polymer, when mixed with the inventive composition for forming an organic film, serves to enhance the film forming property by spin coating and the filling property for a stepped substrate.

Such materials are not particularly limited. Examples thereof include novolak resins of phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-tert-butylphenol, 3-tert-butylphenol, 4-tert-butylphenol, 2-phenylphenol, 3-phenylphenol, 4-phenylphenol, 3,5-diphenyl phenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-tert-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-tert-butyl-5-methylphenol, pyrogallol, thymol, isothymol, 4,4'-(9H-fluorene-9-ylidene)bisphenol, 2,2'dimethyl-4,4'-(9H-fluorene-9-ylidene)bisphenol, 2,2'diallyl-4,4'-(9H-fluorene-9-ylidene)bisphenol, 2,2'difluoro-4,4'-(9H-fluorene-9-ylidene) bisphenol, 2,2'diphenyl-4,4'-(9H-fluorene-9-ylidene) bisphenol, 2,2'dimethoxy-4,4'-(9H-fluorene-9-ylidene) bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1-naphthol, 2-naphthol, 2-methyl-1-naphthol, 4-methoxy-1-naphthol, and 7-methoxy-2-naphthol, dihydroxynaphthalene such as 1,5-dihydroxynaphthalene, 1,7-dihydroxynaphthalene, and 2,6-dihydroxynaphthalene, methyl 3-hydroxynaphthalene-2-carboxylate, indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborna-2-ene, α-pinene, β-pinene, or limonene, and copolymers thereof; polyhydroxystyrene, polystyrene, polyvinylnaphthalene, polyvinylanthracene, polyvinylcarbazole, polyindene, polyacenaphthylene, polynorbornene, polycyclodecene, polytetracyclododecene, polynortricyclene, and poly(meth)acrylate. In addition, it is also possible to blend a naphthol dicyclopentadiene copolymer disclosed in Japanese Patent Laid-Open Publication No. 2004-205685, a fluorene bisphenol novolak resin disclosed in Japanese Patent Laid-Open Publication No. 2005-128509, an acenaphthylene copolymer disclosed in Japanese Patent Laid-Open Publication No. 2005-250434, fullerene having a phenolic group disclosed in Japanese Patent Laid-Open Publication No. 2006-227391, a bisphenol compound and a novolak resin thereof disclosed in Japanese Patent Laid-Open Publication No. 2006-293298, a novolak resin of an adamantane phenol compound disclosed in Japanese Patent Laid-Open Publication No. 2006-285095, a bisnaphtho compound and a novolak resin thereof disclosed in Japanese Patent Laid-Open Publication No. 2010-122656, a fullerene resin compound disclosed in Japanese Patent Laid-Open Publication No. 2008-158002, or the like. The formulation amount of the blend compound or blend polymer is preferably 0 to 1,000 parts by mass, more preferably 0 to 500 parts by mass, based on 100 parts by mass of the inventive resin for forming an organic film.

To the inventive composition for forming an organic film, an acid generator is preferably added so as to further promote the aromatic ring formation reaction of the spiro alcohol compound. The acid generator includes a material that generates an acid by thermal decomposition, and a material that generates an acid by light irradiation. Any acid generator can be added. Specifically, materials disclosed in paragraphs (0061) to (0085) of Japanese Patent Laid-Open Publication No. 2007-199653 can be added.

The organic solvent usable in the inventive composition for forming an organic film is not particularly limited, as long as the organic solvent is capable of dissolving, for example, the inventive resin for forming an organic film, the acid generator, a crosslinking agent, and other additives to be described later. For example, a solvent having a boiling point of lower than 180° C., such as solvents disclosed in paragraphs (0091) to (0092) of Japanese Patent Laid-Open Publication No. 2007-199653, can be used. Above all, it is preferable to use propylene glycol monomethyl ether acetate, propylene glycol monomethyl ether, 2-heptanone, cyclopentanone, cyclohexanone, and a mixture of two or more thereof.

Moreover, the inventive composition for forming an organic film may use the organic solvent in which a high-boiling-point solvent having a boiling point of 180° C. or higher is added to the aforementioned solvent having a boiling point of lower than 180° C. (a mixture of the solvent having a boiling point of lower than 180° C. with the solvent having a boiling point of 180° C. or higher). The high-boiling-point organic solvent is not particularly limited to hydrocarbons, alcohols, ketones, esters, ethers, chlorinated solvents, and so forth, as long as the high-boiling-point organic solvent is capable of dissolving the resin for forming an organic film. Examples of the high-boiling-point organic solvent include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, n-nonyl acetate, ethylene glycol monohexyl ether, ethylene glycol mono-2-ethylhexyl ether, ethylene glycol monophenyl ether, ethylene glycol monobenzyl ether, diethylene glycol monoethyl ether, diethylene glycol monoisopropyl ether, diethylene glycol mono-n-butyl ether, diethylene glycol monoisobutyl ether, diethylene glycol monohexyl ether, diethylene glycol monophenyl ether, diethylene glycol monobenzyl ether, diethylene glycol diethyl ether, diethylene glycol dibutyl ether, diethylene glycol butylmethyl ether, triethylene glycol dimethyl ether, triethylene glycol monomethyl ether, triethylene glycol-n-butyl ether, triethylene glycol butylmethyl ether, triethylene glycol diacetate, tetraethylene glycol dimethyl ether, dipropylene glycol monomethyl ether, dipropylene glycol mono-n-propyl ether, dipropylene glycol mono-n-butyl ether, tripropylene glycol dimethyl ether, tripropylene glycol monomethyl ether, tripropylene glycol mono-n-propyl ether, tripropylene glycol mono-n-butyl ether, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, triacetin, propylene glycol diacetate, dipropylene glycol methyl-n-propyl ether, dipropylene glycol methyl ether acetate, 1,4-butanediol diacetate, 1,3-butylene glycol diacetate, 1,6-hexanediol diacetate, γ-butyrolactone, and the like. These may be used alone or in mixture.

The boiling point of the high-boiling-point solvent may be appropriately selected according to the temperature at which the composition for forming an organic film is heated. The boiling point of the high-boiling-point solvent to be added is preferably 180° C. to 300° C., more preferably 200° C. to 300° C. The boiling point of 180° C. or higher prevents the evaporation rate at baking (heating) from becoming excessive, which would otherwise occur if the boiling point is too low. Thus, the boiling point of 180° C. or higher can provide sufficient thermal flowability. Meanwhile, when the boiling point is 300° C. or lower, the boiling point is not too high, so that the high-boiling-point solvent evaporates after baking and does not remain in the film; thus, the boiling point of 300° C. or lower does not affect the film physical properties such as etching resistance.

When the high-boiling-point solvent is used, the formulation amount of the high-boiling-point solvent is preferably 1 to 30 parts by mass based on 100 parts by mass of the solvent having a boiling point of lower than 180° C. The formulation amount in this range prevents a failure in providing sufficient thermal flowability during baking, which would otherwise occur if the formulation amount is too small. In addition, deterioration of the film physical properties such as etching resistance is prevented, which would otherwise occur if the formulation amount is so large that the solvent remains in the film.

As described above, providing the resin for forming an organic film with thermal flowability by adding the highboiling-point solvent makes the composition for forming an organic film have both of higher filling and planarizing properties.

To enhance coating property by spin coating during the patterning process, a surfactant can also be added to the inventive composition for forming an organic film. The surfactant is not particularly limited. For example, those disclosed in paragraphs (0165) to (0166) of Japanese Patent Laid-Open Publication No. 2008-111103 can be used. Specifically, R-40, R-41, R-43, and the like manufactured by DIC, FC-4430, FC-4432, and the like manufactured by 3M, and PF-636, PF-6320, PF-656, PF-6520, PF-652-NF, and the like manufactured by OMNOVA can be preferably used because these are easy to obtain.

Besides, to the inventive composition for forming an organic film, another additive may be added so as to further enhance filling and planarizing properties.

The additive is not particularly limited, as long as filling and planarizing properties are provided. Examples of the additive include liquid additives having polyethylene glycol and polypropylene glycol structures. In addition, it is preferable to use thermo-decomposable polymers having a weight loss ratio between 30° C. and 250° C. of 40 mass % or more and a weight average molecular weight of 300 to 200,000. The thereto-decomposable polymers include ones containing a repeating unit having an acetal structure shown by the following general formula (DP1) or (DP1a), and the like.

(DP1)

(where $R_6$ represents a hydrogen atom or a saturated or unsaturated monovalent organic group having 1 to 30 carbon atoms which may be substituted. Y represents a saturated or unsaturated divalent organic group having 2 to 30 carbon atoms.)

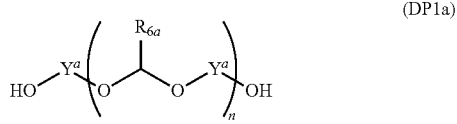
(DP1a)

(where $R_{6a}$ represents an alkyl group having 1 to 4 carbon atoms. $Y^a$ represents a saturated or unsaturated divalent hydrocarbon group having 4 to 10 carbon atoms which may have an ether bond. n represents an average repeating unit number of 3 to 500.)

Note that the inventive composition for forming an organic film can be used alone, or two or more kinds thereof can be used in combination. The composition for forming an organic film can be used as a resist underlayer film composition or a planarizing material for manufacturing a semiconductor apparatus.

Moreover, the inventive composition for forming an organic film is quite useful as a resist underlayer film composition for multilayer resist processes such as a 2-layer resist process, a 3-layer resist process using a silicon-containing middle layer film, and a 4-layer resist process using a silicon-containing inorganic hard mask middle layer film and an organic antireflective film.

<Patterning Processes>

[3-Layer Resist Process Using Silicon-Containing Resist Underlayer Film]

The present invention provides a patterning process including:

forming an organic film on a body to be processed from the above-described inventive composition for forming an organic film;

forming a resist underlayer film on the organic film from a resist underlayer film composition containing silicon atoms;

forming a resist upper layer film on the resist underlayer film from a resist upper layer film composition composed of a photoresist composition;

forming a circuit pattern in the resist upper layer film;

transferring the pattern to the resist underlayer film by etching using the resist upper layer film having the formed circuit pattern as a mask;

transferring the pattern to the organic film by etching using the resist underlayer film having the transferred pattern as a mask; and further transferring the pattern to the body to be processed by etching using the organic film having the transferred pattern as a mask.

As the body to be processed, it is preferable to use a semiconductor apparatus substrate or the semiconductor apparatus substrate coated with any of a metal film, a metal carbide film, a metal oxide film, a metal nitride film, a metal oxycarbide film, and a metal oxynitride film. More specifically, examples of the body which may be used include, but are not particularly limited to: substrates made of Si, α-Si, p-Si, SiO$_2$, SiN, SiON, W, TiN, Al, or the like; and these substrates coated with the above-described metal film or the like as a layer to be processed.

As the layer to be processed, used are various Low-k films made of Si, SiO$_2$, SiON, SiN, p-Si α-Si, W, W—Si, Al, Cu, Al—Si, or the like, and stopper films thereof. The layer can be formed to have a thickness of generally 50 to 10,000 nm, particularly 100 to 5,000 nm. Note that when the layer to be processed is formed, the substrate and the layer to be processed are formed from different materials.

Note that the metal of the body to be processed is preferably silicon, titanium, tungsten, hafnium, zirconium, chromium, germanium, copper, silver, gold, aluminum, indium, gallium, arsenic, palladium, iron, tantalum, iridium, molybdenum, or an alloy thereof.

Moreover, as the body to be processed, it is preferable to use a substrate to be processed having a structure or a step with a height of 30 nm or more.

The method for forming the organic film on the body to be processed from the inventive composition for forming an organic film is not particularly limited, and conventional methods can be employed.

For example, as in the case of photoresists, the substrate to be processed is coated with the inventive composition for forming an organic film by a spin coating method or the like. By employing the spin coating method or the like, favorable filling property can be obtained. After the spin coating, baking is performed to evaporate the solvent and promote the crosslinking reaction, thereby preventing the resist upper layer film and the resist middle layer film from mixing. The baking is performed at preferably 100° C. to 600° C. both inclusive for 10 to 600 seconds, more preferably 200° C. to 500° C. both inclusive for 10 to 300 seconds. The baking temperature is further preferably 150° C. to 500° C. both inclusive, particularly preferably 180° C. to 400° C. both inclusive. Considering the influences on device damage and wafer deformation, the upper limit of the heating temperature in a wafer process of lithography is preferably 600° C., more preferably 500° C.

Another example of the method for forming the organic film includes a method in which after coating the substrate to be processed with the inventive composition for forming an organic film by a spin coating method or the like, curing the composition for forming an organic film by baking in an atmosphere with an oxygen concentration of 0.1% to 21% both inclusive.

Baking the inventive composition for forming an organic film in the oxygen atmosphere with such a concentration range is preferable because a sufficiently cured film can be obtained. The baking atmosphere may be an air atmosphere, but is preferably filled with an inert gas such as $N_2$, Ar, or He to decrease the oxygen amount because the organic film is prevented from oxidation. To prevent the oxidation, it is preferable to control the oxygen concentration. The oxygen concentration is preferably 1000 ppm or less, more preferably 100 ppm or less. It is preferable to prevent the organic film from oxidation during baking because an increase in absorption and a decrease in etching resistance are prevented.

The inventive composition for forming an organic film can be suitably used when the organic film is formed on a substrate to be processed having a structure or a step with a height of 30 nm or more. As described above, since the inventive composition for forming an organic film is excellent in filling and planarizing properties, even when the substrate to be processed has a structure or a step (asperity) with a height of 30 nm or more, a flat cured film can be formed.

Note that the thickness of the organic film to be formed is appropriately selected, but is preferably 30 to 20,000 nm, particularly preferably 50 to 15,000 nm.

Next, using a resist underlayer film composition containing silicon atoms, a resist underlayer film (silicon-containing resist underlayer film) is formed on the organic film. The resist underlayer film composition containing silicon atoms is preferably a polysiloxane-based underlayer film composition. The silicon-containing resist underlayer film having antireflective effect can suppress the reflection. Particularly, for 193-nm light exposure, a composition containing many aromatic groups and having a high etching selectivity relative to the substrate is used as a composition for forming an organic film, so that the k-value and thus the substrate reflection are increased; in contrast, the reflection can be suppressed by imparting absorption to the silicon-containing resist underlayer film so as to have an appropriate k-value, and the substrate reflection can be reduced to 0.5% or less. As the silicon-containing resist underlayer film having antireflective effect, a polysiloxane is preferably used which has a pendant structure of anthracene for 248-nm and 157-nm light exposure, or a phenyl group or a light-absorbing group having a silicon-silicon bond for 193-nm light exposure, and which is crosslinked by an acid or heat.

Next, using a resist upper layer film composition composed of a photoresist composition, a resist upper layer film is formed on the resist underlayer film. The resist upper layer film composition may be a positive type or a negative type, and any generally-used photoresist composition can be used. After the spin coating of the resist upper layer film composition, pre-baking is preferably performed within ranges of 60 to 180° C. and 10 to 300 seconds. Then, light exposure, post-exposure bake (PEB), and development are performed according to conventional methods to obtain a resist upper layer film pattern. Note that the thickness of the resist upper layer film is not particularly limited, but is preferably 30 to 500 nm, particularly preferably 50 to 400 nm.

Next, a circuit pattern (the resist upper layer film pattern) is formed in the resist upper layer film. The circuit pattern is preferably formed by a lithography using light with a wavelength ranging from 10 nm to 300 nm, a direct drawing by electron beam, a nanoimprinting, or a combination thereof.

Note that the exposure light includes high energy beam with a wavelength of 300 nm or less; specifically, deep ultraviolet ray, KrF excimer laser beam (248 nm), ArF excimer laser beam (193 nm), $F_2$ laser beam (157 nm), $Kr_2$ laser beam (146 nm), $Ar_2$ laser beam (126 nm), soft X-ray (EUV) with a wavelength of 3 to 20 nm, electron beam (EB), ion beam, X-ray, and the like.

Additionally, in forming the circuit pattern, the circuit pattern is preferably developed by alkaline development or development with an organic solvent.

Next, using the resist upper layer film having the formed circuit pattern as a mask, the pattern is transferred to the resist underlayer film by etching. The etching of the resist underlayer film using the resist upper layer film pattern as a mask is preferably performed with a fluorocarbon based gas. Thereby, a silicon-containing resist underlayer film pattern is formed.

Next, using the resist underlayer film having the transferred pattern as a mask, the pattern is transferred to the organic film by etching. Since the silicon-containing resist underlayer film exhibits etching resistance to an oxygen gas or a hydrogen gas, the etching of the organic film using the silicon-containing resist underlayer film pattern as a mask is preferably performed with an etching gas mainly containing an oxygen gas or a hydrogen gas. Thereby, an organic film pattern is formed.

Next, using the organic film having the transferred pattern as a mask, the pattern is transferred to the body to be processed by etching. The subsequent etching of the body to be processed (layer to be processed) can be performed according to a conventional method. For example, the body to be processed made of $SiO_2$, SiN, or silica low-dielectric insulating film is etched mainly with a fluorocarbon based gas. The body to be processed made of p-Si, Al, or W is etched mainly with a chlorine- or bromine-based gas. When the substrate is processed by etching with a fluorocarbon based gas, the silicon-containing resist underlayer film pattern is removed together with the substrate processing. Meanwhile, when the substrate is processed by etching with a chlorine- or bromine-based gas, the silicon-containing resist underlayer film pattern needs to be removed by additional dry etching with a fluorocarbon based gas after the substrate processing.

The organic film obtained from the inventive composition for forming an organic film can exhibit excellent etching resistance when the body to be processed is etched as described above.

[4-Layer Resist Process Using Silicon-Containing Resist Underlayer Film and Organic Antireflective Film]

Moreover, the present invention provides a patterning process including:

forming an organic film on a body to be processed from the above-described inventive composition for forming an organic film;

forming a resist underlayer film on the organic film from a resist underlayer film composition containing silicon atoms;

forming an organic antireflective film on the resist underlayer film;

forming a resist upper layer film on the organic antireflective film from a resist upper layer film composition composed of a photoresist composition;

forming a circuit pattern in the resist upper layer film;

transferring the pattern to the organic antireflective film and the resist underlayer film by etching using the resist upper layer film having the formed circuit pattern as a mask;

transferring the pattern to the organic film by etching using the resist underlayer film having the transferred pattern as a mask; and further transferring the pattern to the body to be processed by etching using the organic film having the transferred pattern as a mask.

Note that this method can be performed in the same manner as the above-described 3-layer resist process using the silicon-containing resist underlayer film, except that the organic antireflective film (BARC) is formed between the resist underlayer film and the resist upper layer film.

The organic antireflective film can be formed from a known organic antireflective film composition by spin coating.

[3-Layer Resist Process Using Inorganic Hard Mask]

Further, the present invention provides a patterning process according to a 3-layer resist process using the above-described inventive composition for forming an organic film, including:

forming an organic film on a body to be processed from the inventive composition for forming an organic film;

forming an inorganic hard mask selected from a silicon oxide film, a silicon nitride film, and a silicon oxynitride film on the organic film;

forming a resist upper layer film on the inorganic hard mask from a resist upper layer film composition composed of a photoresist composition;

forming a circuit pattern in the resist upper layer film;

transferring the pattern to the inorganic hard mask by etching using the resist upper layer film having the formed circuit pattern as a mask;

transferring the pattern to the organic film by etching using the inorganic hard mask having the transferred pattern as a mask; and further transferring the pattern to the body to be processed by etching using the organic film having the transferred pattern as a mask.

Note that this method can be performed in the same manner as the above-described 3-layer resist process using the silicon-containing resist underlayer film, except that the inorganic hard mask is formed in place of the resist underlayer film on the organic film.

The inorganic hard mask selected from a silicon oxide film, a silicon nitride film, and a silicon oxynitride film (SiON film) can be formed by a CVD method, an ALD method, or the like. The method for forming the silicon nitride film is disclosed in, for example, Japanese Patent Laid-Open Publication No. 2002-334869, International Publication No. WO2004/066377, and so forth. The film thickness of the inorganic hard mask is preferably 5 to 200 nm, more preferably 10 to 100 nm. As the inorganic hard mask, a SiON film is most preferably used which is effective as an antireflective film. When the SiON film is formed, the substrate temperature reaches 300 to 500° C. Hence, the underlayer film needs to withstand the temperature of 300 to 500° C. Since the organic film formed from the inventive composition for forming an organic film has high heat resistance and can withstand high temperatures of 300° C. to 500° C., this enables the combination of the inorganic hard mask formed by a CVD method or an ALD method with the organic film formed by a spin coating method.

[4-Layer Resist Process Using Inorganic Hard Mask and Organic Antireflective Film]

Furthermore, the present invention provides a patterning process according to a 4-layer resist process using the above-described inventive composition for forming an organic film, including:

forming an organic film on a body to be processed from the inventive composition for forming an organic film;

forming an inorganic hard mask selected from a silicon oxide film, a silicon nitride film, and a silicon oxynitride film on the organic film;

forming an organic antireflective film on the inorganic hard mask;

forming a resist upper layer film on the organic antireflective film from a resist upper layer film composition composed of a photoresist composition;

forming a circuit pattern in the resist upper layer film;

transferring the pattern to the organic antireflective film and the inorganic hard mask by etching using the resist upper layer film having the formed circuit pattern as a mask;

transferring the pattern to the organic film by etching using the inorganic hard mask having the transferred pattern as a mask; and further transferring the pattern to the body to be processed by etching using the organic film having the transferred pattern as a mask.

Note that this method can be performed in the same manner as the above-described 3-layer resist process using the inorganic hard mask, except that the organic antireflective film (BARC) is formed between the inorganic hard mask and the resist upper layer film.

Particularly, when the SiON film is used as the inorganic hard mask, two antireflective films including the SiON film and the BARC make it possible to suppress the reflection even in liquid immersion exposure at a high NA exceeding 1.0. Another merit of the BARC formation is having an effect of reducing footing of the resist upper layer film pattern immediately above the SiON film.

Herein, FIG. 1 (A) to (F) show an example of the inventive patterning process according to the 3-layer resist process. In the 3-layer resist process as shown in FIG. 1 (A), using the inventive composition for forming an organic film, an organic film 3 is formed on a layer to be processed 2 formed on a substrate 1. Then, a silicon-containing resist underlayer film 4 is formed on the organic film 3, and a resist upper layer film 5 is formed on the silicon-containing resist underlayer film 4. Subsequently, as shown in FIG. 1 (B), an exposed portion 6 of the resist upper layer film 5 is exposed to light, followed by PEB (post-exposure bake). Thereafter, as shown in FIG. 1 (C), a resist upper layer film pattern 5a is formed by development. After that, as shown in FIG. 1 (D), using the resist upper layer film pattern 5a as a mask, the silicon-containing resist underlayer film 4 is processed by dry etching with a fluorocarbon based gas. Thereby, a silicon-containing resist underlayer film pattern 4a is formed. Then, as shown in FIG. 1 (E), after the resist upper layer film pattern 5a is removed, the organic film 3 is etched with oxygen plasma using the silicon-containing resist underlayer film pattern 4a as a mask. Thereby, an organic film pattern 3a is formed. Further, as shown in FIG. 1 (F), after the silicon-containing resist underlayer film pattern 4a is removed, the layer to be processed 2 is processed by etching using the organic film pattern 3a as a mask. Thus, a pattern 2a is formed.

In the case where an inorganic hard mask is formed, the silicon-containing resist underlayer film 4 may be replaced with the inorganic hard mask. In the case where a BARC is formed, the BARC may be formed between the silicon-containing resist underlayer film 4 and the resist upper layer film 5. The BARC may be etched continuously and before the etching of the silicon-containing resist underlayer film 4. Alternatively, after the BARC is etched alone, the silicon-containing resist underlayer film 4 may be etched, for example, after an etching apparatus is changed.

As described above, the inventive patterning processes make it possible to precisely form a fine pattern in a body to be processed by the multilayer resist processes.

EXAMPLES

Hereinafter, the present invention will be specifically described by referring to Examples and Comparative Examples. However, the present invention is not limited to these descriptions.

In the following synthesis examples, ketone compounds (K-1) to (K-3) shown below were used as starting materials.

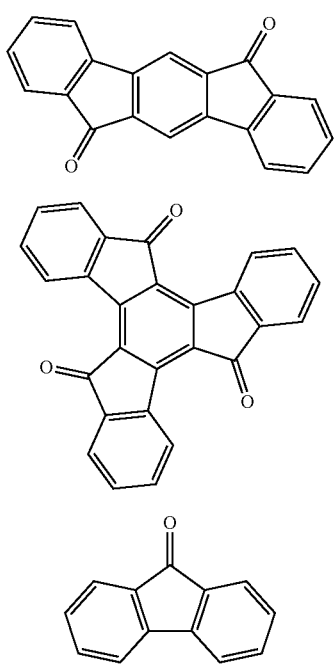

As the methods for measuring the molecular weight and dispersity of each polymer of Synthesis Examples described below, gel permeation chromatography (GPC) analysis was performed to measure the weight average molecular weight (Mw) and number average molecular weight (Mn) in terms of polystyrene. Then, the dispersity (Mw/Mn) was calculated therefrom.

Note that in a case where, for example, (K-1) is used to produce a spiro ketone (polyketone) compound, multiple structures which can serve as repeating units are conceivable as follows. For this reason, in the present invention, a structure shown at the upper left among the following structures is described, for convenience, as a representative structure of the repeating units of the polyketone compounds. In cases of using (K-2) and (K-3) also, multiple repeating unit structures may exist, so that one of them is similarly described as a representative structure. Further, spiro alcohol compounds derived from the polyketone compounds are also similarly described.

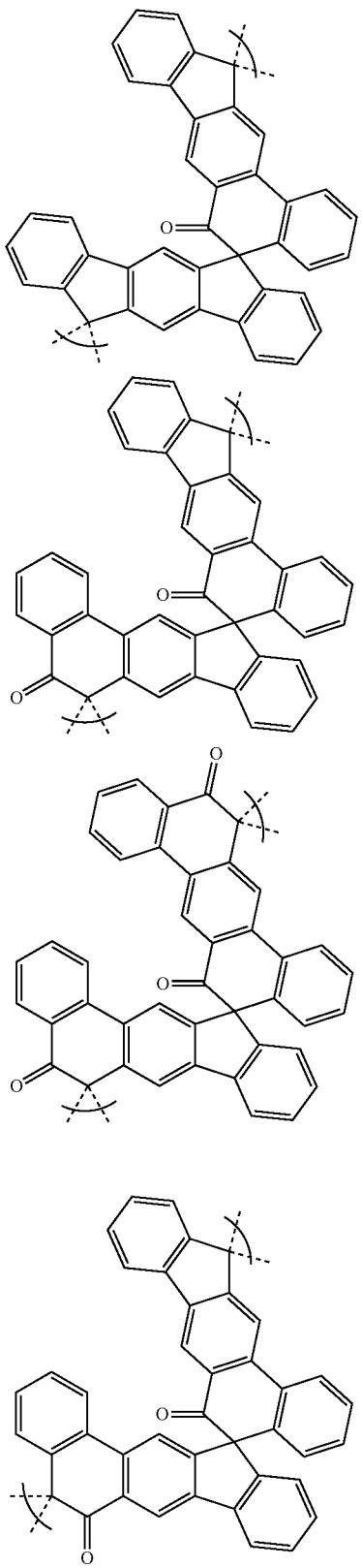

-continued

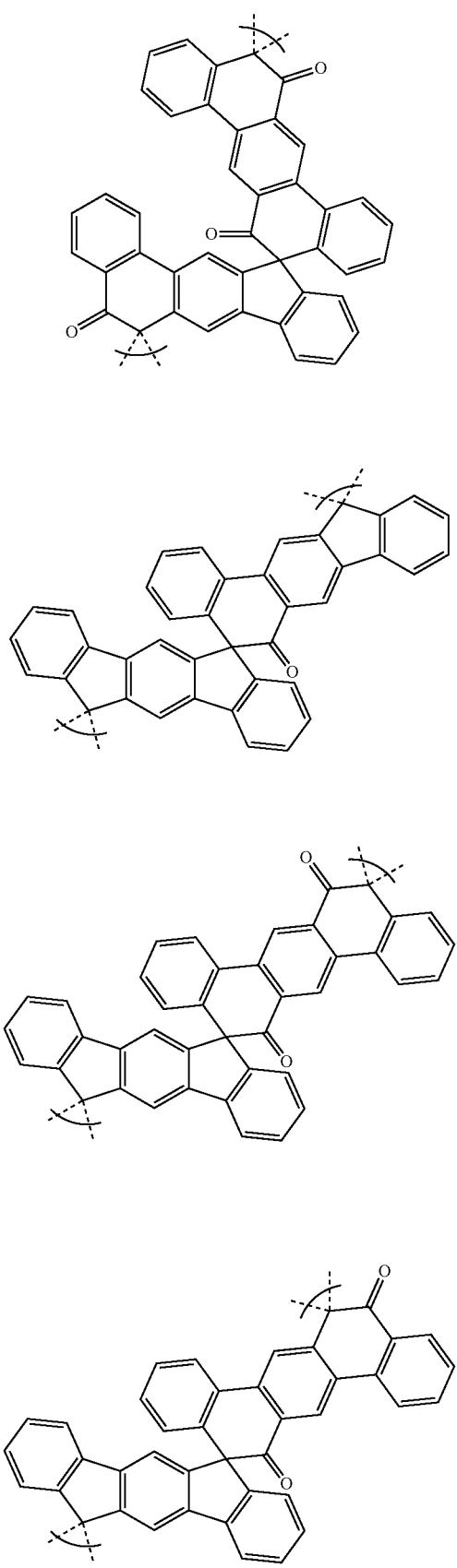

Synthesis Example 1: Synthesis of (A-1)

Synthesis Example 1-1: Synthesis of Polyol Compound (K'-1)

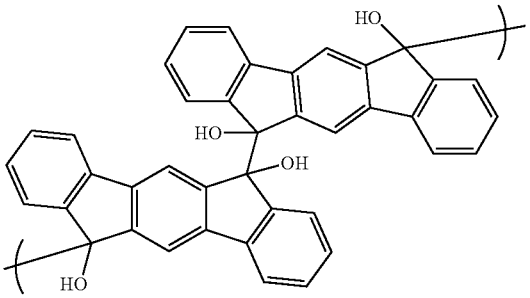

(K'-1)

Under a nitrogen atmosphere, a homogeneous dispersion was formed from 28.2 g of the ketone compound (K-1) with 200 g of tetrahydrofuran. Then, 5.3 g of magnesium (ground form) was added to the homogeneous dispersion and stirred at a liquid temperature of 50° C. for 12 hours. After cooling to room temperature, 300 g of methyl isobutyl ketone was added thereto, and the insoluble matter was separated by filtration. Subsequently, the resultant was washed twice with 100 g of a 2% hydrochloric acid aqueous solution and further washed five times with 100 g of pure water. The organic layer was evaporated under reduced pressure to dryness. Thus, 23.2 g of a polyol compound (K'-1) was obtained. GPC showed that the weight average molecular weight (Mw) and dispersity (Mw/Mn) were Mw=3800 and Mw/Mn=3.4504.

Synthesis Example 1-2: Synthesis of Polyketone Compound (K''-1)

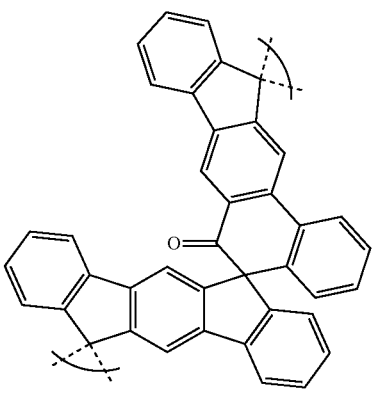

(K''-1)

Under a nitrogen atmosphere, a homogeneous dispersion was formed from 20 g of the polyol compound (K'-1) with 100 g of toluene. Then, 1.0 g of methanesulfonic acid was added to the homogeneous dispersion and stirred at a liquid temperature of 80° C. for 5 hours. After cooling to room temperature, 200 g of toluene was added thereto, and the insoluble matter was separated by filtration. The resultant was washed five times with 50 g of pure water. After confirmation that the aqueous layer became neutral, the organic layer was evaporated under reduced pressure to dryness. Thus, 18.5 g of a polyketone compound (K″-1) was obtained. GPC showed that the weight average molecular weight (Mw) and dispersity (Mw/Mn) were Mw=3700 and Mw/Mn=3.65.

Synthesis Examples 1-3: Production of Spiro Alcohol Compound (A-1)

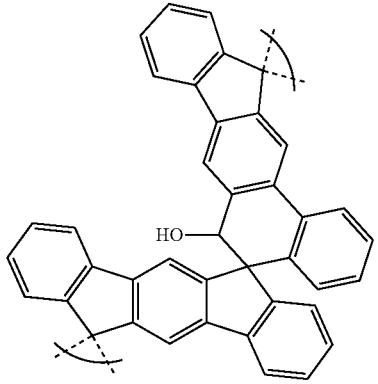

(A-1)

Under a nitrogen atmosphere, a homogeneous solution was formed from 15 g of the polyketone compound (K″-1) with 80 g of toluene and 20 g of methanol. Then, 2.0 g of sodium borohydride was added to the homogeneous solution and stirred at a liquid temperature of 40° C. for 3 hours. The reaction was stopped by adding 10 g of acetone, and the resultant was cooled to room temperature. After 200 g of methyl isobutyl ketone was added, the mixture was washed with 50 g of a 3% nitric acid aqueous solution and further washed five times with 50 g of pure water. The organic layer was evaporated under reduced pressure to dryness, and then dissolved in 50 g of tetrahydrofuran. Subsequently, the polymer was crystallized with 200 g of diisopropyl ether. The crystallized polymer was separated by filtration using a Hirsch funnel, washed twice with 100 g of diisopropyl ether, and vacuum dried at 60° C. Thus, 13.1 g of a spiro alcohol compound (A-1) was obtained. GPC showed that the weight average molecular weight (Mw) and dispersity (Mw/Mn) were Mw=4100 and Mw/Mn=3.20.

Synthesis Example 2: Synthesis of (A-2)

Synthesis Example 2-1: Synthesis of Polyketone Compound (K″-2)

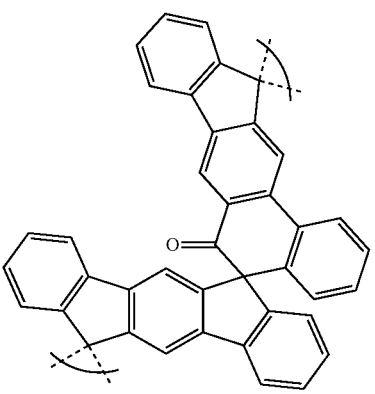

(K″-2)

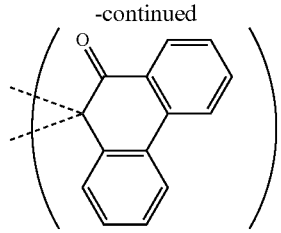

-continued

Under a nitrogen atmosphere, a homogeneous dispersion was formed from 14.1 g of the ketone compound (K-1) and 1.8 g of the ketone compound (K-3) by adding 200 g of triethyl phosphite. Then, the temperature was raised to the reflux temperature, and the reaction was allowed to proceed for 24 hours. The reaction solution was cooled to room temperature and added to 600 g of methanol to deposit the polymer. The deposited polymer was separated by filtration using a Hirsch funnel, washed twice with 200 g of methanol, and vacuum dried at 60° C. Thus, 12.3 g of a polyketone compound (K″-2) was obtained. GPC showed that the weight average molecular weight (Mw) and dispersity (Mw/Mn) were Mw=2300 and Mw/Mn=2.74.

Synthesis Example 2-2: Production of Spiro Alcohol Compound (A-2)

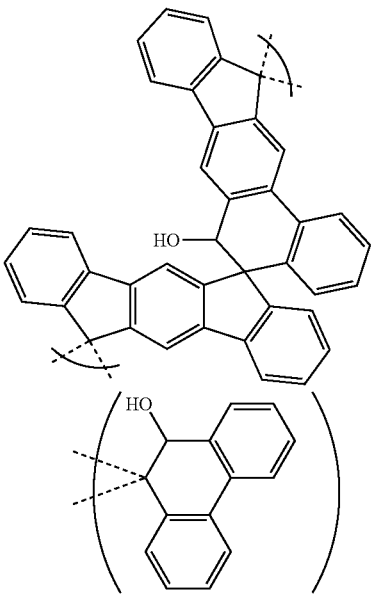

(A-2)

Under a nitrogen atmosphere, a homogeneous solution was formed from 12 g of the polyketone compound (K″-2) with 80 g of toluene and 20 g of methanol. Then, 2.0 g of sodium borohydride was added to the homogeneous solution and stirred at a liquid temperature of 40° C. for 3 hours. The reaction was stopped by adding 10 g of acetone, and the resultant was cooled to room temperature. After 200 g of methyl isobutyl ketone was added, the mixture was washed with 50 g of a 3% nitric acid aqueous solution and further washed five times with 50 g of pure water. The organic layer was evaporated under reduced pressure to dryness, and then dissolved in 50 g of tetrahydrofuran. Subsequently, the polymer was crystallized with 200 g of diisopropyl ether.

The crystallized polymer was separated by filtration using a Hirsch funnel, washed twice with 100 g of diisopropyl ether, and vacuum dried at 60° C. Thus, 10.4 g of a spiro alcohol compound (A-2) was obtained. GPC showed that the weight average molecular weight (Mw) and dispersity (Mw/Mn) were Mw=2600 and Mw/Mn=2.80.

Synthesis Example 3: Synthesis of (A-3)

Synthesis Example 3-1: Synthesis of Polyketone Compound (K″-3)

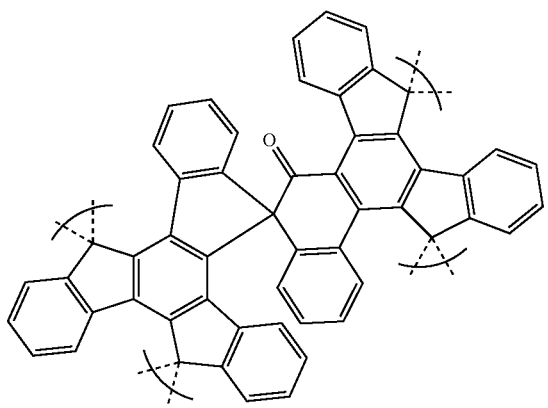

(K″-3)

Synthesis Example 3-2: Production of Spiro Alcohol Compound (A-3)

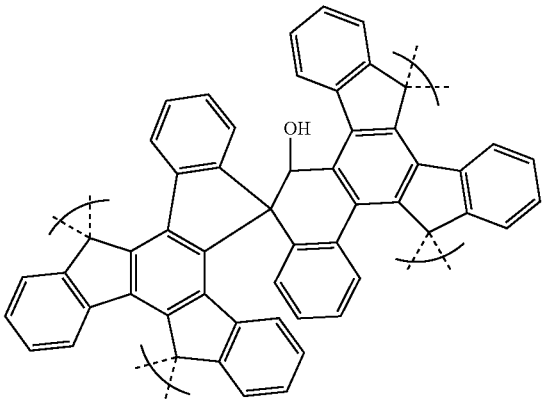

(A-3)

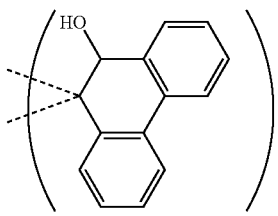

Under a nitrogen atmosphere, a homogeneous dispersion was formed from 19.2 g of the ketone compound (K-2) and 3.6 g of the ketone compound (K-3) by adding 325 g of triethyl phosphite. Then, the temperature was raised to the reflux temperature, and the reaction was allowed to proceed for 24 hours. The reaction solution was cooled to room temperature and added to 1200 g of methanol to deposit the polymer. The deposited polymer was separated by filtration using a Hirsch funnel, washed twice with 200 g of methanol, and vacuum dried at 60° C. Thus, 17.7 g of a polyketone compound (K″-3) was obtained. GPC showed that the weight average molecular weight (Mw) and dispersity (Mw/Mn) were Mw=4800 and Mw/Mn=3.47.

Under a nitrogen atmosphere, a homogeneous solution was formed from 15 g of the polyketone compound (K″-3) with 80 g of toluene and 20 g of methanol. Then, 2.0 g of sodium borohydride was added to the homogeneous solution and stirred at a liquid temperature of 40° C. for 3 hours. The reaction was stopped by adding 10 g of acetone, and the resultant was cooled to room temperature. After 200 g of methyl isobutyl ketone was added, the mixture was washed with 50 g of a 3% nitric acid aqueous solution and further washed five times with 50 g of pure water. The organic layer was evaporated under reduced pressure to dryness, and then dissolved in 50 g of tetrahydrofuran. Subsequently, the polymer was crystallized with 200 g of diisopropyl ether. The crystallized polymer was separated by filtration using a Hirsch funnel, washed twice with 100 g of diisopropyl ether, and vacuum dried at 60° C. Thus, 12.6 g of a spiro alcohol compound (A-3) was obtained. GPC showed that the weight average molecular weight (Mw) and dispersity (Mw/Mn) were Mw=5200 and Mw/Mn=3.10.

Synthesis Example 4: Synthesis of (A-4)

Synthesis Example 4-1: Synthesis of Polyketone Compound (K''-4)

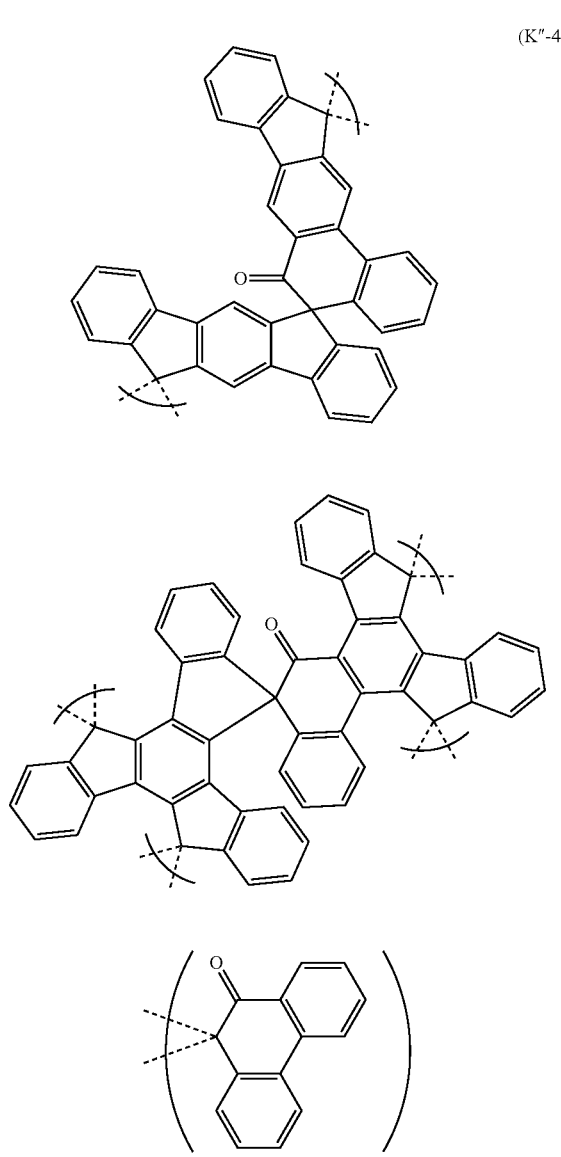

Under a nitrogen atmosphere, a homogeneous dispersion was formed from 16.9 g of the ketone compound (K-1), 7.7 g of the ketone compound (K-2), and 3.6 g of the ketone compound (K-3) by adding 332 g of triethyl phosphite. Then, the temperature was raised to the reflux temperature, and the reaction was allowed to proceed for 24 hours. The reaction solution was cooled to room temperature and added to 1200 g of methanol to deposit the polymer. The deposited polymer was separated by filtration using a Hirsch funnel, washed twice with 300 g of methanol, and vacuum dried at 60° C. Thus, 23.1 g of a polyketone compound (K''-4) was obtained. GPC showed that the weight average molecular weight (Mw) and dispersity (Mw/Mn) were Mw=3800 and Mw/Mn=2.98.

Synthesis Example 4-2: Production of Spiro Alcohol Compound (A-4)

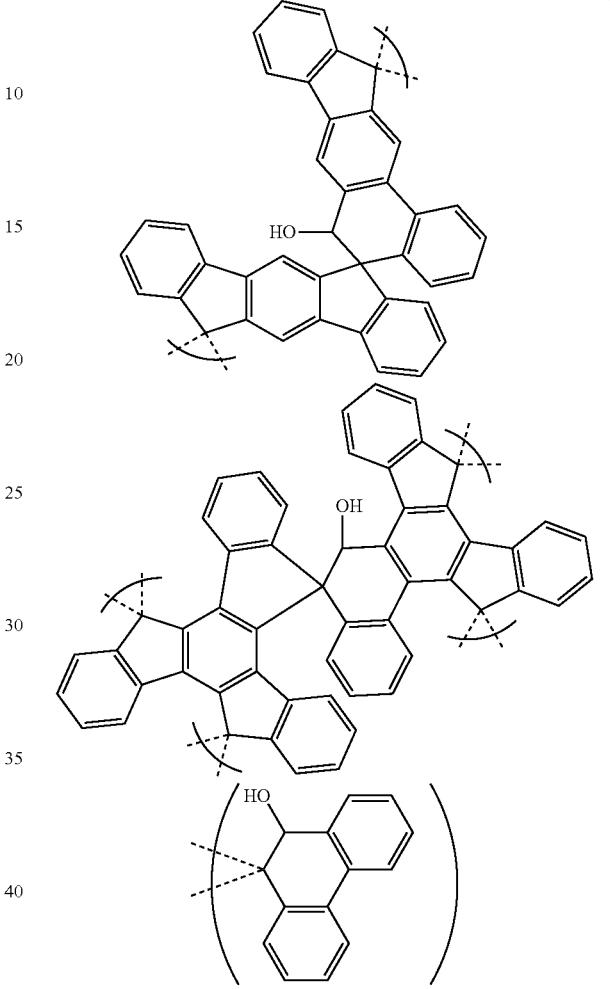

Under a nitrogen atmosphere, a homogeneous solution was formed from 20 g of the polyketone compound (K''-4) with 100 g of toluene and 20 g of methanol. Then, 3.0 g of sodium borohydride was added to the homogeneous solution and stirred at a liquid temperature of 40° C. for 3 hours. The reaction was stopped by adding 10 g of acetone, and the resultant was cooled to room temperature. After 300 g of methyl isobutyl ketone was added, the mixture was washed with 50 g of a 3% nitric acid aqueous solution and further washed five times with 50 g of pure water. The organic layer was evaporated under reduced pressure to dryness, and then dissolved in 60 g of tetrahydrofuran. Subsequently, the polymer was crystallized with 250 g of diisopropyl ether. The crystallized polymer was separated by filtration using a Hirsch funnel, washed twice with 100 g of diisopropyl ether, and vacuum dried at 60° C. Thus, 17.4 g of a spiro alcohol compound (A-4) was obtained. GPC showed that the weight average molecular weight (Mw) and dispersity (Mw/Mn) were Mw=4100 and Mw/Mn=2.72.

Examples were carried out using, as resins (I), the compounds (A-1) to (A-4) shown in Table 1 and compounds (R-1), (R-2) for Comparative Examples shown below.

TABLE 1
| Synthesis example | Compound | product |
|---|---|---|
| 1 | (A-1) | 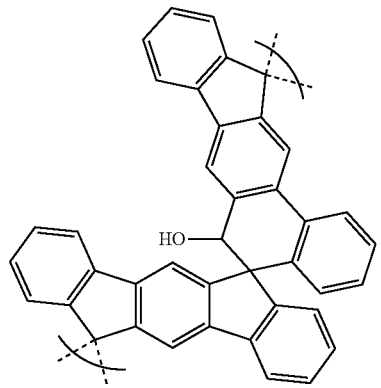<br>(A-1)<br><br>Mw = 4100  Mw/Mn = 3.20 |
| 2 | (A-2) | 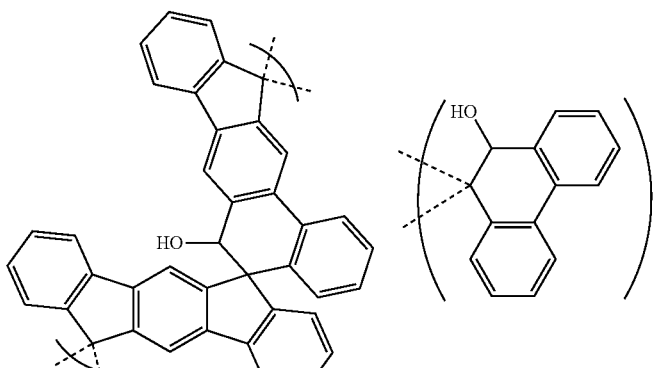<br>(A-2)<br><br>Mw = 2600  Mw/Mn = 2.80 |
| 3 | (A-3) | 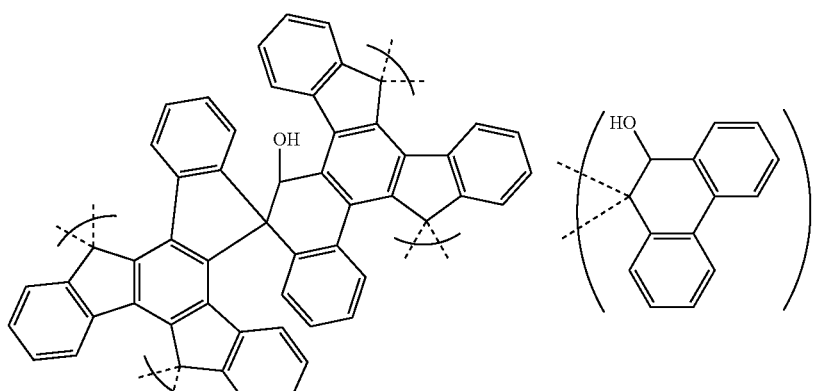<br>(A-3)<br><br>Mw = 5200  Mw/Mn = 3.10 |

TABLE 1-continued

| Synthesis example | Compound | product |
|---|---|---|
| 4 | (A-4) | 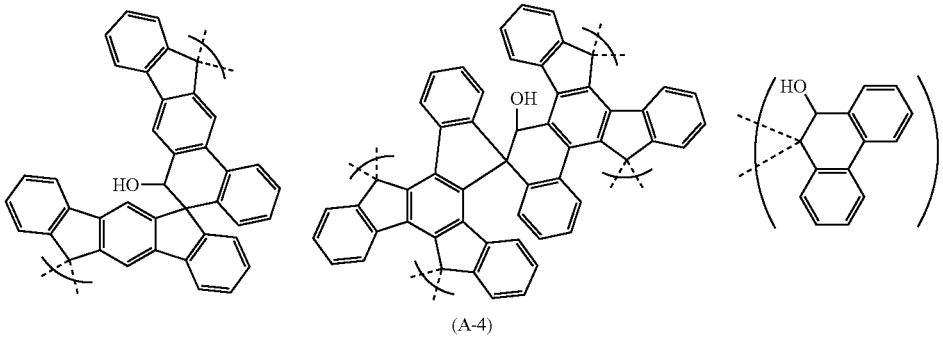<br>(A-4)<br>Mw = 4100 Mw/Mn = 2.72 |

[Compounds for Comparative Examples]

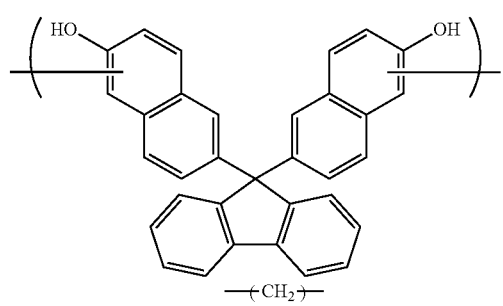

Compound (R-1) for Comparative Examples: Mw=3700, Mw/Mn=2.82

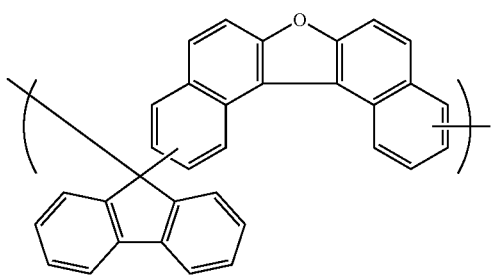

Compound (R-2) for Comparative Examples: Mw=3050, Mw/Mn=1.69

The compounds (A-1) to (A-4), (R-1), and (R-2), a crosslinking agent CR-1, an acid generator AG-1, and a solvent were dissolved in a solvent containing 0.1 mass % FC-4430 (manufactured by Sumitomo 3M Ltd.) in proportions shown in Table 2. The solution was filtered through a 0.1-μm filter made of a fluorinated resin to prepare resist underlayer film compositions (UDL-1 to -6, CUDL-1 to -3). The structures of AG-1 and CR-1 are as follows.

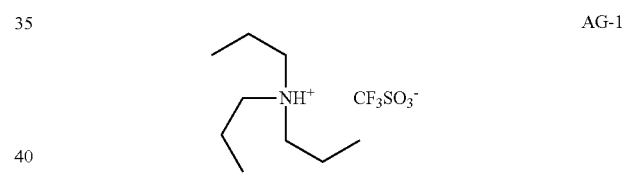

AG-1

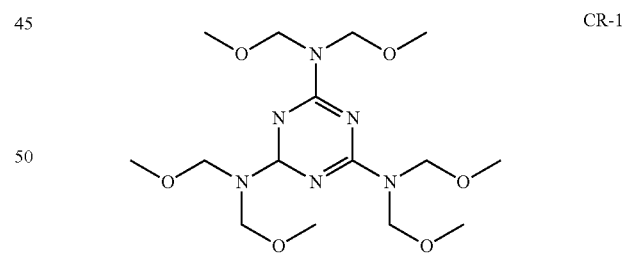

CR-1

TABLE 2

| Composition | Compound (part by mass) | Compound (part by mass) | Closslinking agent (part by mass) | Acid generator (part by mass) | Solvent (part by mass) |
|---|---|---|---|---|---|
| UDL-1 | A-1 (10) | | | | PGMEA (90) |
| UDL-2 | A-1 (10) | | | AG-1 (0.5) | PGMEA (90) |
| UDL-3 | A-2 (10) | | | AG-1 (0.5) | PGMEA (90) |
| UDL-4 | A-3 (10) | | | AG-1 (0.5) | PGMEA (90) |
| UDL-5 | A-4 (10) | | | AG-1 (0.5) | PGMEA (90) |
| UDL-6 | A-1 (5) | A-2 (5) | | AG-1 (0.5) | PGMEA (90) |

TABLE 2-continued

| Composition | Compound (part by mass) | Compound (part by mass) | Closslinking agent (part by mass) | Acid generator (part by mass) | Solvent (part by mass) |
|---|---|---|---|---|---|
| CUDL-1 | R-1 (10) | | | | PGMEA (90) |
| CUDL-2 | R-1 (10) | | CR-1 (2) | AG-1 (0.5) | PGMEA (90) |
| CUDL-3 | R-2 (10) | | | | PGMEA (90) |

PGMEA: propylene glycol monomethyl ether acetate

Examples 1-1 to 1-8, Comparative Examples 1-1 to 1-3

The resist underlayer film compositions (UDL-1 to -6, CUDL-1 to -3) prepared above were each applied onto a silicon substrate and baked under conditions shown in Table 3. Thus, coating films were formed each having a film thickness of 200 nm. For these films, a nano-indentation test was conducted with a SA2 nanoindenter instrument manufactured by TOYO Corporation, and the hardnesses of the coating films were measured. Table 3 shows the results, too.

TABLE 3

| | Composition for forming organic film | Baking conditions | Hardness (GPa) |
|---|---|---|---|
| Example 1-1 | UDL-1 | 250° C. × 60 sec. | 0.67 |
| Example 1-2 | UDL-1 | 350° C. × 60 sec. | 0.80 |
| Example 1-3 | UDL-2 | 250° C. × 60 sec. | 0.79 |
| Example 1-4 | UDL-2 | 350° C. × 60 sec. | 0.81 |
| Example 1-5 | UDL-3 | 250° C. × 60 sec. | 0.82 |
| Example 1-6 | UDL-4 | 250° C. × 60 sec. | 0.83 |
| Example 1-7 | UDL-5 | 250° C. × 60 sec. | 0.78 |
| Example 1-8 | UDL-6 | 250° C. × 60 sec. | 0.80 |
| Comparative Example 1-1 | CUDL-1 | 350° C. × 60 sec. | 0.62 |
| Comparative Example 1-2 | CUDL-2 | 250° C. × 60 sec. | 0.58 |
| Comparative Example 1-3 | CUDL-3 | 350° C. × 60 sec. | 0.49 |

As shown in Table 3, the resist underlayer film compositions UDL-1 to -6 using the inventive composition for forming an organic film had larger hardness values than CUDL-1 to -3, suggesting that finer and stronger films were formed. Moreover, the comparison among Examples 1-1 to 1-4 using the spiro alcohol compound (A-1) indicates that adding the acid generator AG-1 promotes the aromatic ring formation, helping to form fine films even at a lower baking temperature. Further, it was confirmed that even when no AG-1 was introduced, baking at a high temperature made it possible to form fine films. These confirmed that all of Examples of the present invention enabled formation of high-hardness films. Note that, in Comparative Examples 1-1 to 1-3 not using the inventive composition for forming an organic film, the hardness values were small even with the acid generator AG-1 added. This indicates that the strengths are inferior to those in Examples.

Examples 2-1 to 2-8, Comparative Examples 2-1 to 2-3

(Etching Test with $CF_4/CHF_3$-Based Gas)

UDL-1 to -6 and CUDL-1 to -3 were each applied onto a silicon substrate, and baked under an air atmosphere at temperatures shown in Table 4 for 60 seconds. Underlayer films each having a film thickness of 200 nm were formed, and an etching test was conducted with a $CF_4/CHF_3$-based gas under the following conditions. In this event, a dry etching apparatus TE-8500 manufactured by Tokyo Electron Limited was used to find a film thickness difference of each polymer film before and after the etching. Table 4 also shows the result.

The etching conditions were as described below:

| Chamber pressure | 40.0 Pa |
|---|---|
| RF power | 1,000 W |
| $CHF_3$ gas flow rate | 10 ml/min |
| $CF_4$ gas flow rate | 100 ml/min |
| He gas flow rate | 200 ml/min |
| Time | 20 sec. |

Table 4 shows film loss ratios of Examples and Comparative Examples, given that the film thickness lost in Comparative Example 2-1 by the etching with a $CF_4/CHF_3$-based gas is taken as 100. It can be understood that the smaller the ratio, the more excellent the etching resistance.

(Etching Test with $O_2$-Based Gas)

As in the case of the etching test with a $CF_4/CHF_3$-based gas, UDL-1 to -6 and CUDL-1 to -3 were each applied onto a silicon substrate, and baked under an air atmosphere at temperatures shown in Table 4 for 60 seconds. Underlayer films each having a film thickness of 200 nm were formed, and an etching test was conducted with an $O_2$-based gas under the following conditions. In this event, a dry etching apparatus TE-8500 manufactured by Tokyo Electron Limited was used to find a film thickness difference of each polymer film before and after the etching. Table 4 also shows the result.

The etching conditions were as described below:

| Chamber pressure | 40.0 Pa |
|---|---|
| RF power | 100 W |
| $O_2$ gas flow rate | 30 ml/min |
| $N_2$ gas flow rate | 70 ml/min |
| Time | 60 sec. |

Similarly, Table 4 shows film loss ratios of Examples and Comparative Examples, given that the film thickness lost in Comparative Example 2-1 by the etching with an $O_2$-based gas is taken as 100. It can be understood that the smaller the ratio, the more excellent the etching resistance.

TABLE 4

|  | Composition for forming organic film | Baking conditions | CF4/CHF3 - based gas | | O2 - based gas | |
| --- | --- | --- | --- | --- | --- | --- |
|  |  |  | film loss amount | film loss ratio | film loss amount | film loss ratio |
| Example 2-1 | UDL-1 | 250° C. × 60 sec. | 473 | 79% | 1741 | 80% |
| Example 2-2 | UDL-1 | 350° C. × 60 sec. | 443 | 74% | 1673 | 77% |
| Example 2-3 | UDL-2 | 250° C. × 60 sec. | 438 | 74% | 1684 | 77% |
| Example 2-4 | UDL-2 | 350° C. × 60 sec. | 447 | 75% | 1692 | 78% |
| Example 2-5 | UDL-3 | 250° C. × 60 sec. | 452 | 76% | 1665 | 76% |
| Example 2-6 | UDL-4 | 250° C. × 60 sec. | 437 | 74% | 1678 | 77% |
| Example 2-7 | UDL-5 | 250° C. × 60 sec. | 449 | 75% | 1682 | 77% |
| Example 2-8 | UDL-6 | 250° C. × 60 sec. | 452 | 76% | 1690 | 76% |
| Comparative Example 2-1 | CUDL-1 | 250° C. × 60 sec. | 595 | 100% | 2180 | 100% |
| Comparative Example 2-2 | CUDL-2 | 350° C. × 60 sec. | 606 | 102% | 2230 | 102% |
| Comparative Example 2-3 | CUDL-3 | 350° C. × 60 sec. | 535 | 90% | 1958 | 90% |

As shown in Table 4, as results of Examples 2-1 to 2-8 using UDL-1 to -6 with the inventive composition for forming an organic film, in both of the etching tests with a $CF_4/CHF_3$-based gas and an $O_2$-based gas, the amounts of the films lost after the etching were smaller than those of CUDL-1 to -3. This indicates that films excellent in etching resistance were formed.

Examples 3-1 to 3-8, Comparative Examples 3-1 to 3-3

(Pattern Etching Test)

The compositions (UDL-1 to -6, CUDL-1 to -3) for forming an organic film were each applied onto a Si wafer substrate having a diameter of 300 mm on which a $SiO_2$ film having a film thickness of 200 nm had been formed. Then, a resist underlayer film having a film thickness of 200 nm was formed at a baking temperature shown in Table 7. A silicon-containing resist middle layer composition SOG-1 was applied on the resist underlayer film, and baked at 220° C. for 60 seconds to form a resist middle layer film having a film thickness of 35 nm. A resist upper layer film composition (SL resist solution for ArF) was applied thereon, and baked at 105° C. for 60 seconds to form a resist upper layer film having a film thickness of 100 nm. A liquid immersion top coat (TC-1) was applied onto the resist upper layer film, and baked at 90° C. for 60 seconds to form a top coat having a film thickness of 50 nm. The upper layer resist was prepared by: dissolving a resin, an acid generator, and a base compound in a composition shown in Table 5 into a solvent containing 0.1 mass % FC-430 (manufactured by Sumitomo 3M Ltd.); and filtering the solution through a 0.1-μm filter made of a fluorinated resin.

TABLE 5

| | Polymer (part by mass) | Acid generator (part by mass) | Base (part by mass) | Solvent (part by mass) |
| --- | --- | --- | --- | --- |
| SL resist for ArF | ArF monolayer resist polymer 1 (100) | PAG1 (6.6) | Amine1 (0.8) | PGMEA (2,500) |

Note that the structures of the ArF monolayer resist polymer 1, PAG1, Amine1, and PGMEA used are as follows.

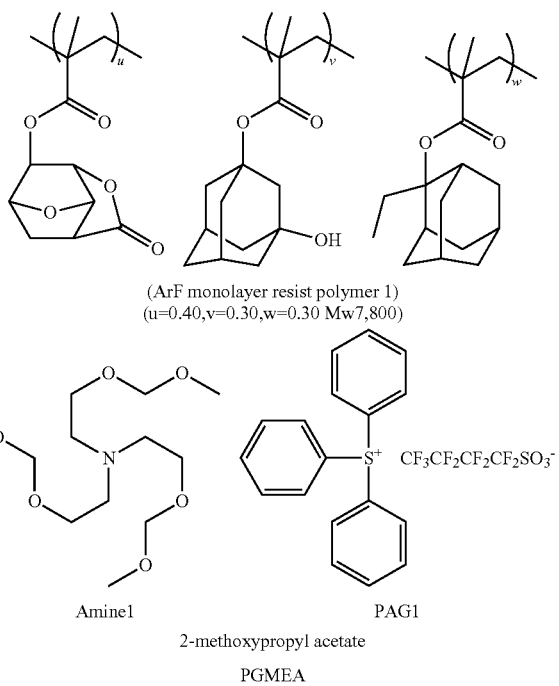

(ArF monolayer resist polymer 1)
(u=0.40,v=0.30,w=0.30 Mw7,800)

Amine1    PAG1

2-methoxypropyl acetate

PGMEA

As the silicon-containing resist middle layer composition (SOG-1), a propylene glycol ethyl ether solution containing 2% of the following polymers was prepared.

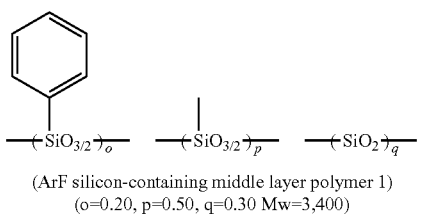

(ArF silicon-containing middle layer polymer 1)
(o=0.20, p=0.50, q=0.30 Mw=3,400)

The liquid immersion top coat (TC-1) was prepared by: dissolving a resin in a composition shown in Table 6 into a solvent; and filtering the solution through a 0.1-μm filter made of a fluorinated resin.

TABLE 6

| | Polymer (part by mass) | Organic solvent (part by mass) |
|---|---|---|
| TC-1 | Top coat polymer (100) | Diisoamyl ether (2700) 2-Methyl-1-butanol (270) |

Note that the structure of the top coat polymer used is as follows.

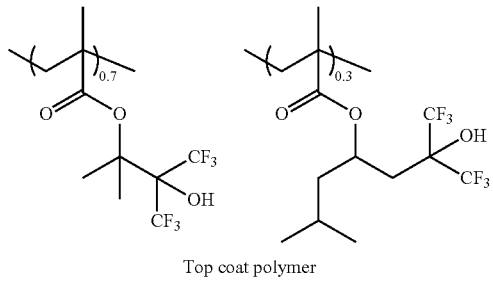

Top coat polymer

Molecular weight (Mw)=8,800
Dispersity (Mw/Mn)=1.69

Next, the resulting substrate was exposed to light at various exposure levels with an ArF liquid immersion exposure apparatus (NSR-S610C manufactured by Nikon Corporation, NA: 1.30, σ: 0.98/0.65, 35° s-polarized dipole illumination, 6% halftone phase shift mask), baked at 100° C. for 60 seconds (PEB), and developed with a 2.38 mass % tetramethylammonium hydroxide (TMAH) aqueous solution for 30 seconds. Thus, a positive line and space pattern was obtained with the resist line width ranging from 50 nm to 30 nm at a pitch of 100 nm.

Further, the silicon-containing middle layer was processed using the resist pattern obtained by dry etching as a mask with an etching apparatus Telius manufactured by Tokyo Electron Limited. The underlayer film was processed using the silicon-containing middle layer as a mask. Then, the SiO$_2$ film was processed using the underlayer film as a mask.

The etching conditions were as described below.

Conditions for Transferring the Resist Pattern to the SOG Film

| Chamber pressure | 10.0 Pa |
|---|---|
| RF power | 1,500 W |
| CF$_4$ gas flow rate | 15 sccm |
| O$_2$ gas flow rate | 75 sccm |
| Time | 15 sec. |

Conditions for Transferring the SOG Film to the Underlayer Film

| Chamber pressure | 2.0 Pa |
|---|---|
| RF power | 500 W |
| Ar gas flow rate | 75 sccm |
| O$_2$ gas flow rate | 45 sccm |
| Time | 120 sec. |

Transferring Conditions to the SiO$_2$ Film

| Chamber pressure | 2.0 Pa |
|---|---|
| RF power | 2,200 W |
| C$_5$F$_{12}$ gas flow rate | 20 sccm |
| C$_2$F$_6$ gas flow rate | 10 sccm |
| Ar gas flow rate | 300 sccm |
| O$_2$ | 60 sccm |
| Time | 90 sec. |

The pattern cross sections were observed with an electron microscope (S-4700) manufactured by Hitachi, Ltd. The profiles were compared and summarized in Table 7.

TABLE 7

| | Composition for forming organic film | Baking conditions | Pattern profile after development | Profile after etching for transferring to middle layer | Profile after etching for transferring to underlayer film | Profile after etching for transferring to substrate | Minimum dimension (nm) without pattern twisting |
|---|---|---|---|---|---|---|---|
| Example 3-1 | UDL-1 | 250° C. × 60 sec. | vertical profile | vertical profile | vertical profile | vertical profile | 35 |
| Example 3-2 | UDL-1 | 350° C. × 60 sec. | vertical profile | vertical profile | vertical profile | vertical profile | 30 |
| Example 3-3 | UDL-2 | 250° C. × 60 sec. | vertical profile | vertical profile | vertical profile | vertical profile | 31 |
| Example 3-4 | UDL-2 | 350° C. × 60 sec. | vertical profile | vertical profile | vertical profile | vertical profile | 30 |
| Example 3-5 | UDL-3 | 250° C. × 60 sec. | vertical profile | vertical profile | vertical profile | vertical profile | 30 |
| Example 3-6 | UDL-4 | 250° C. × 60 sec. | vertical profile | vertical profile | vertical profile | vertical profile | 29 |
| Example 3-7 | UDL-5 | 250° C. × 60 sec. | vertical profile | vertical profile | vertical profile | vertical profile | 31 |
| Example 3-8 | UDL-6 | 250° C. × 60 sec. | vertical profile | vertical profile | vertical profile | vertical profile | 30 |
| Comparative Example 3-1 | CUDL-1 | 250° C. × 60 sec. | vertical profile | vertical profile | vertical profile | vertical profile | 40 |
| Comparative Example 3-2 | CUDL-2 | 350° C. × 60 sec. | vertical profile | vertical profile | vertical profile | vertical profile | 42 |
| Comparative Exapmle 3-3 | CUDL-3 | 350° C. × 60 sec. | vertical profile | vertical profile | vertical profile | vertical profile | 50 |

As shown in Table 7, in Examples 3-1 to 3-8 in which the inventive compositions for forming an organic film was used as the underlayer film of the 3-layer resists for liquid immersion lithography, the resist profiles after the development were favorable in the pattern profile evaluation. This indicates that Examples 3-1 to 3-8 have a useful effect as an antireflective film.

Further, in Examples 3-1 to 3-8 using the inventive compositions UDL-1 to -6 for forming an organic film, the resist profiles after the development and the profiles of the underlayer films after oxygen etching and substrate-processing etching were favorable. In accordance with the resist line width prepared by the light exposure, the pattern dimension transferred to the substrate was also changed. In Comparative Examples 3-1 to 3-3 not using the inventive composition for forming an organic film, the pattern was twisted at the line width of approximately 40 nm. In contrast, it was revealed that the use of the inventive compositions UDL-1 to -6 for forming an organic film does not cause twisting with the pattern dimension of 35 nm or less, providing high twisting resistance.

It is suggested that high twisting resistance is obtained by using an underlayer film capable of forming a fine film having a hardness higher than 0.65 GPa like the inventive underlayer films.

Examples 4-1 to 4-8

(Evaluation of Filling Property)

Onto a stepped $SiO_2$ substrate in which a dense hole pattern with a thickness of 500 nm and a diameter of 160 nm was formed, the resist underlayer film compositions UDL-1 to -6 were each applied under such conditions that a film having a thickness of 80 nm was formed on the flat substrate. After the application, resist underlayer films were formed under baking conditions shown in Table 8. Each substrate having such a resist underlayer film formed thereon was split and observed with a scanning electron microscope (SEM) to check whether the resist underlayer film was filled to the bottom of the holes. Table 8 shows the result.

TABLE 8

| | Composition for forming organic film | Baking conditions | Filling property |
|---|---|---|---|
| Example 4-1 | UDL-1 | 250° C. × 60 sec. | Favorably filled to the bottoms of holes |
| Example 4-2 | UDL-1 | 350° C. × 60 sec. | Favorably filled to the bottoms of holes |
| Example 4-3 | UDL-2 | 250° C. × 60 sec. | Favorably filled to the bottoms of holes |
| Example 4-4 | UDL-2 | 350° C. × 60 sec. | Favorably filled to the bottoms of holes |
| Example 4-5 | UDL-3 | 250° C. × 60 sec. | Favorably filled to the bottoms of holes |
| Example 4-6 | UDL-4 | 250° C. × 60 sec. | Favorably filled to the bottoms of holes |
| Example 4-7 | UDL-5 | 250° C. × 60 sec. | Favorably filled to the bottoms of holes |
| Example 4-8 | UDL-6 | 250° C. × 60 sec. | Favorably filled to the bottoms of holes |

As shown in Table 8, in all of Examples 4-1 to 4-8 in which the resist underlayer films were formed by using the inventive compositions for forming an organic film, the holes were favorably filled to the bottoms. This indicates that even if a substrate to be processed has a step(s), the inventive compositions for forming an organic film can be expected to have sufficient filling property and has useful properties as a resist underlayer film composition for multilayer processes.

As described above, the present invention can provide: a resin useful as a component of an organic film composition for forming an organic film having all of high etching resistance, twisting resistance during etching, and planarizing property; and a composition for forming an organic film containing this resin. Moreover, because of excellent etching resistance and planarizing property, this composition for forming an organic film is quite useful as a resist underlayer film composition in multilayer resist processes, for example, a 2-layer resist process, a 3-layer resist process using a silicon-containing resist underlayer film, or a 4-layer resist process using a silicon-containing resist underlayer film and an organic antireflective film. Further, the inventive patterning processes makes it possible to precisely form a fine pattern in a substrate to be processed in the multilayer resist processes.

It should be noted that the present invention is not restricted to the above-described embodiments. The embodiments are merely examples so that any embodiments that have substantially the same feature and demonstrate the same functions and effects as those in the technical concept as disclosed in claims of the present invention are included in the technical range of the present invention.

What is claimed is:

1. A composition for forming an organic film, comprising:
(I) a resin having a structure shown by the following general formula (1) in which a ring structure AR containing an aromatic ring and a spiro structure SP bonded to four of the ARs are alternately repeated in at least a portion of a repeating unit; and
(II) an organic solvent,

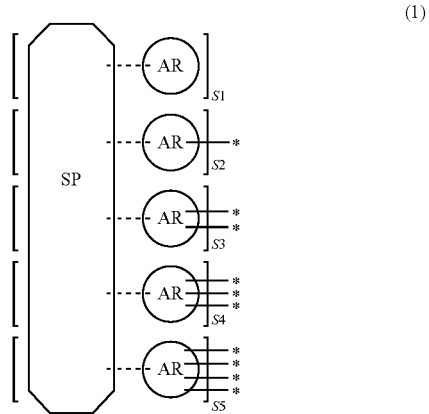

(1)

wherein SP represents a spiro structure shown by the following formula (1-1); AR represents a ring structure containing an aromatic ring as shown by the following formula (1-2), (1-3), (1-4), (1-5), (1-6), or (1-7); S1 represents an integer of 0 to 3, and S2, S3, S4, and S5 each independently represent an integer of 0 to 4, given that S1+52+53+54+55=4; a dotted line represents that a ring structure of the SP bonds to, while sharing one side with, the aromatic ring of the AR; and * represents that the aromatic ring of the AR bonds to, while sharing one side with, a ring structure of a spiro structure in an adjacent repeating unit,

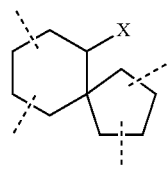
(1-1)

wherein X represents a hydroxyl group, an aryl sulfoxy group, or an alkoxy group, an acyloxy group, or an alkylsulfoxy group having 1 to 10 carbon atoms; a hydrogen atom of each of these groups is optionally substituted with a fluorine atom, a chlorine atom, a bromine atom, an iodine atom, an alkoxy group, an acyl group, or an acyloxy group; a dotted line represents that a ring structure in the formula (1-1) bonds to, while sharing one side with, the aromatic ring of the AR in the general formula (1); and the AR bonds only to a side whose adjacent sides in the spiro structure are not shared with an aromatic ring of another AR, the side having neither X nor a spiro bond,

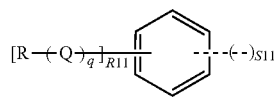
(1-2)

wherein R11 represents an integer of 0 to 4, R represents, when R11 is 1, and may be identical to or different from each other, when R11 is 2, 3 or 4, a saturated or unsaturated monovalent hydrocarbon group having 1 to 20 carbon atoms; Q represents —O—, —CO—, —(CO)—O—, or —O—(CO)—; q represents 0 or 1; and S11 represents an integer of 1 to 3, given that 2≤R11+2×S11≤6; a dotted line represents that the aromatic ring in the formula (1-2) bonds to, while sharing one side with, the ring structure of the spiro structure; and the spiro structure bonds only to a side whose adjacent sides in the aromatic ring in the formula (1-2) are not shared with a ring structure of another spiro structure,

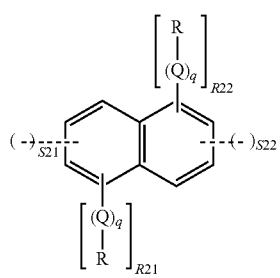
(1-3)

wherein R, Q, and q are as defined above; R21 represents an integer of 0 to 4, R22 represents an integer of 0 to 4, S21 represents an integer of 0 to 2, and S22 represents an integer of 0 to 2, given that 1≤S21+S22≤4 and 2≤R21+R22+2×(S21+S22)≤8; a dotted line represents that the aromatic ring in the formula (1-3) bonds to, while sharing one side with, the ring structure of the spiro structure; and the spiro structure bonds only to a side whose adjacent sides in the aromatic ring in the formula (1-3) are not shared with a ring structure of another spiro structure,

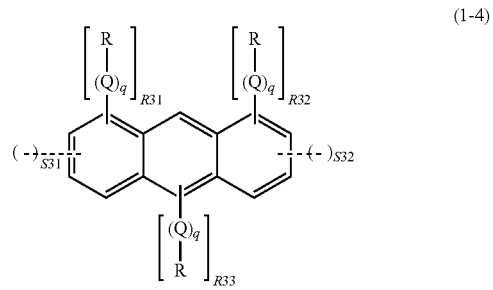
(1-4)

wherein R, Q, and q are as defined above; R31 represents an integer of 0 to 4, R32 represents an integer of 0 to 4, R33 represents an integer of 0 to 2, S31 represents an integer of 0 to 2, and S32 represents an integer of 0 to 2, given that 1≤S31+S32≤4 and 2≤R31+R32+R33+2×(S31+S32)≤10; a dotted line represents that the aromatic ring in the formula (1-4) bonds to, while sharing one side with, the ring structure of the spiro structure; and the Spiro structure bonds only to a side whose adjacent sides in the aromatic ring in the formula (1-4) are not shared with a ring structure of another spiro structure,

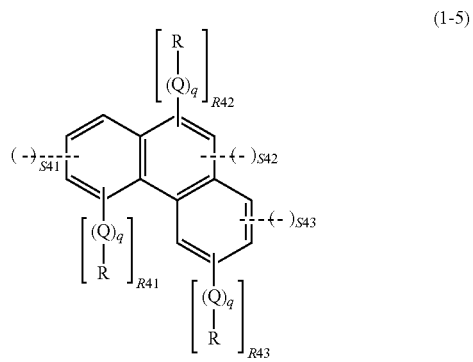
(1-5)

wherein R, Q, and q are as defined above; R41 represents an integer of 0 to 4, R42 represents an integer of 0 to 2, R43 represents an integer of 0 to 4, S41 represents an integer of 0 to 2, S42 represents an integer of 0 or 1, and S43 represents an integer of 0 to 2, given that 1≤S41+S42+S43≤5 and 2≤R41+R42+R43+2×(S41+S42+S43)≤10; a dotted line represents that the aromatic ring in the formula (1-5) bonds to, while sharing one side with, the ring structure of the spiro structure; and the spiro structure bonds only to a side whose adjacent sides in the aromatic ring in the formula (1-5) are not shared with a ring structure of another spiro structure,

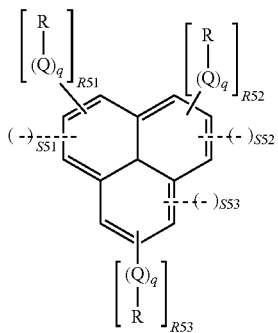

(1-6)

wherein R, Q, and q are as defined above; R51 represents an integer of 0 to 3, R52 represents an integer of 0 to 3, R53 represents an integer of 0 to 3, S51 represents an integer of 0 or 1, S52 represents an integer of 0 or 1, and S53 represents an integer of 0 or 1, given that $1 \leq S51+S52+S53 \leq 3$ and $2 \leq R51+R52+R53+2\times(S51+S52+S53) \leq 9$; a dotted line represents that the aromatic ring in the formula (1-6) bonds to, while sharing one side with, the ring structure of the spiro structure; and the spiro structure bonds only to a side whose adjacent sides in the aromatic ring in the formula (1-6) are not shared with a ring structure of another spiro structure,

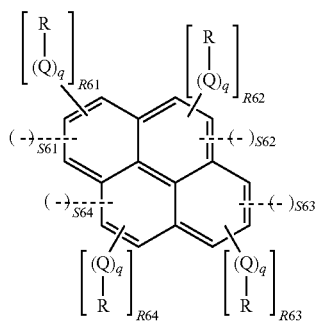

(1-7)

wherein R, Q, and q are as defined above; R61 represents an integer of 0 to 3, R62 represents an integer of 0 or 1, R63 represents an integer of 0 to 3, R64 represents an integer of 0 to 2, S61 represents an integer of 0 or 1, S62 represents an integer of 0 or 1, S63 represents an integer of 0 or 1, and S64 represents an integer of 0 or 1, given that $1 \leq S61+S62+S63+S64 \leq 4$ and $2 \leq R61+R62+R63+R64+2\times(S61+S62+S63+S64) \leq 10$; a dotted line represents that the aromatic ring in the formula (1-7) bonds to, while sharing one side with, the ring structure of the spiro structure; and the spiro structure bonds only to a side whose adjacent sides in the aromatic ring in the formula (1-7) are not shared with a ring structure of another spiro structure.

2. The composition for forming an organic film according to claim 1, wherein the composition for forming an organic film further comprises an acid generator.

3. A patterning process comprising:
forming an organic film on a body to be processed from the composition for forming an organic film according to claim 1;
forming a silicon-containing resist underlayer film on the organic film from a silicon-containing resist underlayer film composition;
forming a resist upper layer film on the silicon-containing resist underlayer film from a photoresist composition;
forming a circuit pattern in the resist upper layer film;
transferring the pattern to the silicon-containing resist underlayer film by etching using the resist upper layer film having the formed circuit pattern as a mask;
transferring the pattern to the organic film by etching using the silicon-containing resist underlayer film having the transferred pattern as a mask; and
further transferring the pattern to the body to be processed by etching using the organic film having the transferred pattern as a mask.

4. A patterning process comprising:
forming an organic film on a body to be processed from the composition for forming an organic film according to claim 1;
forming a silicon-containing resist underlayer film on the organic film from a silicon-containing resist underlayer film composition;
forming an organic antireflective film on the silicon-containing resist underlayer film;
forming a resist upper layer film on the organic antireflective film from a photoresist composition, so that a 4-layered film structure is constructed;
forming a circuit pattern in the resist upper layer film;
transferring the pattern to the organic antireflective film and the silicon-containing resist underlayer film by etching using the resist upper layer film having the formed circuit pattern as a mask;
transferring the pattern to the organic film by etching using the silicon-containing resist underlayer film having the transferred pattern as a mask; and
further transferring the pattern to the body to be processed by etching using the organic film having the transferred pattern as a mask.

5. A patterning process comprising:
forming an organic film on a body to be processed from the composition for forming an organic film according to claim 1;
forming an inorganic hard mask middle layer film selected from a silicon oxide film, a silicon nitride film, and a silicon oxynitride film on the organic film;
forming a resist upper layer film on the inorganic hard mask middle layer film from a photoresist composition;
forming a circuit pattern in the resist upper layer film;
transferring the pattern to the inorganic hard mask middle layer film by etching using the resist upper layer film having the formed circuit pattern as a mask;
transferring the pattern to the organic film by etching using the inorganic hard mask middle layer film having the formed pattern as a mask; and
further transferring the pattern to the body to be processed by etching using the organic film having the formed pattern as a mask.

6. A patterning process comprising:
forming an organic film on a body to be processed from the composition for forming an organic film according to claim 1;
forming an inorganic hard mask middle layer film selected from a silicon oxide film, a silicon nitride film, and a silicon oxynitride film on the organic film;
forming an organic antireflective film on the inorganic hard mask middle layer film;
forming a resist upper layer film on the organic antireflective film from a photoresist composition, so that a 4-layered film structure is constructed;
forming a circuit pattern in the resist upper layer film;

transferring the pattern to the organic antireflective film and the inorganic hard mask middle layer film by etching using the resist upper layer film having the formed circuit pattern as a mask;

transferring the pattern to the organic film by etching using the inorganic hard mask middle layer film having the formed pattern as a mask; and further transferring the pattern to the body to be processed by etching using the organic film having the formed pattern as a mask.

7. The patterning process according to claim 5, wherein the inorganic hard mask middle layer film is formed by a CVD method or an ALD method.

8. The patterning process according to claim 6, wherein the inorganic hard mask middle layer film is formed by a CVD method or an ALD method.

9. The patterning process according to claim 3, wherein the circuit pattern is formed in the resist upper layer film by a photolithography using light with a wavelength ranging from 10 nm to 300 nm, a direct drawing by electron beam, a nanoimprinting, or a combination thereof.

10. The patterning process according to claim 4, wherein the circuit pattern is formed in the resist upper layer film by a photolithography using light with a wavelength ranging from 10 nm to 300 nm, a direct drawing by electron beam, a nanoimprinting, or a combination thereof.

11. The patterning process according to claim 5, wherein the circuit pattern is formed in the resist upper layer film by a photolithography using light with a wavelength ranging from 10 nm to 300 nm, a direct drawing by electron beam, a nanoimprinting, or a combination thereof.

12. The patterning process according to claim 6, wherein the circuit pattern is formed in the resist upper layer film by a photolithography using light with a wavelength ranging from 10 nm to 300 nm, a direct drawing by electron beam, a nanoimprinting, or a combination thereof.

13. The patterning process according to claim 3, wherein when the circuit pattern is formed in the resist upper layer film, the circuit pattern is developed by alkaline development or development with an organic solvent.

14. The patterning process according to claim 4, wherein when the circuit pattern is formed in the resist upper layer film, the circuit pattern is developed by alkaline development or development with an organic solvent.

15. The patterning process according to claim 3, wherein the body to be processed is a semiconductor apparatus substrate or the semiconductor apparatus substrate coated with any of a metal film, a metal carbide film, a metal oxide film, a metal nitride film, a metal oxycarbide film, and a metal oxynitride film.

16. The patterning process according to claim 4, wherein the body to be processed is a semiconductor apparatus substrate or the semiconductor apparatus substrate coated with any of a metal film, a metal carbide film, a metal oxide film, a metal nitride film, a metal oxycarbide film, and a metal oxynitride film.

17. The patterning process according to claim 15, wherein the metal of the body to be processed is silicon, titanium, tungsten, hafnium, zirconium, chromium, germanium, copper, silver, gold, aluminum, indium, gallium, arsenic, palladium, iron, tantalum, iridium, molybdenum, or an alloy thereof.

18. The patterning process according to claim 16, wherein the metal of the body to be processed is silicon, titanium, tungsten, hafnium, zirconium, chromium, germanium, copper, silver, gold, aluminum, indium, gallium, arsenic, palladium, iron, tantalum, iridium, molybdenum, or an alloy thereof.

19. A resin for forming an organic film, comprising a structure shown by the following general formula (1) in which a ring structure AR containing an aromatic ring and a spiro structure SP bonded to four of the ARs are alternately repeated in at least a portion of a repeating unit,

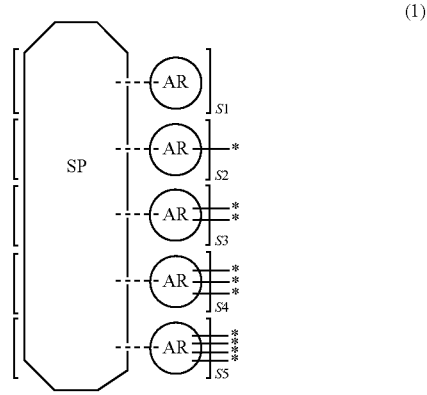

(1)

wherein SP represents a spiro structure shown by the following formula (1-1); AR represents a ring structure containing an aromatic ring as shown by the following formula (1-2), (1-3), (1-4), (1-5), (1-6), or (1-7); S1 represents an integer of 0 to 3, and S2, S3, S4, and S5 each independently represent an integer of 0 to 4, given that S1+S2+S3+S4+S5=4; a dotted line represents that a ring structure of the SP bonds to, while sharing one side with, the aromatic ring of the AR; and * represents that the aromatic ring of the AR bonds to, while sharing one side with, a ring structure of a spiro structure in an adjacent repeating unit,

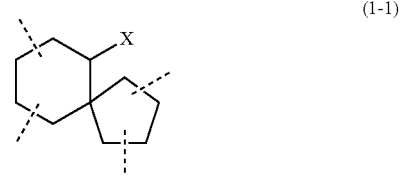

(1-1)

wherein X represents a hydroxyl group, an aryl sulfoxy group, or an alkoxy group, an acyloxy group, or an alkylsulfoxy group having 1 to 10 carbon atoms; a hydrogen atom of each of these groups is optionally substituted with a fluorine atom, a chlorine atom, a bromine atom, an iodine atom, an alkoxy group, an acyl group, or an acyloxy group; a dotted line represents that a ring structure in the formula (1-1) bonds to, while sharing one side with, the aromatic ring of the AR in the general formula (1); and the AR bonds only to a side whose adjacent sides in the spiro structure are not shared with an aromatic ring of another AR, the side having neither X nor a spiro bond,

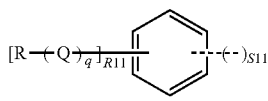
(1-2)

wherein R11 represents an integer of 0 to 4, R represents, when R11 is 1, and may be identical to or different from each other, when R11 is 2, 3 or 4, a saturated or unsaturated monovalent hydrocarbon group having 1 to 20 carbon atoms; Q represents —O—, —CO—, —(CO)—O—, or —O—(CO)—; q represents 0 or 1; and S11 represents an integer of 1 to 3, given that $2 \leq R11+2 \times S11 \leq 6$; a dotted line represents that the aromatic ring in the formula (1-2) bonds to, while sharing one side with, the ring structure of the spiro structure; and the spiro structure bonds only to a side whose adjacent sides in the aromatic ring in the formula (1-2) are not shared with a ring structure of another spiro structure,

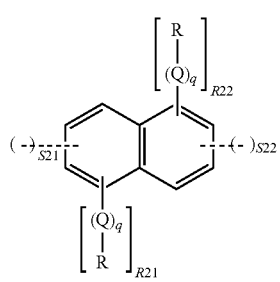
(1-3)

wherein R, Q, and q are as defined above; R21 represents an integer of 0 to 4, R22 represents an integer of 0 to 4, S21 represents an integer of 0 to 2, and S22 represents an integer of 0 to 2, given that $1 \leq S21+S22 \leq 4$ and $2 \leq R21+R22+2 \times (S21+S22) \leq 8$; a dotted line represents that the aromatic ring in the formula (1-3) bonds to, while sharing one side with, the ring structure of the spiro structure; and the spiro structure bonds only to a side whose adjacent sides in the aromatic ring in the formula (1-3) are not shared with a ring structure of another spiro structure,

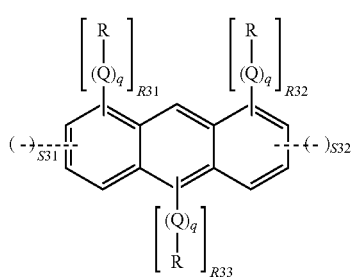
(1-4)

wherein R, Q, and q are as defined above; R31 represents an integer of 0 to 4, R32 represents an integer of 0 to 4, R33 represents an integer of 0 to 2, S31 represents an integer of 0 to 2, and S32 represents an integer of 0 to 2, given that $1 \leq S31+S32 \leq 4$ and $2 \leq R31+R32+R33+2 \times (S31+S32) \leq 10$; a dotted line represents that the aromatic ring in the formula (1-4) bonds to, while sharing one side with, the ring structure of the spiro structure; and the Spiro structure bonds only to a side whose adjacent sides in the aromatic ring in the formula (1-4) are not shared with a ring structure of another spiro structure,

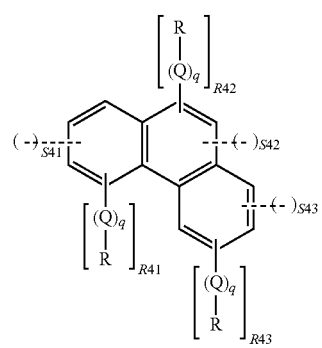
(1-5)

wherein R, Q, and q are as defined above; R41 represents an integer of 0 to 4, R42 represents an integer of 0 to 2, R43 represents an integer of 0 to 4, S41 represents an integer of 0 to 2, S42 represents an integer of 0 or 1, and S43 represents an integer of 0 to 2, given that $1 \leq S41+S42+S43 \leq 5$ and $2 \leq R41+R42+R43+2 \times (S41+S42+S43) \leq 10$; a dotted line represents that the aromatic ring in the formula (1-5) bonds to, while sharing one side with, the ring structure of the spiro structure; and the spiro structure bonds only to a side whose adjacent sides in the aromatic ring in the formula (1-5) are not shared with a ring structure of another spiro structure,

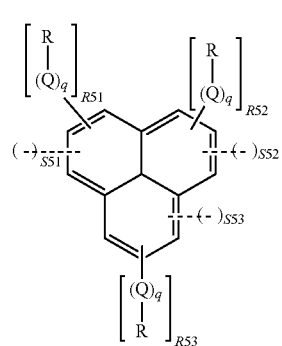
(1-6)

wherein R, Q, and q are as defined above; R51 represents an integer of 0 to 3, R52 represents an integer of 0 to 3, R53 represents an integer of 0 to 3, S51 represents an integer of 0 or 1, S52 represents an integer of 0 or 1, and S53 represents an integer of 0 or 1, given that $1 \leq S51+S52+S53 \leq 3$ and $2 \leq R51+R52+R53+2 \times (S51+S52+S53) \leq 9$; a dotted line represents that the aromatic ring in the formula (1-6) bonds to, while sharing one side with, the ring structure of the spiro structure; and the spiro structure bonds only to a side whose adjacent sides in the aromatic ring in the formula (1-6) are not shared with a ring structure of another spiro structure,

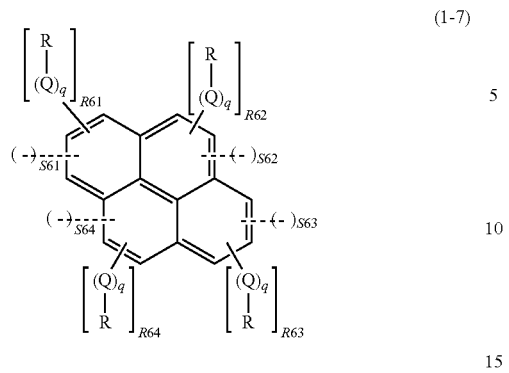

(1-7)

wherein R, Q, and q are as defined above; R61 represents an integer of 0 to 3, R62 represents an integer of 0 or 1, R63 represents an integer of 0 to 3, R64 represents an integer of 0 to 2, S61 represents an integer of 0 or 1, S62 represents an integer of 0 or 1, S63 represents an integer of 0 or 1, and S64 represents an integer of 0 or 1, given that 1≤S61+S62+S63+S64≤4 and 2≤R61+R62+R63+R64+2×(S61+S62+S63+S64)≤10; a dotted line represents that the aromatic ring in the formula (1-7) bonds to, while sharing one side with, the ring structure of the spiro structure; and the spiro structure bonds only to a side whose adjacent sides in the aromatic ring in the formula (1-7) are not shared with a ring structure of another spiro structure.

\* \* \* \* \*